US012738328B2

(12) United States Patent
Tang et al.

(10) Patent No.: US 12,738,328 B2
(45) Date of Patent: *Sep. 15, 2026

(54) MEMORY DEVICE, MEMORY SYSTEM, MEMORY CONTROLLER, AND OPERATION METHOD

(71) Applicant: YANGTZE MEMORY TECHNOLOGIES CO., LTD., Wuhan (CN)

(72) Inventors: Xingwei Tang, Wuhan (CN); Guangchang Ye, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 14 days.

This patent is subject to a terminal disclaimer.

(21) Appl. No.: 18/807,452

(22) Filed: Aug. 16, 2024

(65) Prior Publication Data

US 2025/0266101 A1 Aug. 21, 2025

(30) Foreign Application Priority Data

Feb. 20, 2024 (CN) ......................... 202410190026.0

(51) Int. Cl.
*G11C 16/34* (2006.01)
*G11C 16/24* (2006.01)
*G11C 16/26* (2006.01)

(52) U.S. Cl.
CPC .............. *G11C 16/26* (2013.01); *G11C 16/24* (2013.01); *G11C 16/3418* (2013.01)

(58) Field of Classification Search
CPC ..... G11C 16/26; G11C 16/24; G11C 16/3418; G11C 11/5642; G11C 16/0483; G11C 16/34; G11C 8/14

(Continued)

(56) References Cited

U.S. PATENT DOCUMENTS 8,773,922 B2 * 7/2014 Song ...................... G11C 16/26
365/189.07
10,084,487 B2 * 9/2018 Jin .................... H03M 13/6325

(Continued)

FOREIGN PATENT DOCUMENTS

CN 113327640 A 8/2021
CN 113421601 A 9/2021

(Continued)

OTHER PUBLICATIONS

Yangtze Memory Technologies Co., Ltd., "First Review Comments" dated Jul. 9, 2026, Chinese Patent App. No. 202410190026.0, 6 p. (plus 6 p. translation).

*Primary Examiner* — Michael T Tran

(74) *Attorney, Agent, or Firm* — Conley Rose, P.C.

(57) ABSTRACT

Examples of the present application provide a memory device, a memory system, a memory controller, and an operation method. The memory device includes: an array of memory cells comprising multiple memory cells, wherein a preset number of memory cells form one codeword; and a peripheral circuit coupled with the array of memory cells and configured to: obtain a first result corresponding to at least one codeword at a target read voltage; obtain a first threshold according to the corresponding first result at the target read voltage; make at least one adjustment to the target read voltage, and after each adjustment, obtain a corresponding first result at the adjusted target read voltage; and determine a target valley voltage.

20 Claims, 33 Drawing Sheets

(58) Field of Classification Search
USPC .......................................... 365/189.011, 163
See application file for complete search history.

(56) References Cited

U.S. PATENT DOCUMENTS

| | | | | |
|---|---|---|---|---|
| 10,802,909 | B2 * | 10/2020 | Fackenthal | H03M 13/37 |
| 10,884,665 | B2 * | 1/2021 | Hsiao | G11C 16/08 |
| 11,081,204 | B1 * | 8/2021 | Bedeschi | G11C 11/4099 |
| 11,386,972 | B2 * | 7/2022 | Li | G11C 11/54 |
| 11,626,168 | B2 * | 4/2023 | Berman | G11C 16/3418 714/764 |
| 11,636,890 | B2 * | 4/2023 | Ingalls | G11C 7/1006 365/145 |
| 11,705,211 | B2 * | 7/2023 | Muzzetto | G11C 16/22 365/185.22 |
| 11,776,590 | B2 * | 10/2023 | Muzzetto | G11C 7/1087 365/189.05 |
| 2011/0096612 | A1 * | 4/2011 | Steiner | G11C 11/5642 365/189.09 |
| 2014/0010017 | A1 * | 1/2014 | Lee | G11C 16/3454 365/185.18 |
| 2015/0006983 | A1 * | 1/2015 | Lin | G11C 16/26 714/721 |
| 2015/0262677 | A1 | 9/2015 | Lin et al. | |
| 2016/0042797 | A1 * | 2/2016 | Kim | G11C 16/3427 714/764 |
| 2019/0035474 | A1 * | 1/2019 | Tassan | G11C 16/105 |
| 2019/0172542 | A1 * | 6/2019 | Miladinovic | G06F 11/076 |
| 2019/0295659 | A1 * | 9/2019 | Hong | G11C 29/028 |
| 2020/0177209 | A1 * | 6/2020 | Ismail | G11C 16/08 |
| 2020/0402580 | A1 * | 12/2020 | Kim | G06F 3/0656 |
| 2021/0011804 | A1 * | 1/2021 | Wiita | G06F 11/1072 |
| 2021/0133025 | A1 * | 5/2021 | Aklik | G06F 11/1048 |
| 2021/0373993 | A1 * | 12/2021 | Sharon | G11C 16/0483 |
| 2022/0035707 | A1 * | 2/2022 | Laurent | G06F 11/1012 |
| 2022/0179734 | A1 * | 6/2022 | Fackenthal | G06F 12/0804 |
| 2022/0321147 | A1 * | 10/2022 | Laurent | G11C 29/42 |
| 2023/0207006 | A1 * | 6/2023 | Giraud | G11C 13/0069 365/148 |
| 2023/0290410 | A1 | 9/2023 | Guo | |
| 2023/0326511 | A1 * | 10/2023 | Oh | G11C 11/4063 365/222 |
| 2023/0343398 | A1 * | 10/2023 | Dong | G11C 16/10 |
| 2024/0135996 | A1 * | 4/2024 | Impala' | G11C 11/5678 |

FOREIGN PATENT DOCUMENTS

| | | | | | |
|---|---|---|---|---|---|
| CN | 114038494 | A | | 2/2022 | |
| CN | 114520014 | A | | 5/2022 | |
| CN | 116348855 | A | * | 6/2023 | G06F 11/1076 |
| WO | WO-2022026234 | A1 | * | 2/2022 | G06F 11/1012 |

* cited by examiner

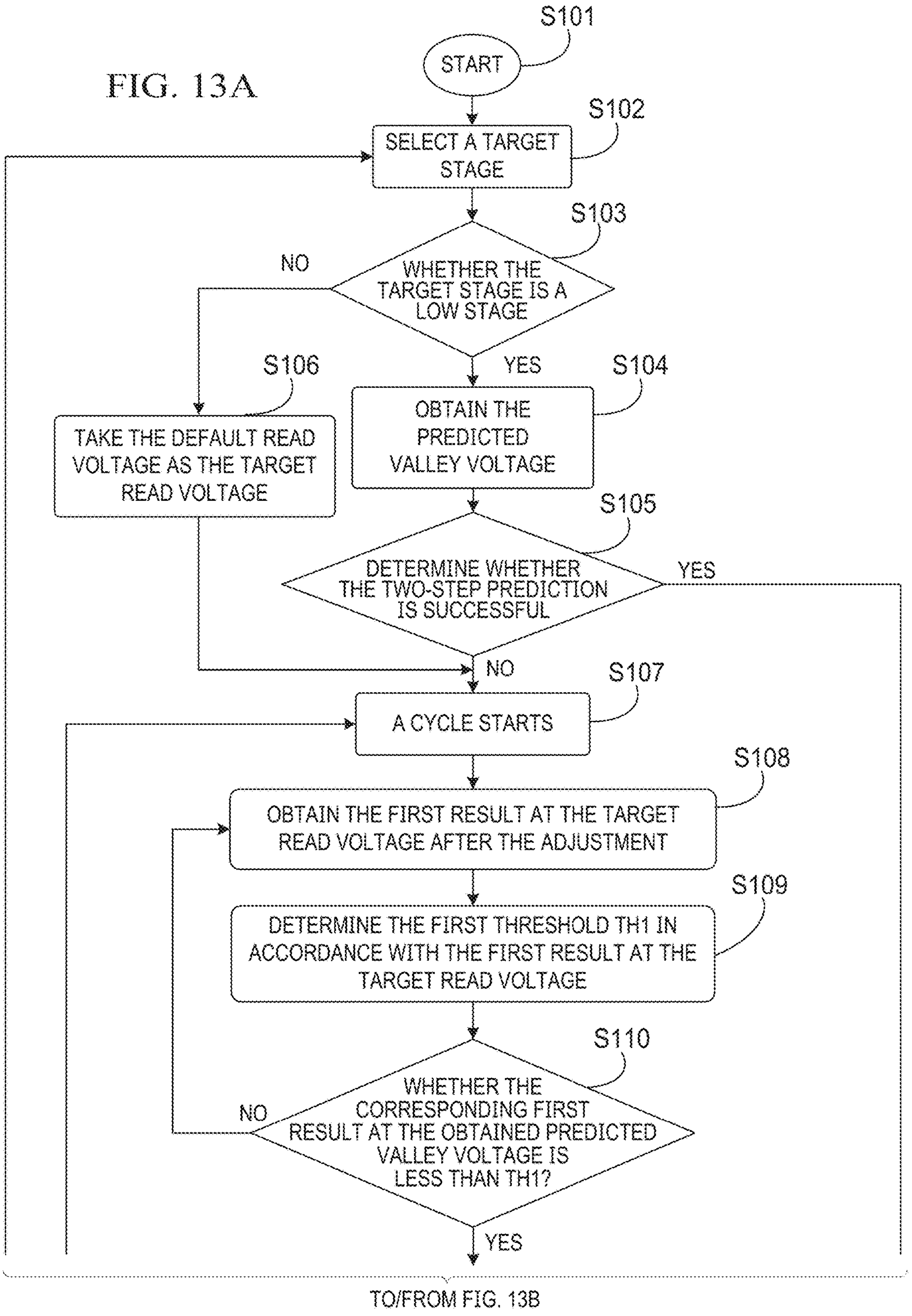

FIG. 13A
S101
START
S102
SELECT A TARGET STAGE
S103
WHETHER THE TARGET STAGE IS A LOW STAGE
NO
YES
S104
OBTAIN THE PREDICTED VALLEY VOLTAGE
S106
TAKE THE DEFAULT READ VOLTAGE AS THE TARGET READ VOLTAGE
S105
DETERMINE WHETHER THE TWO-STEP PREDICTION IS SUCCESSFUL
YES
NO
S107
A CYCLE STARTS
S108
OBTAIN THE FIRST RESULT AT THE TARGET READ VOLTAGE AFTER THE ADJUSTMENT
S109
DETERMINE THE FIRST THRESHOLD TH1 IN ACCORDANCE WITH THE FIRST RESULT AT THE TARGET READ VOLTAGE
S110
WHETHER THE CORRESPONDING FIRST RESULT AT THE OBTAINED PREDICTED VALLEY VOLTAGE IS LESS THAN TH1?
NO
YES
TO/FROM FIG. 13B

SEARCH FOR A KNEE POINT
S111
S112
WHETHER A KNEE POINT IS FOUND
NO
YES
S113
SEARCH FROM THE KNEE POINT TO THE RIGHT AND PROCEED TOWARD THE BOUNDARY WITH FINE STEP SIZE
S114
SEARCH FROM THE KNEE POINT TO THE LEFT AND PROCEED TOWARD THE BOUNDARY WITH FINE STEP SIZE
S115
TAKE THE ADJUSTED TARGET READ VOLTAGE CORRESPONDING TO THE MINIMUM FIRST RESULT AMONG THE SEARCH RESULT AS THE TARGET VALLEY VOLTAGE
S116
WHETHER THE TARGET VALLEY VOLTAGE IS VALID
YES
NO
S118
PROCEED TO A NEXT CYCLE
S117
WHETHER THE CYCLE ENDS
NO
YES
S120
PREDICT THE VALLEY VOLTAGE IN A LOW STAGE
S119
WHETHER THE TARGET STAGE IS A HIGH STAGE
YES
NO
S121
NEXT STAGE
WHETHER ALL THE STAGES END
NO
S122
YES
S123
END

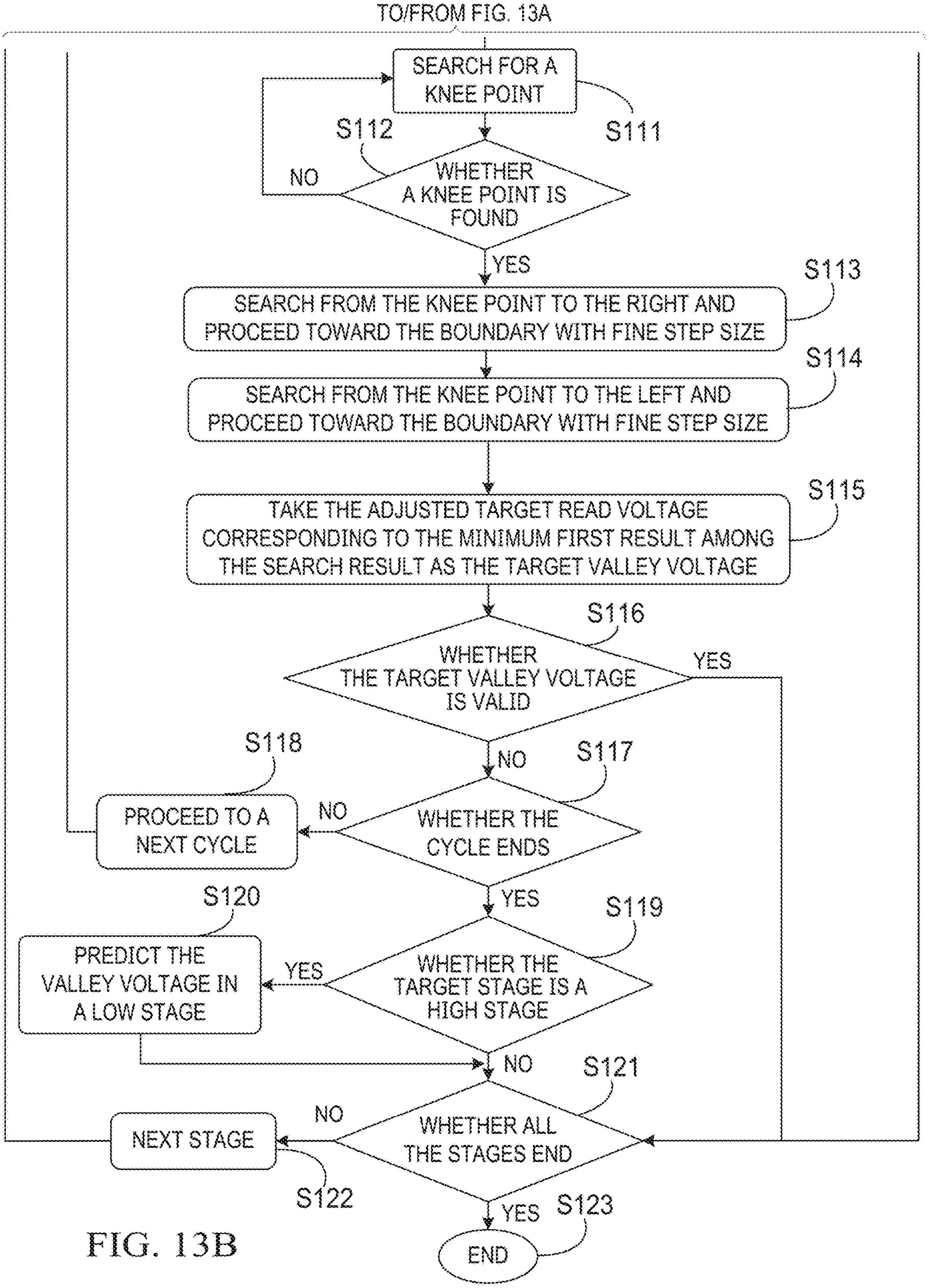

FIG. 13B

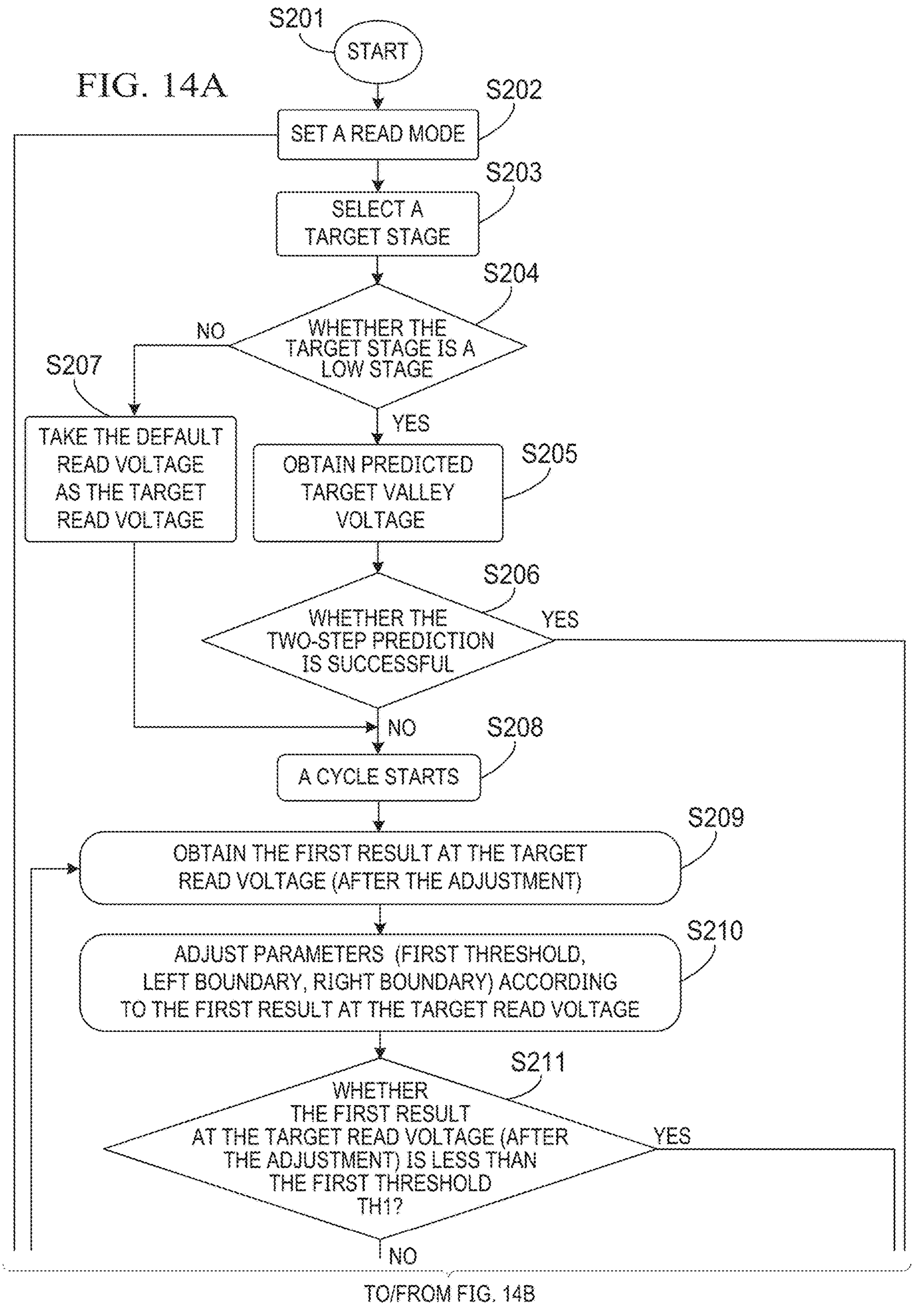

FIG. 14A
S201
START
S202
SET A READ MODE
S203
SELECT A TARGET STAGE
S204
WHETHER THE TARGET STAGE IS A LOW STAGE
NO
YES
S207
TAKE THE DEFAULT READ VOLTAGE AS THE TARGET READ VOLTAGE
S205
OBTAIN PREDICTED TARGET VALLEY VOLTAGE
S206
WHETHER THE TWO-STEP PREDICTION IS SUCCESSFUL
YES
NO
S208
A CYCLE STARTS
S209
OBTAIN THE FIRST RESULT AT THE TARGET READ VOLTAGE (AFTER THE ADJUSTMENT)
S210
ADJUST PARAMETERS (FIRST THRESHOLD, LEFT BOUNDARY, RIGHT BOUNDARY) ACCORDING TO THE FIRST RESULT AT THE TARGET READ VOLTAGE
S211
WHETHER THE FIRST RESULT AT THE TARGET READ VOLTAGE (AFTER THE ADJUSTMENT) IS LESS THAN THE FIRST THRESHOLD TH1?
YES
NO
TO/FROM FIG. 14B

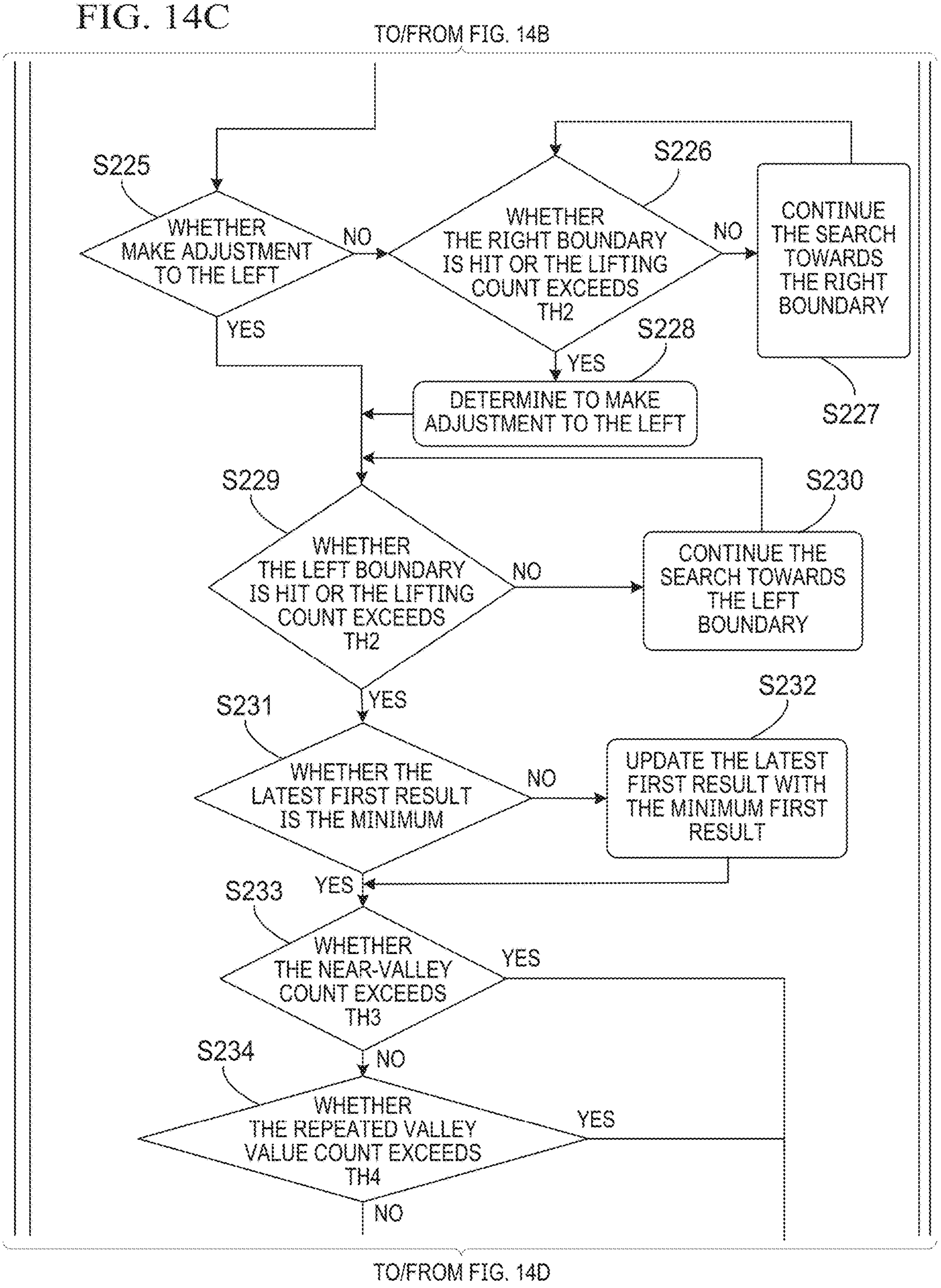

FIG. 14C
TO/FROM FIG. 14B
S225
WHETHER MAKE ADJUSTMENT TO THE LEFT
NO
YES
S226
WHETHER THE RIGHT BOUNDARY IS HIT OR THE LIFTING COUNT EXCEEDS TH2
NO
YES
CONTINUE THE SEARCH TOWARDS THE RIGHT BOUNDARY
S227
S228
DETERMINE TO MAKE ADJUSTMENT TO THE LEFT
S229
WHETHER THE LEFT BOUNDARY IS HIT OR THE LIFTING COUNT EXCEEDS TH2
NO
YES
S230
CONTINUE THE SEARCH TOWARDS THE LEFT BOUNDARY
S231
WHETHER THE LATEST FIRST RESULT IS THE MINIMUM
NO
YES
S232
UPDATE THE LATEST FIRST RESULT WITH THE MINIMUM FIRST RESULT
S233
WHETHER THE NEAR-VALLEY COUNT EXCEEDS TH3
YES
NO
S234
WHETHER THE REPEATED VALLEY VALUE COUNT EXCEEDS TH4
YES
NO
TO/FROM FIG. 14D

MEMORY DEVICE, MEMORY SYSTEM, MEMORY CONTROLLER, AND OPERATION METHOD

CROSS-REFERENCE TO RELATED APPLICATIONS

The present application claims priority to Chinese Patent Application No. 2024101900260, which was filed Feb. 20, 2024, is titled "MEMORY DEVICE, MEMORY SYSTEM, MEMORY CONTROLLER AND OPERATING METHOD," and is hereby incorporated herein by reference in its entirety.

TECHNICAL FIELD

Examples of the present application relates to the technical field of semiconductors, and particularly to a memory device, a memory system, a memory controller, and an operation method.

BACKGROUND

With the development of science and technology, the market scale of the integrated circuit industry becomes increasingly larger, and the process and technology of non-volatile memory devices in the entire integrated circuit industry have been developing rapidly in recent years, with NAND memories being particularly widely used. The NAND memories implement the function of data storage by capturing and storing charges in a gate medium layer of memory cells contained therein. However, as the use time increases, charges stored in memory cells vary due to the increasing use time, repeated read operations, cross temperature, etc., thus affecting the correctness of reading data stored in the memory cells.

SUMMARY

In view of this, examples of the present application provide a memory device, a memory system, a memory controller, and an operation method.

In a first aspect, examples of the present application provide a memory device. The memory device comprises: an array of memory cells comprising multiple memory cells, wherein a preset number of memory cells form one codeword; and peripheral circuit coupled with the array of memory cells and configured to: obtain a first result corresponding to at least one codeword at a target read voltage, wherein the first result comprises the number of bits which represents the number of bits in the at least one codeword which are flipped in two read results at a first read voltage and a second read voltage, and a difference between the first read voltage and the second read voltage is less than a preset voltage; obtain a first threshold according to the corresponding first result at the target read voltage, wherein the first threshold is to represent a corresponding first result at a maximum value in an effective range of predicted valley voltages; make at least one adjustment to the target read voltage, and after each adjustment, obtain a corresponding first result at the adjusted target read voltage; and determine a target valley voltage according to a relationship between a corresponding first result at a target read voltage after one adjustment and the first threshold meeting a first preset condition or according to a corresponding first result at the target read voltage after multiple adjustments meeting a second preset condition, wherein the target valley voltage is taken as a read voltage at which a read operation is performed on the at least one codeword.

In some examples, the peripheral circuit is configured to: obtain the first threshold according to the corresponding first result at the target read voltage and a first mapping function, wherein the first mapping function is to represent a relationship between the corresponding first result at the maximum value in the effective range of predicted valley voltages and the corresponding first result at the target read voltage.

In some examples, the peripheral circuit is configured to: obtain the corresponding first result at the maximum value in the effective range of predicted valley voltages according to an initial value of the corresponding first result at the maximum value in the effective range of predicted valley voltages, a correction value for the corresponding first result at the target read voltage, and a correction coefficient, wherein the initial value of the corresponding first result at the maximum value in the effective range of predicted valley voltages and the correction coefficient are both fixed values related to a stage in which a read voltage is, and the larger the corresponding first result at the target read voltage is, the larger the correction value is.

In some examples, the first preset condition is that a corresponding first result at the target read voltage after one adjustment is less than the first threshold; and the peripheral circuit is configured to: determine the target read voltage after one adjustment as the target valley voltage according to the relationship between the corresponding first result at the target read voltage after one adjustment and the first threshold meeting the first preset condition.

In some examples, the peripheral circuit is configured to: according to the corresponding first result at the target read voltage being greater than or equal to the first threshold, obtain, with the corresponding first result at the target read voltage, a target adjustment value for adjusting the target read voltage; obtain a corresponding first result at the adjusted target read voltage with the target adjustment value; according to the corresponding first result at the adjusted target read voltage with the target adjustment value being less than the first threshold, determine the adjusted target read voltage with the target adjustment value as the target valley voltage; and according to the corresponding first result at the adjusted target read voltage with the target adjustment value being greater than or equal to the first threshold, make multiple adjustments to the target read voltage, and after each adjustment, obtain the corresponding first result at the adjusted target read voltage, until the corresponding first result at the adjusted target read voltage is less than the first threshold or the corresponding first result at the target read voltage after multiple adjustments meet the second preset condition.

In some examples, the second preset condition is that taken the minimum first result among multiple corresponding first results at the target read voltages after multiple adjustments as a reference value, the number of first results from remaining first results which differ from the reference value with a difference being less than a second threshold is greater than a preset number; and the peripheral circuit is configured to: according to the corresponding first result at the target read voltage after multiple adjustments meeting the second preset condition, take a target read voltage corresponding to the minimum first result among the multiple first results as the target valley voltage.

In some examples, the peripheral circuit is configured to: in a process of making multiple adjustments to the target read voltage, make adjustments by employing different adjustment methods, and according to the adjusted target read voltages corresponding to more than a preset number of adjustment methods in the different adjustment methods being same and the corresponding first result at the same target read voltage being the minimum value among all first results, take the same target read voltage as the target valley voltage.

In some examples, the peripheral circuit is configured to: make multiple first adjustments to the target read voltage with a first step size, and obtain corresponding first results at target read voltages after the multiple first adjustments respectively; determine a value of knee point according to the obtained corresponding first results at the read voltages after the multiple first adjustments, wherein a target read voltage corresponding to the value of knee point is a knee-point voltage; make multiple second adjustments to the knee-point voltage with a second step size, and obtain the corresponding first results at the target read voltages after the multiple second adjustments respectively, wherein the second step size is less than the first step size; and determine the target valley voltage with the obtained corresponding first results at the target read voltages after the multiple second adjustments.

In some examples, the corresponding first results at the target read voltages after the multiple first adjustments comprise a first adjacent value and a second adjacent value that are adjacent to the value of knee point, and the peripheral circuit is configured to: according to a difference between the first adjacent value and the value of knee point being less than a difference between the second adjacent value and the value of knee point, narrow a range for the multiple second adjustments to be between a target read voltage corresponding to the first adjacent value and the knee-point voltage; and take an average of the read voltage corresponding to the first adjacent value and the knee-point voltage, and according to a corresponding first result at the average being less than the first threshold, take the average as the target valley voltage; and according to the corresponding first result at the average being greater than or equal to the first threshold, continue to make a second adjustment between the read voltage corresponding to the first adjacent value and the knee-point voltage, until a corresponding first result at the adjusted target read voltage is less than the first threshold.

In some examples, the peripheral circuit is configured to: obtain the predicted valley voltage according to the corresponding first result at the target read voltage and a second mapping function, wherein the second mapping is to represent a relationship between the corresponding first result at the target read voltage and the predicted valley voltage.

In some examples, the memory cell comprises multiple memory bits, and the multiple memory bits correspond to multiple pages respectively; and at least part of pages correspond to multiple stages, the multiple stages comprise a first stage and a second stage, and a read voltage in the second stage is less than a read voltage in the first stage; and the peripheral circuit is configured to: obtain at least one of a predicted valley voltage in the second stage from the multiple stages or a target valley voltage in other first stage corresponding to a lower read voltage with the determined target valley voltage according to the stage number corresponding to the determined target valley voltage belonging to the first stage.

In some examples, the peripheral circuit is configured to: read storage data of the at least one codeword at the first read voltage, to obtain a second result; read storage data of the at least one codeword at the second read voltage, to obtain a third result; perform a logical operation on the second result and the third result, to obtain a fourth result; and count the number of bits in the fourth result which represent flip of bits in the third result relative to the second result, to obtain the first result.

In some examples, the peripheral circuit comprises: a first latch, a second latch, and a third latch; the first latch is configured to store the second result; the second latch is configured to store the third result; and the third latch is configured to store the fourth result.

In a second aspect, examples of the present application provide a memory system. The memory system comprises: one or more of any memory devices provided in the first aspect; and a memory controller coupled with the memory device and controlling the memory device.

In a third aspect, examples of the present application provide a memory controller. The memory controller comprises a control component and is configured to: obtain a first result corresponding to at least one codeword at a target read voltage, wherein the at least one codeword is formed by a preset number of memory cells in an array of memory cells of at least one memory device coupled with the memory controller, wherein the first result comprises the number of bits which represents the number of bits in the at least one codeword which are flipped in two read results at a first read voltage and a second read voltage, and a difference between the first read voltage and the second read voltage is less than a preset voltage; obtain a first threshold according to the corresponding first result at the target read voltage, wherein the first threshold is to represent a corresponding first result at a maximum value in an effective range of predicted valley voltages; make at least one adjustment to the target read voltage, and after each adjustment, obtain a first result corresponding to the at least one codeword at the adjusted target read voltage; and determine a target valley voltage according to a relationship between a corresponding first result at a target read voltage after one adjustment and the first threshold meeting a first preset condition or according to a corresponding first result at the target read voltage after multiple adjustments meeting a second preset condition, wherein the target valley voltage is taken as a read voltage at which a read operation is performed on the at least one codeword.

In some examples, the control component is configured to: obtain the first threshold according to the corresponding first result at the target read voltage and a first mapping function, wherein the first mapping function is to represent a relationship between the corresponding first result at the maximum value in the effective range of predicted valley voltages and the corresponding first result at the target read voltage.

In some examples, the control component is configured to: obtain the corresponding first result at the maximum value in the effective range of predicted valley voltages according to an initial value of the corresponding first result at the maximum value in the effective range of predicted valley voltages, a correction value for the corresponding first result at the target read voltage, and a correction coefficient, wherein the initial value of the corresponding first result at the maximum value in the effective range of predicted valley voltages and the correction coefficient are both fixed values related to a stage in which a read voltage is, and the larger the corresponding first result at the target read voltage is, the larger the correction value is.

In some examples, the first preset condition is that a corresponding first result at the target read voltage after one adjustment is less than the first threshold; and the control component is configured to: determine the target read voltage after one adjustment as the target valley voltage according to the relationship between the corresponding first result at the target read voltage after one adjustment and the first threshold meeting the first preset condition.

In some examples, the control component is configured to: according to the corresponding first result at the target read voltage being greater than or equal to the first threshold, obtain, with the corresponding first result at the target read voltage, a target adjustment value for adjusting the target read voltage; obtain a corresponding first result at the adjusted target read voltage with the target adjustment value; according to the corresponding first result at the adjusted target read voltage with the target adjustment value being less than the first threshold, determine the adjusted target read voltage with the target adjustment value as the target valley voltage; and according to the corresponding first result at the adjusted target read voltage with the target adjustment value being greater than or equal to the first threshold, make multiple adjustments to the target read voltage, and after each adjustment, obtain the corresponding first result at the adjusted target read voltage, until the corresponding first result at the adjusted target read voltage is less than the first threshold or the corresponding first result at the target read voltage after multiple adjustments meet the second preset condition.

In some examples, the second preset condition is that taken the minimum first result among multiple corresponding first results at the target read voltages after multiple adjustments as a reference value, the number of first results from remaining first results which differ from the reference value with a difference being less than a second threshold is greater than a preset number; and the control component is configured to: according to the corresponding first result at the target read voltage after multiple adjustments meeting the second preset condition, take a target read voltage corresponding to the minimum first result among the multiple first results as the target valley voltage.

In some examples, the control component is configured to: in a process of making multiple adjustments to the target read voltage, make adjustments by employing different adjustment methods, and according to the adjusted target read voltages corresponding to more than a preset number of adjustment methods in the different adjustment methods being same and the corresponding first result at the same target read voltage being the minimum value among all first results, take the same target read voltage as the target valley voltage.

In some examples, the control component is configured to:

make multiple first adjustments to the target read voltage with a first step size, and obtain corresponding first results at target read voltages after the multiple first adjustments respectively;

determine a value of knee point according to the obtained corresponding first results at the read voltages after the multiple first adjustments, wherein a target read voltage corresponding to the value of knee point is a knee-point voltage; make multiple second adjustments to the knee-point voltage with a second step size, and obtain the corresponding first results at the target read voltages after the multiple second adjustments respectively, wherein the second step size is less than the first step size; and determine the target valley voltage with the obtained corresponding first results at the target read voltages after the multiple second adjustments.

In some examples, the corresponding first results at the target read voltages after the multiple first adjustments comprise a first adjacent value and a second adjacent value that are adjacent to the value of knee point, and the control component is configured to: according to a difference between the first adjacent value and the value of knee point being less than a difference between the second adjacent value and the value of knee point, narrow a range for the multiple second adjustments to be between a target read voltage corresponding to the first adjacent value and the knee-point voltage; and take an average of the read voltage corresponding to the first adjacent value and the knee-point voltage, and according to a corresponding first result at the average being less than the first threshold, take the average as the target valley voltage; and according to the corresponding first result at the average being greater than or equal to the first threshold, continue to make a second adjustment between the read voltage corresponding to the first adjacent value and the knee-point voltage, until a corresponding first result at the adjusted target read voltage is less than the first threshold.

In some examples, the control component is configured to: obtain the predicted valley voltage according to the corresponding first result at the target read voltage and a second mapping function, wherein the second mapping is to represent a relationship between the corresponding first result at the target read voltage and the predicted valley voltage, wherein the predicted valley voltage comprises a relationship between adjusted read voltages with the target adjustment value.

In some examples, the memory cell comprises multiple memory bits, and the multiple memory bits correspond to multiple pages respectively; and at least part of pages comprise multiple stages, the multiple stages comprise a first stage and a second stage, and a read voltage in the second stage is less than a read voltage in the first stage; and the control component is configured to: obtain at least one of a predicted valley voltage in the second stage from the multiple stages or a target valley voltage in other first stage corresponding to a lower read voltage with the determined target valley voltage according to the stage number corresponding to the determined target valley voltage belonging to the first stage.

In some examples, the memory controller is further configured to: control the memory device to perform a read operation on the at least one codeword with the target read voltage; and in response to an error occurring in reading of data in the at least one codeword at the target read voltage, control the memory device to perform the read operation on the codeword with the target valley voltage.

In some examples, the memory controller is further configured to: in response to an error occurring in reading of data in the at least one codeword at the target valley voltage, perform an ECC decoding operation on the data of the at least one codeword read at the target valley voltage.

In a fourth aspect, examples of the present application provide a method of operating a memory device. The operation method comprises: obtaining a first result corresponding to at least one codeword at a target read voltage, the at least one codeword is formed by a preset number of memory cells in an array of memory cells of a memory device, wherein the first result comprises the number of bits in the at least one codeword which are flipped in two read results at a first read voltage and a second read voltage, and a difference between the first read voltage and the second read voltage is less than a preset voltage; obtaining a first threshold according to the corresponding first result at the target read voltage, wherein the first threshold is to represent a corresponding first result at a maximum value in an effective range of predicted valley voltages; making at least one adjustment to the target read voltage, and after each adjustment, obtaining a corresponding first result at the adjusted read voltage; and determining a target valley voltage according to a relationship between a corresponding first result at a target read voltage after one adjustment and the first threshold meeting a first preset condition or according to a corresponding first result at the target read voltage after multiple adjustments meeting a second preset condition, wherein the target valley voltage is taken as a read voltage at which a read operation is performed on the at least one codeword.

In a fifth aspect, examples of the present application provide a method of operating a memory system, wherein the memory system comprises a memory device and a memory controller coupled with the memory device and controlling the memory device, and the operation method comprises: performing the operation method of the memory device provided in the fourth aspect.

In a sixth aspect, examples of the present application provide a method of operating a memory controller. The operation method comprises: obtaining a first result corresponding to at least one codeword at a target read voltage, wherein the at least one codeword is formed by a preset number of memory cells in at least one memory device coupled with the memory controller, wherein the first result comprises the number of bits which represents the number of bits in the at least one codeword which are flipped in two read results at a first read voltage and a second read voltage, and a difference between the first read voltage and the second read voltage is less than a preset voltage; obtaining a first threshold according to the corresponding first result at the target read voltage, wherein the first threshold is to represent a corresponding first result at a maximum value in an effective range of predicted valley voltages; making at least one adjustment to the target read voltage, and after each adjustment, obtaining a corresponding first result at the adjusted target read voltage; and determining a target valley voltage according to a relationship between a corresponding first result at a target read voltage after one adjustment and the first threshold meeting a first preset condition or according to a corresponding first result at the target read voltage after multiple adjustments meeting a second preset condition, wherein the target valley voltage is taken as a read voltage at which a read operation is performed on the at least one codeword.

In a seventh aspect, examples of the present application provide a storage medium having executable instructions stored thereon, which, when being executed by a processor, implement any operation in any operation method provided in the fourth aspect, the fifth aspect, and the sixth aspect.

In the memory device and the operation method thereof and the memory system and the operation method thereof provided in the examples of the present application, a first result (a size of the first result may be several bytes) rather than at least one codeword (for example, a size of the codeword may be 4 KB) is transmitted, so that an amount of data transmitted by the memory device is reduced. A first threshold is obtained according to a corresponding first result at a target read voltage. With the dynamic first threshold, the iterative rapidity of convergence of determining a target valley voltage is higher. A process of obtaining the first result converges inside the memory device, does not occupy, for example, a space of the memory controller, and has low dependency on, for example, the memory controller. At least one of a transmission time at an input/output port of the memory device or a time of an error correction decoding operation of the memory controller is reduced, so that an iterative time of an error correction decoding algorithm of the memory controller is saved, and a speed of error correction decoding is higher. The methods are applicable to a memory device/memory system of an MLC, a TLC type or a QLC type.

BRIEF DESCRIPTION OF THE DRAWINGS

In the accompanying drawings, unless otherwise specified, identical or similar components or elements are represented by a like numeral throughout several figures. These accompanying drawings are not necessarily drawn to scale. It is understood that these accompanying drawings depict only several implementations disclosed in accordance with the present application and are not to be considered limiting of the scope of the present application.

FIGS. 13A and 13B (which may be referred to herein collectively as FIG. 13) are block flowcharts 1 of a method of operating a memory device provided by an example of the present application;

FIGS. 14A, 14B, 14C, and 14D (which may be referred to herein collectively as FIG. 14) are block flowcharts 2 of a method of operating a memory device provided by an example of the present application;

DETAILED DESCRIPTION

Figure 1:
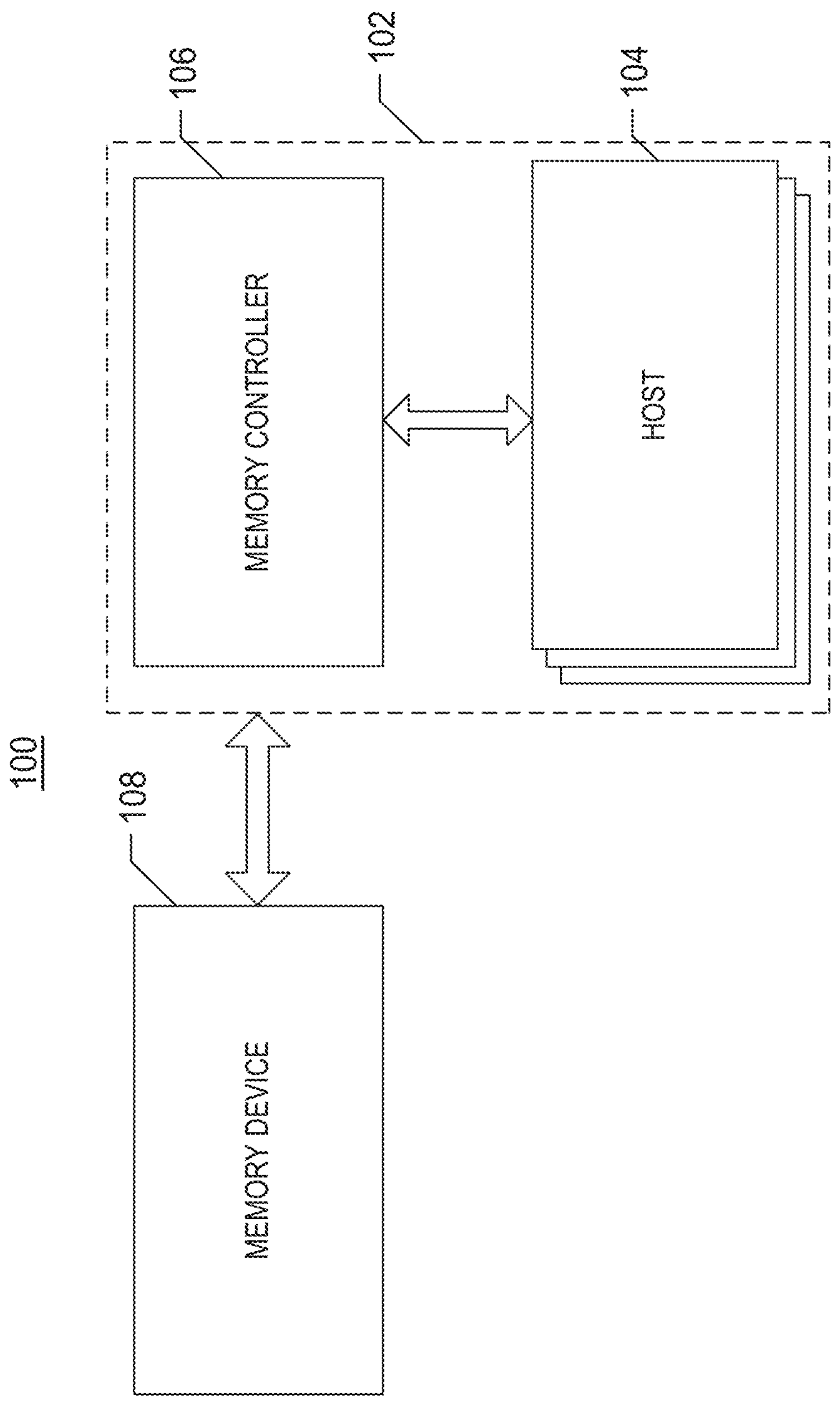
FIG. 1 is a schematic diagram of an example system having a memory system according to an example of the present application.

Example implementations disclosed by the present application will be described below in more detail with reference to the drawings. Although example implementations of the present application are shown in the drawings, it is to be understood that, the present application may be implemented in various form without being limited by the specific implementations as set forth herein. Rather, these implementations are provided in order for understanding the present application more thoroughly, and can fully convey the scope disclosed by the present application to those skilled in the art.

In the description below, many specific details are presented to provide a more thorough understanding of the present application. However, it is apparent to those skilled in the art that the present application may be carried out without one or more of these details. In other examples, in order to avoid confusing with the present application, some technical features well-known in the art are not described; that is, not all features of actual examples are described herein, and well-known functions and structures are not described in detail.

In addition, the accompanying drawings are only schematic illustration of the present application, and are not necessarily drawn to scale. Same reference numerals in the figures represent same or similar parts. Therefore, repeated description thereof is omitted. Some block diagrams shown in the accompanying drawings are functional entities and do not necessarily have to correspond to physically or logically independent entities. These functional entities can be implemented in software form, or these functional entities can be implemented in one or more hardware modules or integrated circuits, or these functional entities can be implemented in different networks and/or processor apparatuses and/or microcontroller apparatuses.

A flow chart shown in the accompanying drawings is only an example description, but does not have to comprise all operations. For example, some operations may be further decomposed, and some operations may be combined or partially combined. Therefore, an actual execution sequence may be changed according to an actual case.

The terms used herein are only intended to describe the examples, and are not used as limitations of the present application. As used herein, unless otherwise indicated expressly in the context, "a", "an" and "the" in a singular form are also intended to comprise a plural form. It is also to be understood that the terms "consist of" and/or "comprise", when used in this specification, determine the presence of the feature, integer, step, operation, element and/or component, but do not preclude the presence of one or more of other features, integers, operations, operations, elements, components, and/or groups. As used herein, the term "and/or" comprises any and all combinations of related items listed.

The memory device in the examples of the present application comprises, but is not limited to, a three-dimensional NAND memory. In order to facilitate understanding, the illustration is made by taking the three-dimensional NAND memory as an example.

FIG. 1 shows a block diagram of an example system 100 having a memory device according to some aspects of the present application. The system 100 may be a mobile phone, a desktop computer, a laptop computer, a tablet computer, a vehicle computer, a gaming console, a printer, a positioning apparatus, a wearable electronic apparatus, a smart sensor, a Virtual Reality (VR) apparatus, an Augmented Reality (AR) apparatus, or any other suitable electronic apparatus having a memory. As shown in FIG. 1, the system 100 may comprise a host 108 and a memory system 102. The memory system 102 has one or more memory devices 104 and a memory controller 106. The host 108 may be a processor (e.g., a central processing unit (CPU)) or a system on a chip (SOC) (e.g., an application processor (AP)) of an electronic apparatus. The host 108 may be configured to send or receive data to or from memory devices 104.

According to some implementations, the memory controller 106 is coupled to the memory devices 104 and the host 108, and configured to control the memory devices 104. The memory controller 106 can manage the data stored in the memory devices 104 and communicate with the host 108. In some implementations, the memory controller 106 is designed for operating in a low duty-cycle environment, such as secure digital (SD) cards, Compact Flash (CF) Cards, Universal Serial Bus (USB) flash drives, or other media for use in electronic apparatuses, such as personal computers, digital cameras, mobile phones, etc.

In some implementations, the memory controller 106 is designed for operating in high duty-cycle environment Solid-State Drives (SSDs) or embedded Multi-Media Cards (eMMCs) used as data memories for mobile devices, such as smartphones, tablets, laptop computers, etc., and enterprise memory arrays.

The memory controller 106 may be configured to control operations of the memory device 104, such as read, erase, and program operations. The memory controller 106 may further be configured to manage various functions with respect to data stored or to be stored in the memory device 104, comprising, but not limited to, bad-block management, garbage collection, logical-to-physical address conversion, wear leveling, etc. In some implementations, the memory controller 106 is further configured to process error correction codes (ECCs) with respect to the data read from or written to the memory device 104.

The memory controller 106 may further perform any other suitable functions as well, for example, formatting the memory devices 104. The memory controller 106 may communicate with an external apparatus (e.g., the host 108) according to a particular communication protocol. For example, the memory controller 106 may communicate with the external apparatus through at least one of various interface protocols, such as a USB protocol, an MMC protocol, a Peripheral Component Interconnect (PCI) protocol, a PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, a Firewire protocol, etc.

The memory controller 106 and the one or more memory devices 104 can be integrated into various types of storage apparatuses, for example, be comprised in the same package, such as a Universal Flash Storage (UFS) package or an eMMC package. That is, the memory system 102 may be implemented and packaged into different types of end electronic products.

Figure 2B:
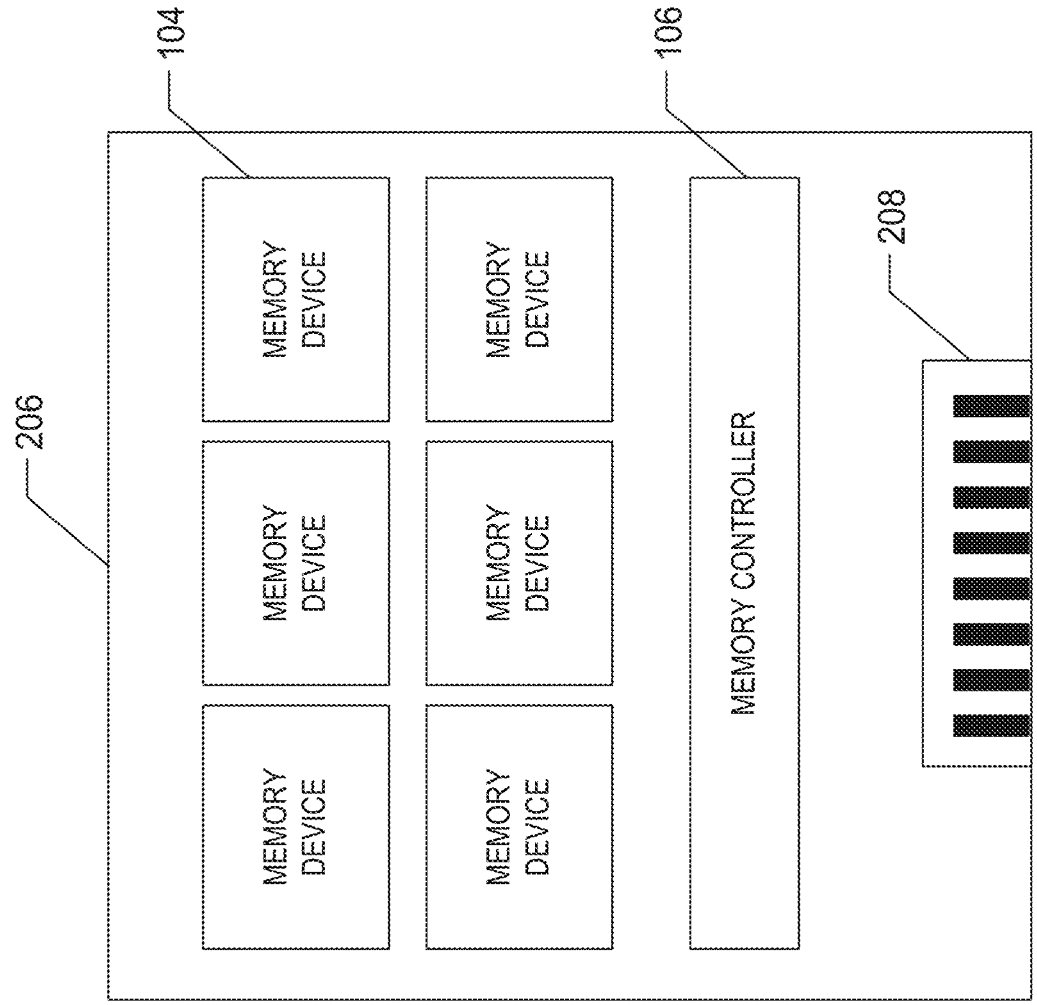
FIG. 2B is a schematic diagram of an example solid-state drive having a memory system according to an example of the present application.
Figure 2A:
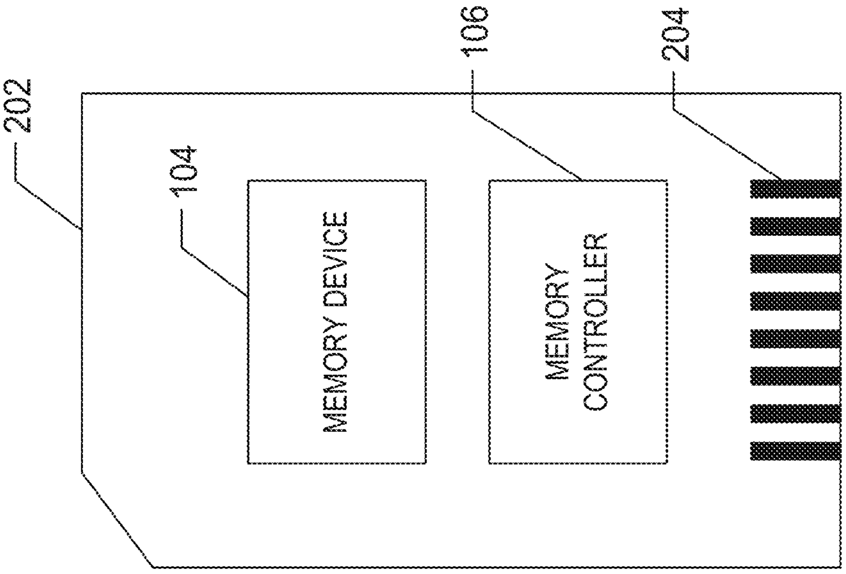
FIG. 2A is a schematic diagram of an example memory card having a memory system according to an example of the present application.

In an example shown in FIG. 2A, the memory controller 106 and a single memory device 104 may be integrated into a memory card 202. The memory card 202 may comprise a PC card (PCMCIA, Personal Computer Memory Card International Association), a CF card, a Smart Media (SM) card, a memory stick, a Multimedia card (MMC, RS-MMC, MMCmicro), an SD card (SD, miniSD, microSD, SDHC), a UFS, etc. The memory card 202 may further comprise a memory card connector 204 coupling the memory card 202 with a host (e.g., the host 108 in FIG. 1).

In another example shown in FIG. 2B, the memory controller 106 and multiple memory devices 104 may be integrated into an SSD 206. The SSD 206 may further comprise an SSD connector 208 coupling the SSD 206 with a host (e.g., the host 108 in FIG. 1). In some implementations, at least one of a storage capacity or operation Speed of the SSD 206 is greater than at least one of a storage capacity or operation Speed of the memory card 202.

In some examples, each memory block may be coupled to multiple word lines. Multiple memory cells coupled to each word line form a physical page.

Figure 3:
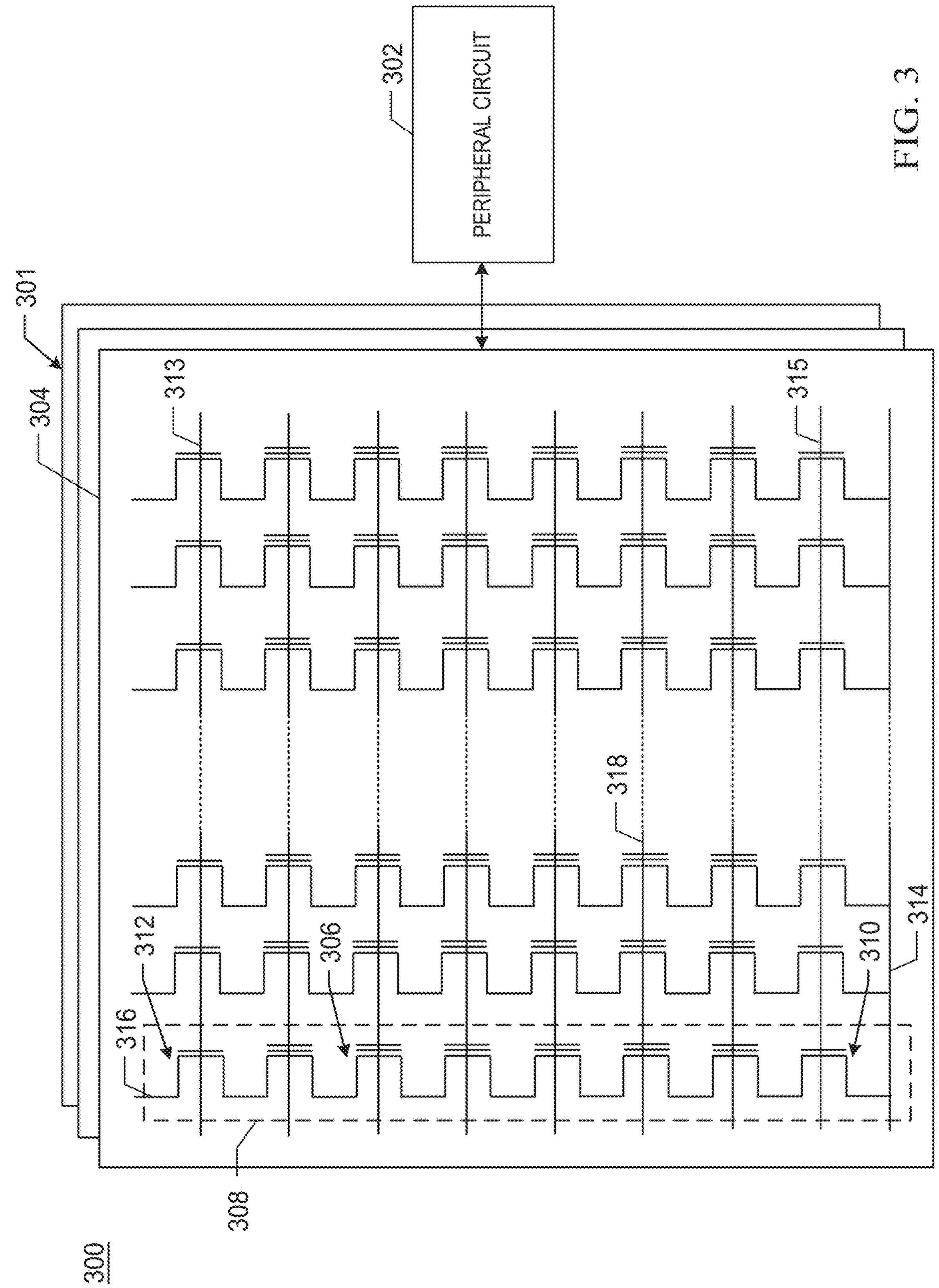
FIG. 3 is a schematic diagram of an example memory comprising a peripheral circuit according to an example of the present application.

FIG. 3 illustrates a schematic circuit diagram of an example memory device 300 comprising a peripheral circuit according to some aspects of the present application. The memory device 300 may be an example of the memory device 104 in FIG. 1. The memory device 300 may comprise a memory cell array 301 and a peripheral circuit 302 coupled to the memory cell array 301. For example, memory cell array 301 is a three-dimensional NAND memory cell array. A memory cell 306 is a NAND memory cell. The memory cell 306 is provided in the form of an array of memory strings 308. Each memory string 308 vertically extends above a substrate (not shown). In some implementations, each memory string 308 comprises multiple memory cells 306 coupled in series and stacked vertically. Each memory cell 306 may maintain a continuous analog value, such as voltage or charge, which depends on a number of electrons trapped within a region of the memory cell 306. Each memory cell 306 may be either a floating gate type memory cell that comprises a floating gate transistor, or a charge trap type memory cell that comprises a charge trap transistor.

In some implementations, each memory cell 306 is a Single Level Cell (SLC) that has two possible memory states and thus may store one bit of data. For example, a first memory state "0" may correspond to a first voltage range, and a second memory state "1" may correspond to a second voltage range. In some implementations, each memory cell 306 is a Multi-Level Cell (MLC) that can store more than one bit of data in more than four memory states. For example, the MLC can store two bits per cell (which may also be called a double-level cell), three bits per cell (also called a trinary-level cell (TLC)), four bits per cell (also called a quad-level cell (QLC)), five bits per cell (also called a penta-level cell (PLC)), or more than five bits per cell. Each MLC can be programmed to assume a range of possible nominal storage values. In an example, if each MLC stores two bits of data, the MLC can be programmed to employ one of three possible program levels from an erase state by writing one of three possible nominal storage values to the cell, and a fourth nominal storage value may be used to represent the erase state.

It is to be noted that, the memory state here is a memory state of a memory cell in the present application. Different memory cells have different numbers of memory states. For example, a memory cell of an SLC type has 2 memory states (that is, two memory states). The 2 memory states comprise one programmed state and one erased state. In another example, a memory cell of an MLC type has 4 memory states. The 4 memory states comprise one erased state and three programmed states. In still another example, a memory cell of a TLC type has 8 memory states. The 8 memory states comprise one erased state and seven programmed states. In some implementations, a memory cell of a QLC type has 16 memory states. The 16 memory states comprise one erased state and fifteen programmed states.

As shown in FIG. 3*b*, every memory string 308 may comprise a bottom selective transistor (BSG) 310 (also referred to as a source side selective transistor) at a source terminal of the memory string and a top selective transistor (TSG) 312 (also referred to as a drain side selective transistor) at a drain terminal of the memory string. The BSG 310 and the TSG 312 may be configured to activate a selected memory string 308 during a read operation and a program operation. In some implementations, sources of memory strings 308 in a same memory block 304 are coupled through a same source line (SL) 314 (for example, a common SL). For example, according to some implementations, all the memory strings 308 in the same memory block 304 have an array common source (ACS). According to some implementations, the TSG 312 of each memory string 308 is coupled to a respective Bit Line (BL) 316, and data may be read or written from the bit line 316 via an output bus (not shown). In some implementations, each memory string 308 is configured to be selected or unselected by applying a select voltage (e.g., above a threshold voltage of a transistor having the TSG 312) or an unselect voltage (e.g., 0 V) to the respective TSG 312 via one or more TSG lines 313 and/or by applying a select voltage (e.g., above a threshold voltage of a transistor having the BSG 310) or an unselect voltage (e.g., 0 V) to the respective BSG 310 via one or more BSG lines 315.

As shown in FIG. 3, the memory strings 308 may be organized into multiple memory blocks 304, and each of the multiple memory blocks 304 may have a common source line 314 (e.g., coupled to the ground). In some implementations, each memory block 304 is a basic data unit for an erase operation, e.g., all of the memory cells 306 on the same memory block 304 are erased at the same time. In order to erase the memory cells 306 in a selected memory block 304, the source lines 314 coupled to the selected memory block 304*a* as well as unselected memory blocks 304 that are in the same plane as the selected memory block 304*a* can be biased with an erase voltage (Vers, such as a high positive voltage (e.g., 20 V or higher)). It is to be understood that in some examples, the erase operation may be performed at a half memory block level, a quarter memory block level, or a level having any suitable number of memory blocks or any suitable fractions of a memory block. The memory cells 306 of adjacent ones of the memory strings 308 may be coupled through word lines 318 that select which row of memory cells 306 is affected by the read and program operations.

Referring to FIG. 3, each memory cell 306 of the multiple memory cells is coupled to the respective word line 318, and each memory string 308 is coupled to the respective bit line 316 through a respective select transistor (such as, the top select transistor (TSG) 312).

Figure 4:
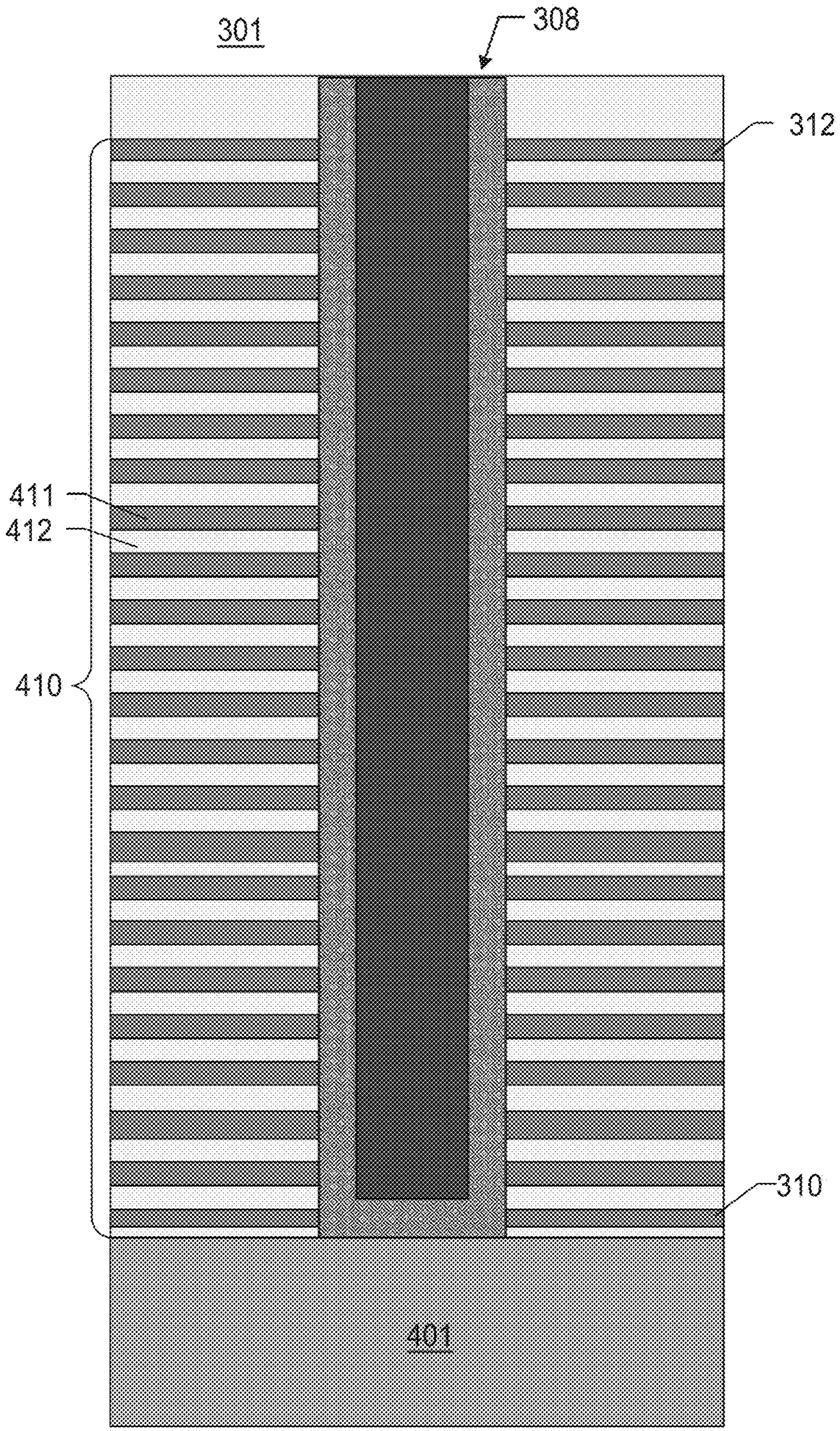
FIG. 4 is a schematic cross-sectional view of an array of memory cells comprising a NAND memory string according to an example of the present application.

FIG. 4 shows a schematic cross-sectional view of an example memory cell array 301 comprising a memory string 308 with NAND as an example according to some aspects of the present application. As shown in FIG. 4, the memory cell array 301 may comprise a stack structure 410. The stack structure 410 comprises multiple gate layers 411 and multiple insulating layers 412 that are sequentially and alternately stacked and a channel structure that penetrates the gate layers 411 and the insulating layers 412 vertically. The channel structure is coupled with each gate layer to form a cell. The channel structure is coupled with the multiple gate layers in the stack structure 410 to form the memory string 308. The gate layers 411 and the insulating layers 412 may be alternately stacked, and two adjacent gate layers 411 are spaced apart by one insulating layer 412.

A constituent material of the gate layers 411 may comprise a conductive material. The conductive material includes, but is not limited to, tungsten (W), cobalt (Co), copper (Cu), aluminum (Al), polysilicon, doped silicon, silicides, or any combination thereof. In some implementations, each gate layer 411 comprises a metal layer, e.g., a tungsten layer. In some implementations, each gate layer 411 comprises a doped polysilicon layer. Each gate layer 411 may comprise a control gate around the cells. The gate layer 411 at the top of the stack structure 410 may extend laterally as an upper select gate line; the gate layer 411 at the bottom of the stack structure 410 may extend laterally as a lower select gate line; and the gate layers 411 that extend laterally between the upper select gate line and the lower select gate line may act as word line layers.

In some examples, the stack structure 410 may be disposed on a substrate 401. The substrate 401 may comprise silicon (e.g., single crystalline silicon), silicon germanium (SiGe), gallium arsenide (GaAs), germanium (Ge), silicon on insulator (SOI), germanium on insulator (GOI), or any other suitable materials.

In some examples, the memory string 308 comprises a channel structure that extends through the stack structure 410 vertically. In some implementations, the channel structure comprises a channel hole filled with (one or more) semiconductor materials (e.g., as a semiconductor channel) and (one or more) dielectric materials (e.g., as a memory film). In some implementations, the semiconductor channel comprises silicon, e.g., polysilicon. In some implementations, the memory film is a composite dielectric layer comprising a tunneling layer, a storage layer (also known as a "charge trap/storage layer"), and a blocking layer. The channel structure may have a cylindrical shape (e.g., a pillar shape). According to some implementations, the semiconductor channel, the tunneling layer, the storage layer, and the blocking layer are arranged radially from the center toward the outer surface of the pillar in this order. The tunneling layer may comprise silicon oxide, silicon oxynitride, or any combination thereof. The storage layer may comprise silicon nitride, silicon oxynitride, or any combination thereof. The blocking layer may comprise silicon oxide, silicon oxynitride, a high dielectric constant (high-k) dielectric, or any combination thereof. In an example, the memory film can include a composite layer of silicon oxide/silicon oxynitride/silicon oxide (ONO).

Figure 5:
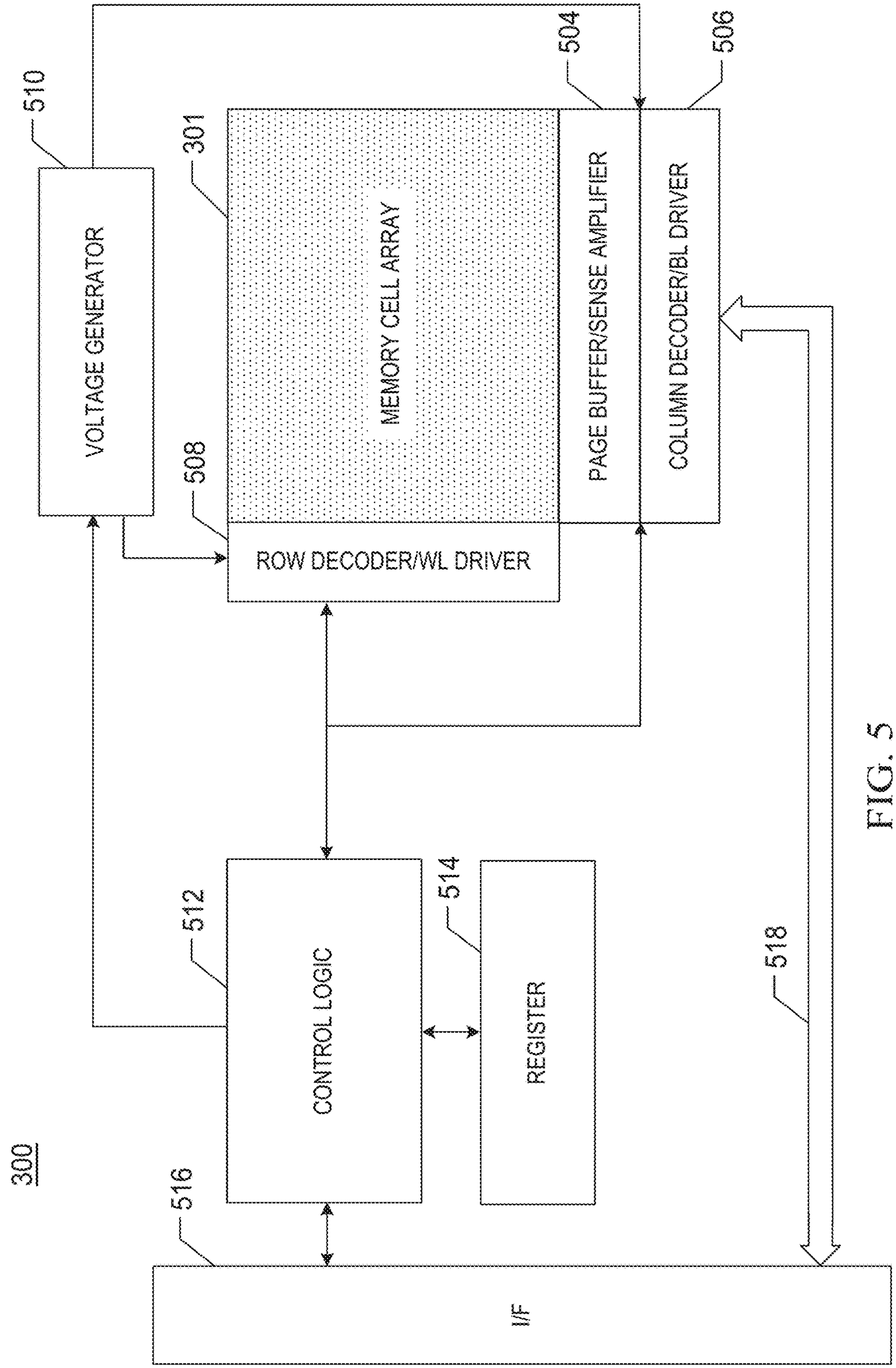
FIG. 5 is a schematic diagram of an example memory device comprising an array of memory cells and a peripheral circuit according to an example of the present application.

Referring back to FIG. 3, the peripheral circuit 302 may be coupled to the memory cell array 301 through the bit lines 316, the word lines 318, the source lines 314, the BSG lines 315 and the TSG lines 313. The peripheral circuit 302 may include any suitable analog, digital, and hybrid signal circuits for facilitating the operations of the memory cell array 301 by applying and sensing voltage signals and/or current signals to and from each target memory cell 306 with bit lines 316, the word lines 318, the source lines 314, the BSG lines 315, and the TSG lines 313. The peripheral circuit 302 may comprise various types of peripheral circuits formed using a metal-oxide-semiconductor (MOS) technology. For example, FIG. 5 illustrates some example peripheral circuits. The peripheral circuit comprises a page buffer/sense amplifier 504, a column decoder/bit line driver 506, a row decoder/word line driver 508, a voltage generator 510, a control logic 512, a register 514, an interface 516, and a data bus 518. It is to be understood that in some examples, additional peripheral circuits not shown in FIG. 5 may be comprised as well.

The page buffer/sense amplifier 504 may be configured to read and program (write) data from and to the memory cell array 301 according to a control signal from the control logic 512. In one example, the page buffer/sense amplifier 504 may store program data (write data) to be programmed into the memory cell array 301. In another example, the page buffer/sense amplifier 504 may execute a program verification operation to ensure that the data has been properly programmed into the memory cell 306 coupled to the selected word line 318. In yet another example, the page buffer/sense amplifier 504 may also sense a low power signal from the bit line 316 that represents a data bit stored in the memory cell 306, and amplifies a small voltage swing to a recognizable logic level in the read operation. The column decoder/bit line driver 506 may be configured to be controlled by the control logic 512 and select one or more memory strings 308 by applying a bit line voltage obtained from the voltage generator 510.

The row decoder/word line driver 508 may be configured to be controlled by the control logic 512, select/unselect the memory blocks 304 of the memory cell array 301, and select/unselect the word lines 318 of the memory blocks 304. The row decoder/word line driver 508 may be further configured to drive the word lines 318 using a word line voltage obtained from the voltage generator 510. In some implementations, the row decoder/word line driver 508 may also select/unselect and drive the BSG line 315 and the TSG line 313. As described below in detail, the row decoder/word line driver 508 is configured to execute the program operation on the memory cells 306 that are coupled to (one or more) selected word line 318. The voltage generator 510 may be configured to be controlled by the control logic 512 and obtain a word line voltage (such as, a read voltage, a program voltage, a pass voltage, a channel boost voltage, a verify voltage, etc.), a bit line voltage, and a source line voltage to be supplied to the memory cell array 301.

The control logic 512 can be coupled to every other portion in the peripheral circuit described above and configured to control the operations of every other portion in the peripheral circuit. The register 514 may be coupled to the control logic 512 and comprise a state register, a command register, and an address register for storing state information, a command operation code (OP code), and a command address for controlling the operation of each peripheral circuit. The interface 516 may be coupled to the control logic 512, and act as a control buffer to buffer and relay control commands received from a host (not shown) to the control logic 512 and state information received from the control logic 512 to the host. The interface 516 may also be coupled to the column decoder/bit line driver 506 with data bus 518 and act as a data I/O interface and a data buffer to buffer and relay the data to and from the memory cell array 301.

A basic principle of a three-dimensional NAND-type memory is a process in which carriers (electrons or holes) cross a charge barrier to inject a certain number of charges into a memory cell (cell) to complete a data write, and then storage data may be read according to a threshold voltage when the memory cell is turned on. Therefore, to read correct data, an ECC error correction algorithm with a strong error correction capability and high efficiency is usually introduced during a data read.

However, as the use time increases, charges stored in memory cells vary due to the increasing use time, repeated read operations, cross temperature, etc., thus affecting the correctness of reading data. When the threshold voltage deviates up or down obviously, when an original read voltage is used to read the data in the memory cell, a read error is highly probable. When a read error exceeds an ECC error correction capability, the data in the memory cell fails to be read.

Figure 6:
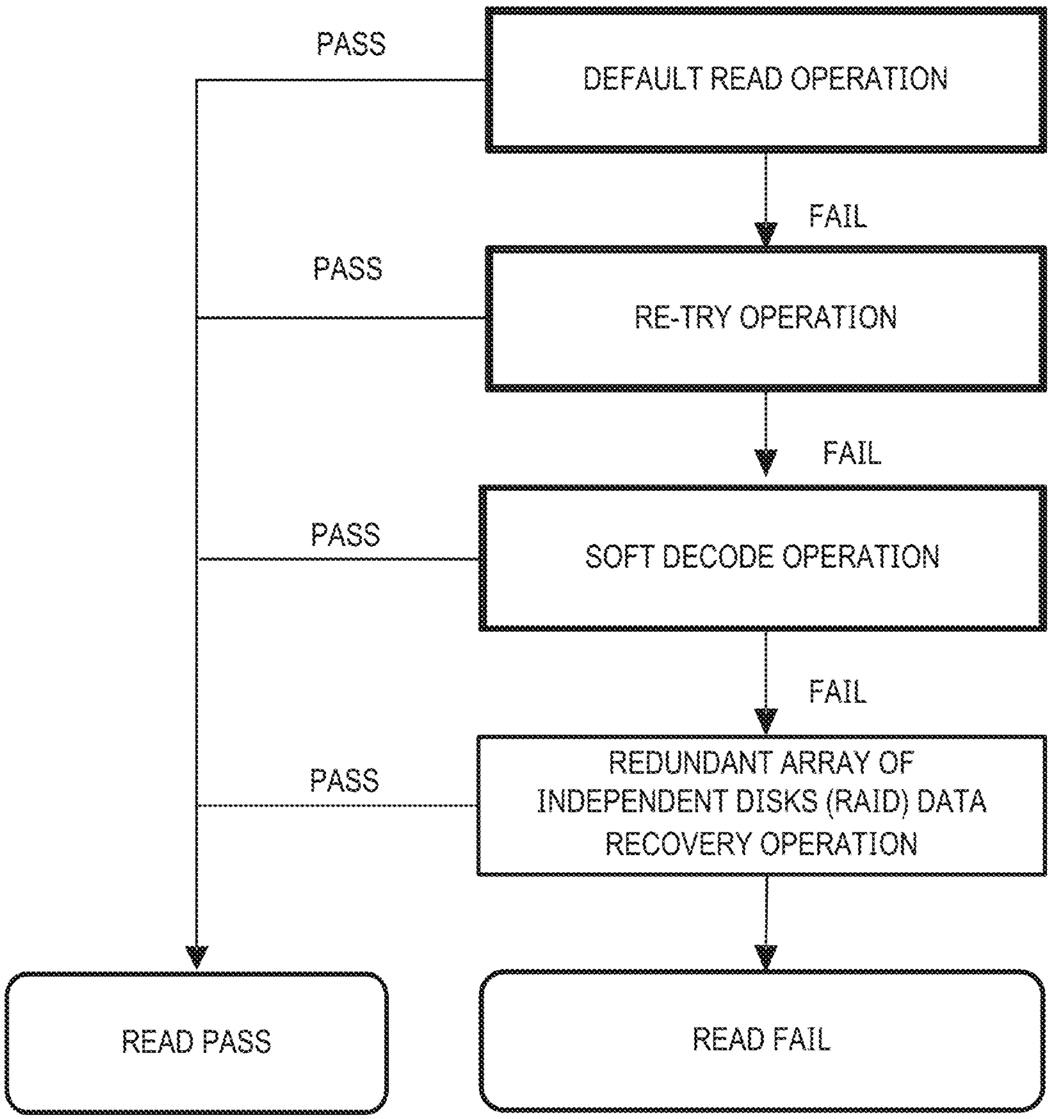
FIG. 6 is a schematic diagram of an example flow of a read operation of a memory system provided by the present application.

FIG. 6 illustrates a schematic diagram of an example flow of a read operation of a memory system. In conjunction with what is shown in FIG. 6, when the memory controller controls the memory device to perform a read operation, a default read operation (FW) is first performed on the memory cell at the corresponding physical address; if the default read operation fails, a read retry operation is performed; after the read retry operation fails, a soft decode operation is performed; after the soft decode fails, a Redundant Array of Independent Disk (RAID) operation is performed; and after the RAID operation fails, the read operation stops and the read fails because the error cannot be corrected, then the memory controller sends a read fail signal to the host 108. Read retry operation and default read operation may be applicable to hard decode.

In some implementations, a read retry operation may usually be performed by looking up a retry table provided by a manufacturer. The essence of the read retry operation is an error correction mechanism. The retry table may provide a reference voltage used for reading data. A read voltage that deviates from a normal threshold voltage is tried by looking up the retry table to read memory cells again and perform error correction in combination with an ECC error correction algorithm, to try to correctly read data. If data with a read error is corrected, the lookup of the retry table is stopped. If data with a read error fails to be corrected, the lookup of the retry table is continued until the entire retry table is traversed.

In the foregoing manner of the read retry operation, because the retry table needs to be looked up entry by entry, this inevitably increases a number of trials and errors, consuming a relatively long time. In addition, the retry table provided by the manufacturer is only reference values in some specific environments. Actual use scenarios are high variable, and therefore many scenarios are not covered in the retry table provided by the manufacturer. As a result, data may fail to be corrected by traversing the retry table, and a long time is wasted to process commands. In summary, a manner of performing read retry operations by repeatedly polling a retry table consumes a long time, affects a response time of subsequent commands, and affects the performance of a device.

Figure 7:
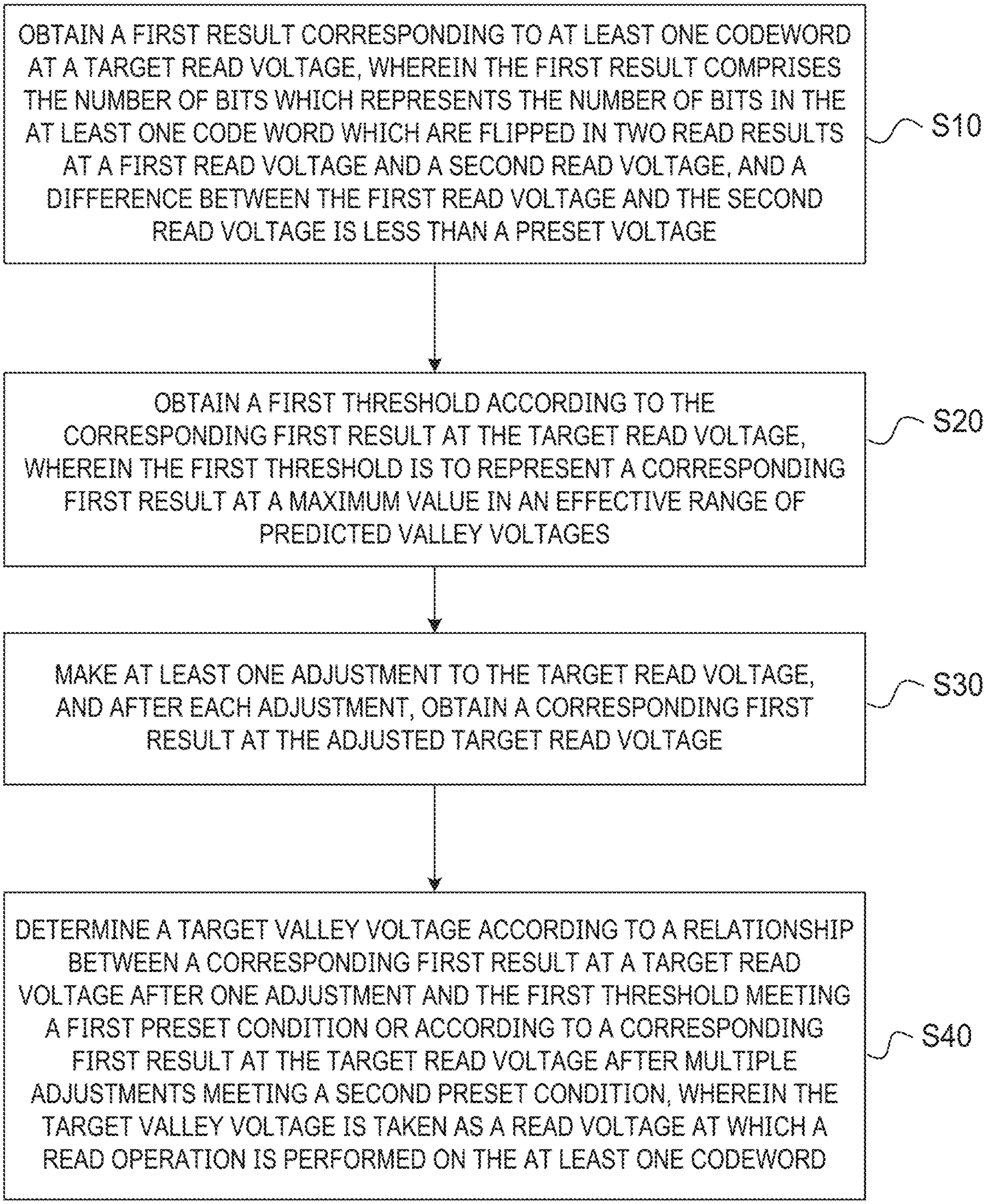
FIG. 7 is a schematic diagram of the implementation process of operating a method that peripheral circuit of a memory device provided by an example of the present application is configured to perform.

Based on one or more of the foregoing problems, in a first aspect, examples of the present application provide a memory device. As shown in FIG. 7, the memory device comprises: an array of memory cells comprising multiple memory cells, wherein a preset number of memory cells form one codeword; and a peripheral circuit coupled with the array of memory cells and configured to perform the following operations:

Operation S10: Obtain a first result corresponding to at least one codeword at a target read voltage, wherein the first result comprises the number of bits which represents the number of bits in the at least one codeword which are flipped in two read results at a first read voltage and a second read voltage, and a difference between the first read voltage and the second read voltage is less than a preset voltage.

Operation S20: Obtain a first threshold according to the corresponding first result at the target read voltage, wherein the first threshold is to represent a corresponding first result at a maximum value in an effective range of predicted valley voltages.

Operation S30: Make at least one adjustment to the target read voltage, and after each adjustment, obtain a corresponding first result at the adjusted target read voltage.

Operation S40: Determine a target valley voltage according to a relationship between a corresponding first result at a target read voltage after one adjustment and the first threshold meeting a first preset condition or according to a corresponding first result at the target read voltage after multiple adjustments meeting a second preset condition, wherein the target valley voltage is taken as a read voltage at which a read operation is performed on the at least one codeword.

Here, for the structure of the memory device, refer to the foregoing FIG. 3. Details are not described herein again.

In some examples, the memory device comprises an array of memory cells. The array of memory cells comprises multiple memory cells. A preset number of memory cells form one codeword (CW).

In some examples, a number of memory cells comprised in one codeword is the same as a number of memory cells comprised in encoding or decoding once during error correction encoding or decoding. In some examples, the number of memory cells comprised in one codeword may be less than or equal to a number of memory cells coupled with one physical page. For example, the number of memory cells comprised in one codeword is ¼ of the number of memory cells coupled with one physical page. In some examples, the codeword may comprises memory cells with a number ranging from 24 to 212. In an example, the codeword may comprise 24, 28 or 212 memory cells.

In general, codewords of different sizes may be selected for different memory systems, to meet performance, reliability, and storage requirements of the memory systems.

Memory cells (for example, an MLC, a TLC or a QLC) in different types of memory devices may store different numbers of bits.

It is to be noted that, in practice, a codeword has some extra reserved spaces for management and error correction. Therefore, a number of memory cells required in practice may slightly exceed the foregoing calculation result.

It may be understood that, a codeword may comprise multiple memory cells. A number of the memory cells comprised in the codeword may be adjusted according to an actual case.

In some examples, in a process of reading the memory device, data of one physical page is read out by one read operation. When the number of memory cells comprised in one codeword may be less than the number of memory cells coupled with one physical page, the codeword is an executable unit in obtaining the first result. However, in practice, multiple codewords are not excluded. That is, a first result corresponding to at least one codeword at a current read voltage may be obtained here. For example, one physical page may comprise 4 codewords. A page buffer hardware operation may calculate respective fail bit counts (FBCs) of the 4 codewords at once, and then the FBCs of the four codewords are added to obtain an FBC of one physical page. A value obtained from the addition is used in subsequent calculation. It may be understood that the first result here may be data based on one physical page, and one physical page may comprise multiple codewords.

In some examples, the array of memory cells comprises memory cells with a number of memory bits being P bits. The P memory bits correspond to P pages respectively. The P-bit memory cell reads, through a Q-level read voltage, P-bit storage data of the memory cell. P and Q are both integers greater than 1, and Q=2P−1.

Figure 8A:
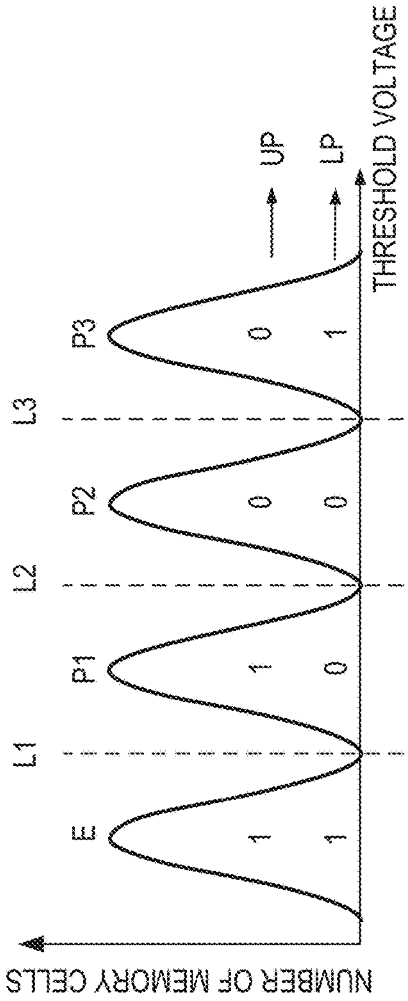
FIG. 8A is a schematic diagram of a threshold voltage distribution corresponding to a memory cell comprising 2 memory bits provided by an example of the present application.

In an example, when the number of memory bits of the memory cell is 2, a corresponding memory state comprises a $0^{th}$ state to a $4^{th}$ state. With reference to FIG. 8A, the 4 states are the $0^{th}$ state (also referred to as an erased state) E, the $1^{st}$ state (also referred to as a $1^{st}$ memory state) P1, the $2^{nd}$ state (also referred to as a $2^{nd}$ memory state) P2, and the $3^{rd}$ state (also referred to as a $3^{rd}$ memory state) P3 respectively. Binary data corresponding to the 4 states are 11, 10, 00, and 01 respectively. Correspondingly, the memory device comprises two pages, which are a lower page (LP) and an upper page (UP) respectively.

A memory cell shown in FIG. 8A is taken as an example. A two-bit memory cell reads, through a 3-level read voltage (a first-level read voltage L1, a second-level read voltage L2, and a third-level read voltage L3 shown in FIG. 8A), two-bit four-state storage data of the two-bit memory cell.

In an example, one page corresponds to a multi-level read voltage, and the other page corresponds to a one-level read voltage. As shown in FIG. 8A, binary data corresponding to the lower page is 1001, and a corresponding first-level read voltage L1 and a corresponding third-level read voltage L3 are required to read the lower page. Binary data corresponding to the upper page is 1100, and a corresponding second-level read voltage L2 is required to read the upper page.

Figure 8B:
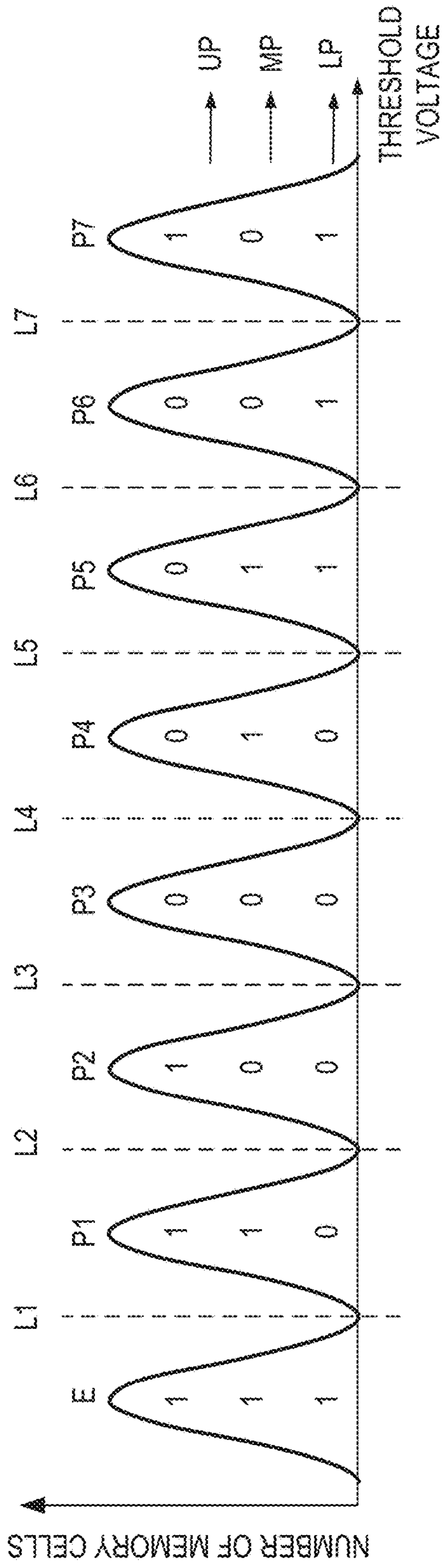
FIG. 8B is a schematic diagram of a threshold voltage distribution corresponding to a memory cell comprising 3 memory bits provided by an example of the present application.

In an example, when the number of memory bits of the memory cell is 3, a corresponding memory state comprises a $0^{th}$ state to a $7^{th}$ state. With reference to FIG. 8B, the 8 states are the $0^{th}$ state (also referred to as an erased state) E, the $1^{st}$ state (also referred to as a $1^{st}$ memory state) P1, the $2^{nd}$ state (also referred to as a $2^{nd}$ memory state) P2, . . . , and the $7^{th}$ state (also referred to as a $7^{th}$ memory state) P7 respectively. Binary data corresponding to the 8 states are 111, 110, 100, 000, 010, 011, 001, and 101 respectively. Correspondingly, the memory device comprises three pages, which are a lower page, a middle page (MP), and an upper page respectively.

A memory cell shown in FIG. 8B is taken as an example. A three-bit memory cell reads, through a 7-level read voltage (a first-level read voltage L1, a second-level read voltage L2, a third-level read voltage L3, a fourth-level read voltage L4, a fifth-level read voltage L5, a sixth-level read voltage L6, and a seventh-level read voltage L7 shown in FIG. 8B), three-bit and eight-state storage data of the three-bit memory cell.

In an example, each page corresponds to a multi-level read voltage. As shown in FIG. 8B, binary data corresponding to the lower page is 10000111, and a corresponding first-level read voltage L1 and a corresponding fifth-level read voltage L5 are required to read the lower page. Binary data corresponding to the middle page is 11001100, and a corresponding second-level read voltage L2, a corresponding fourth-level read voltage L4, and a corresponding sixth-level read voltage L6 are required to read the middle page. Binary data corresponding to the upper page is 11100001, and a corresponding third-level read voltage L3 and a corresponding to seventh-level read voltage L7 are required to read the upper page.

Figure 8C:
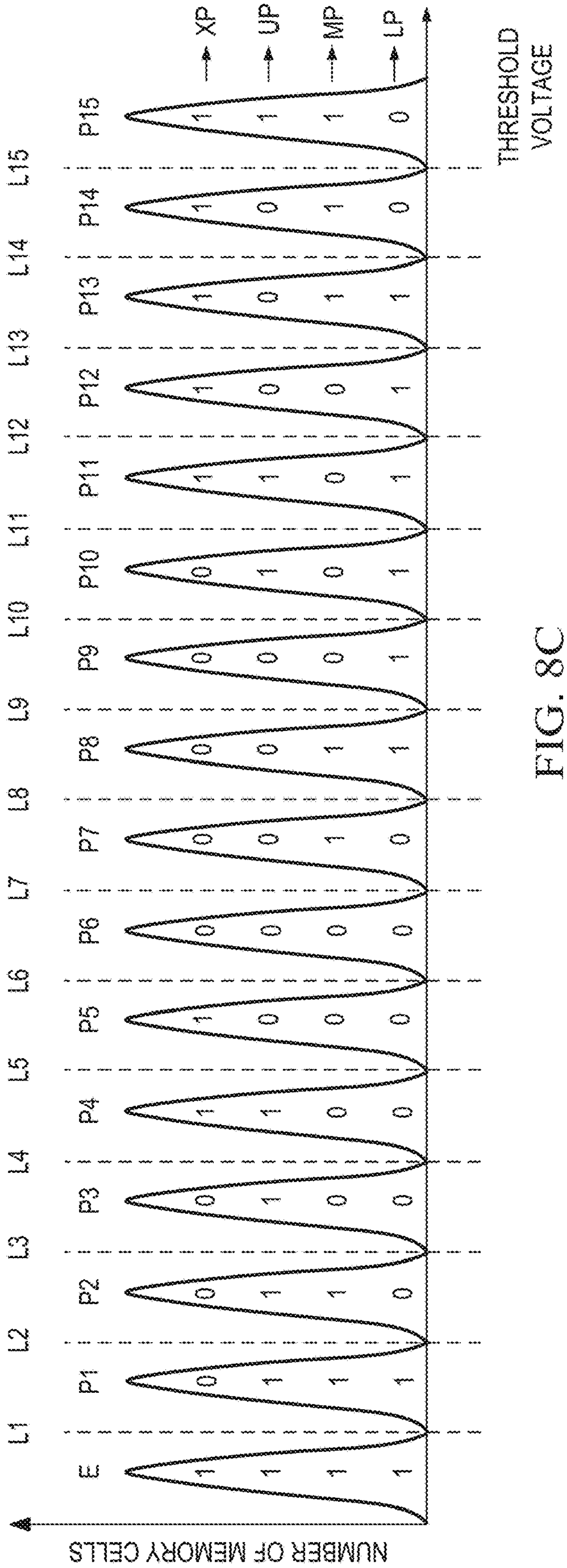
FIG. 8C is a schematic diagram of a threshold voltage distribution corresponding to a memory cell comprising 4 memory bits provided by an example of the present application.

In an example, when the number of memory bits of the memory cell is 4, a corresponding memory state comprises a $0^{th}$ state to a $15^{th}$ state. With reference to FIG. 8C, the 16 states are the $0^{th}$ state (also referred to as an erased state) E, the $1^{st}$ state (also referred to as a $1^{st}$ memory state) P1, the $2^{nd}$ state (also referred to as a $2^{nd}$ memory state) P2, . . . , and the $15^{th}$ state (also referred to as a $15^{th}$ memory state) P15 respectively. Binary data corresponding to the 16 states are 1111, 0111, 0110, . . . , and 1110 respectively. Correspondingly, the memory device comprises four pages, which are a lower page, a middle page, an upper page, and an extra page (XP) respectively. Here, the four memory bits corresponding to the 16 states are stored in the lower page, the middle page, the upper page, and the extra page respectively.

A memory cell shown in FIG. 8C is taken as an example. A four-bit memory cell reads, through a 15-level read voltage (a first-level read voltage L1, a second-level read voltage L2, a third-level read voltage L3, a fourth-level read voltage L4, a fifth-level read voltage L5, a sixth-level read voltage L6, a seventh-level read voltage L7, an eighth-level read voltage L8, a ninth-level read voltage L9, a tenth-level read voltage L10, an eleventh-level read voltage L11, a twelfth-level read voltage L12, a thirteenth-level read voltage L13, a fourteenth-level read voltage L14, and a fifteenth-level read voltage L15 shown in FIG. 8C), four-bit sixteen-state storage data of the four-bit memory cell.

In an example, each page corresponds to a multi-level read voltage. As shown in FIG. 8C, binary data corresponding to the lower page is 1100000011111100, and a corresponding second-level read voltage L2, a corresponding eighth-level read voltage L8, and a corresponding fourteenth-level read voltage L14 are required to read the lower page. Binary data corresponding to the middle page is 1110000110000111, and a corresponding third-level read voltage L3, a corresponding seventh-level read voltage L7, a corresponding ninth-level read voltage L9, and a corresponding thirteenth-level read voltage L13 are required to read the middle page. Binary data corresponding to the upper page is 1111100000110001, and a corresponding fifth-level read voltage L5, a corresponding tenth-level read voltage L10, a corresponding twelfth-level read voltage L12, and a corresponding fifteenth-level read voltage L15 are required to read the upper page. Binary data corresponding to the extra page is 1000110000011111, and a corresponding first-level read voltage L1, a corresponding fourth-level read voltage L4, a corresponding sixth-level read voltage L6, and a corresponding eleventh-level read voltage L11 are required to read the extra page.

The lower page is usually closest to a source/drain. Therefore, each level of read voltage of the corresponding levels of read voltage of the lower page is preferentially determined, an access speed is the highest, and a response time is the shortest, so that a balance between performance and durability in a data access process can be ensured.

It is to be noted that, the manner of preferentially determining each level of read voltage of the corresponding levels of read voltage of the lower page is only an example, and is not used to limit a sequence of determining each level of read voltage in multi-level read voltages corresponding to at least part of pages in examples of the present application.

It is to be noted that, the difference between the first read voltage and the second read voltage may be less than the preset voltage. In some examples, the second read voltage is greater than the first read voltage, and a range of the difference between the first read voltage and the second read voltage is set to 5 mV to 20 mV. In an example, the difference may be 5 mV, 10 mV, 15 mV, or 20 mV. In some other examples, the second read voltage is less than the first read voltage, and a range of the difference between the first read voltage and the second read voltage is set to −5 mV to −20 mV. In an example, the difference may be −5 mV, −10 mV, −15 mV, or −20 mV.

It is to be noted that, the first read voltage and the second read voltage here are sequentially related. That is, the second read voltage is obtained by making a third adjustment according to the first read voltage. Based on this, a voltage difference between the first read voltage and the second read voltage is a step size of the third adjustment. The difference between the first read voltage and the second read voltage being less than the preset voltage may be understood as that the first read voltage and the second read voltage have a small voltage difference. The preset voltage is related to the step size of the third adjustment, and may be a voltage slightly larger than the step size of the third adjustment. In some examples, a range of the preset voltage is set to 6 mV to 21 mV. In an example, the preset voltage may be 6 mV, 11 mV, 16 mV, or 21 mV. In some other examples, a range of the preset voltage is set to −6 mV to −21 mV. In an example, the preset voltage may be −6 mV, −11 mV, −16 mV, or −21 mV.

It is to be noted that, the first read voltage and the second read voltage are both general concepts. The target read voltage and read voltages obtained by making a first adjustment and a second adjustment to the target read voltage may all referred to as the first read voltage, and a read voltage obtained by making the third adjustment to the first read voltage may be referred to as the second read voltage. That is, the first read voltage is a general concept, and may be understood as the target read voltage or a target adjustment read voltage (a voltage obtained by making an adjustment to the target read voltage with a target step size, a range of the target step size may be set to 20 mV to 40 mV, and in an example, a step size of the second adjustment may be 20 mV, 30 mV, or 40 mV; and the range of the target step size may further be set to 50 mV to 150 mV. In an example, a step size of the first adjustment may be 50 mV, 60 mV, 70 mV, 80 mV, 100 mV, 120 mV, or 150 mV).

In examples of the present application, a corresponding first result at a voltage may be understood as follows: The third adjustment is made to a voltage, that is, a first voltage difference ΔV1 exists between a voltage and a voltage after the third adjustment. A number of bits in the preset number of memory cells that are flipped in two read results at a voltage and a voltage after the third adjustment may be taken as a corresponding first result at a voltage. The preset number of memory cells may form at least one codeword.

In an example, the corresponding first result at the first read voltage may be understood as follows: The third adjustment is made to the first read voltage, that is, the first voltage difference ΔV1 exists between the first read voltage and the second read voltage. A number of bits in a preset number of memory cells that are flipped in two read results at the first read voltage and at the second read voltage may be taken as the corresponding first result at the first read voltage. The first read voltage may be a target read voltage in a first stage (V0 shown in FIG. 9D), and the second read voltage may be a read voltage (V1 shown in FIG. 9D) obtained by making the third adjustment to the first read voltage, or, the first read voltage may be a adjusted target read voltage in a first stage (V2 shown in FIG. 9D), and the second read voltage may be a read voltage (V3 shown in FIG. 9D) obtained by making the third adjustment to the adjusted target read voltage.

In examples of the present application, the obtaining of the target valley voltage may be understood as follows: according to a corresponding first result at a voltage meeting a preset condition, the voltage is determined as the target valley voltage. For example, according to a corresponding first result at a read voltage in a first stage being less than or equal to a second preset value, the read voltage in a first stage is determined as a target valley voltage in a first stage. A range of the second preset value is set to 5 to 30, and in an example, the second preset value may be 5, 10, 15, 20, 25, or 30.

In examples of the present application, the obtaining of the predicted valley voltage may be understood as follows: The predicted valley voltage is obtained according to a voltage and the first mapping function. For example, according to a predicted valley voltage in a first stage/the target valley voltage in a first stage and the first mapping function, a predicted valley voltage in a second stage is obtained. The first mapping function is to represent a relationship between the predicted valley voltage in a first stage/the target valley voltage in a first stage and the predicted valley voltage in a second stage. The obtaining of the predicted valley voltage may further be understood as follows: according to a corresponding first result at a voltage, the stage number at which the voltage is, and a second mapping function, the predicted valley voltage is obtained. For example, according to a corresponding first result at the target read voltage in a first stage, the stage number at which the first stage is, and the second mapping function, the predicted valley voltage in a first stage is obtained. The second mapping function is to represent a relationship between the corresponding first result at the target read voltage, the stage number at which each stage is and the predicted valley voltage.

In examples of the present application, the obtaining of the adjusted voltage (for example, the adjusted read voltage/ the adjusted target read voltage) may be understood as a voltage obtained by making an adjustment to a voltage according to the target step size. For example, multiple first adjustments are made to the target read voltage with a first step size, and target read voltages after the multiple first adjustments are obtained respectively, or, multiple the second adjustments are made to the target read voltage with a second step size, and target read voltages after the multiple the second adjustments are obtained respectively.

In some examples, before a first result corresponding to at least one codeword at the target read voltage in a first stage is obtained, a read mode of the memory device is set to a single-level read (SLR) mode. The single-level read mode comprises reading, through a one-level read voltage, at least one bit of storage data stored in a memory cell. In some examples, the memory device is configured to: enter the single-level read mode in response to a mode setting command, and to obtain the first result corresponding to at least one codeword at the target read voltage in a first stage in the single-level read mode.

In some examples, the peripheral circuit is configured to: obtain a first result corresponding to at least one codeword at a target read voltage; obtain a first threshold according to the corresponding first result at the target read voltage; make at least one adjustment to the target read voltage, and after each adjustment, obtain a corresponding first result at the adjusted target read voltage; and determine the target valley voltage according to the relationship between the corresponding first result at the target read voltage after one adjustment and the first threshold meeting the first preset condition.

It is to be noted that, the predicted valley voltage here may be directly used as the target valley voltage as required to perform a read operation on data to be read, or perform further processing to obtain the target valley voltage. A manner of obtaining the predicted valley voltage is further described below.

Here and below, an example in which the array of memory cells comprises memory cells with a number of memory bits being 3 is taken for detailed description. However, this is not used to limit examples of the present application. In an example, as shown in FIG. 9A, FIG. 9B, FIG. 9C, FIG. 9D, FIG. 9E, and FIG. 9F, a number of memory bits of a memory cell of at least one codeword is 3, which correspond to a lower page, a middle page, and an upper page respectively. Each page corresponds to multiple stages. Multiple stages of the lower page comprise a first level and a fifth level, and a first-level read voltage L1 is less than a fifth-level read voltage L5. Multiple stages of the middle page comprise a second level, a fourth level, and a sixth level, and a second-level read voltage L2 and a fourth-level read voltage L4 are both less than a sixth-level read voltage L6. Multiple stages of the upper page comprise a third level and a seventh level, and a third-level read voltage L3 is less than a seventh-level read voltage L7. Here, the fifth-level read voltage L5, the sixth-level read voltage L6, and the seventh-level read voltage L7 correspond to read voltages in a first stages of the lower page, the middle page, and the upper page respectively. The first-level read voltage L1, the second-level read voltage L2 and the fourth-level read voltage L4, and the third-level read voltage L3 correspond to read voltages in a second stage of the lower page, the middle page, and the upper page respectively.

In some examples, the peripheral circuit is configured to: obtain the first threshold according to the corresponding first result at the target read voltage and a first mapping function, wherein the first mapping function is to represent a relationship between the corresponding first result at the maximum value in the effective range of predicted valley voltages and the corresponding first result at the target read voltage.

In some examples, the target read voltage may be an empirical value (for example, a corresponding read voltage at which data is successfully read); or may be a default value configured when the memory device is delivered from a factory, wherein the default value is obtained through a large number of simulated experiments before the memory device is delivered from a factory. A default valley voltage may be a default value configured when the memory device is delivered from a factory, wherein the default value is obtained through a large number of simulated experiments before the memory device is delivered from a factory.

In the present application, the term "the corresponding first result at the target read voltage", may be briefly referred to as "a first result for the first time", the term "the corresponding first result at the predicted valley voltage" may be briefly referred to as a "predicted first result", and the term "the corresponding first result at the default valley voltage" may be briefly referred to as "a default first result".

In some examples, the first threshold is positively correlated to a deviation degree. The deviation degree is an absolute value of a difference between the first result for the first time and the default first result.

In an example, the larger the absolute value of the difference between the first result for the first time and the default first result is, the larger the first threshold is. A difference between a first result for the first time Y1 and a default first result Y3 shown in FIG. 10B is less than a difference between a first result for the first time Y1 and a default first result Y3 shown in FIG. 10C, and it may be obtained that a first threshold shown in FIG. 10B is less than a first threshold shown in FIG. 10C.

In some examples, the first mapping function is to represent and comprising a relationship between the predicted first result and the first result for the first time. The predicted first result is correlated to at least one of the level number at which the target read voltage is or a use scenario of the memory device.

Figure 10A:
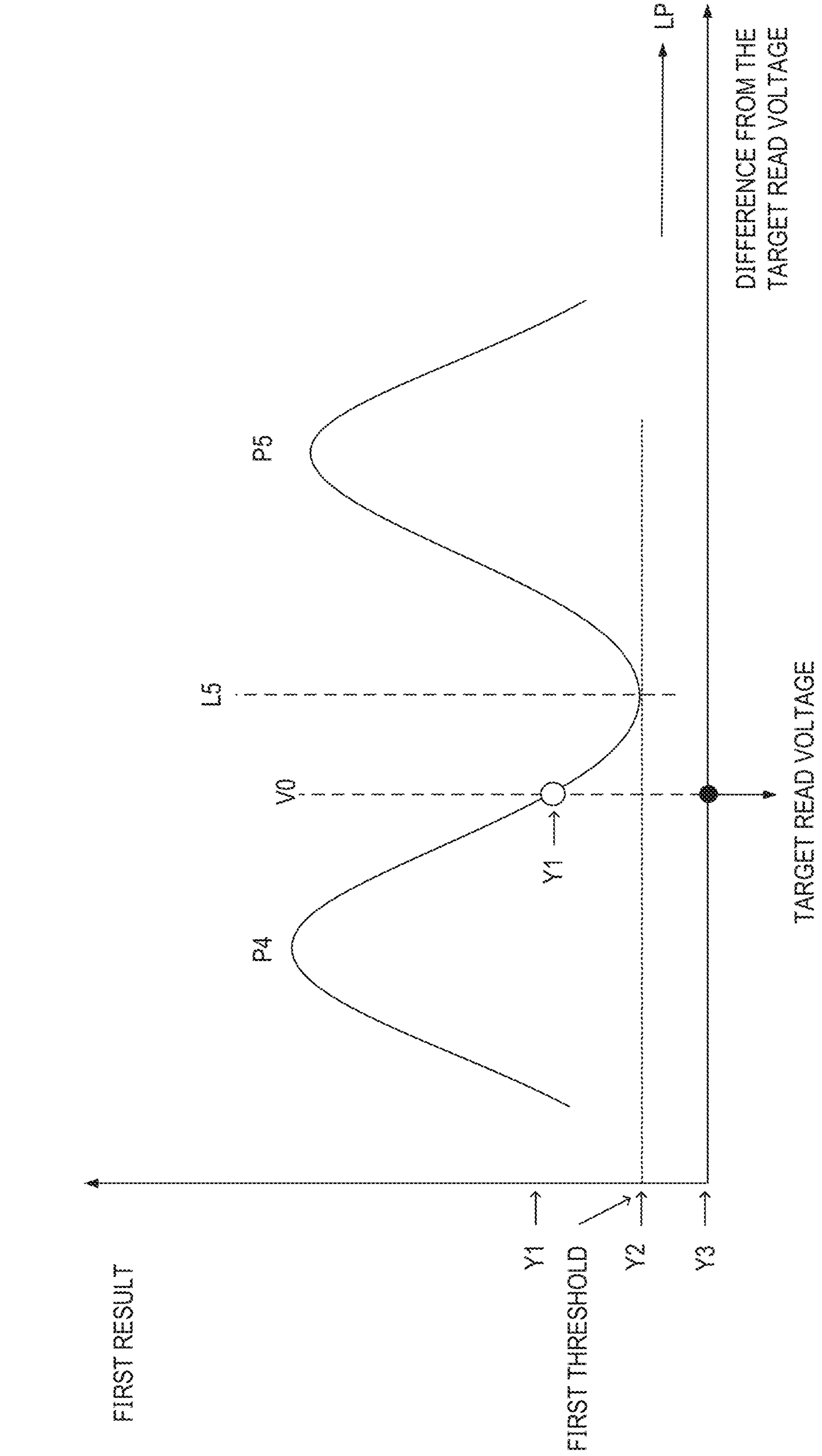
FIG. 10A is a schematic diagram 1 of a method for confirming a fifth-level read voltage corresponding to a lower page shown in FIG. 9A provided by an example of the present application.
Figure 10B:
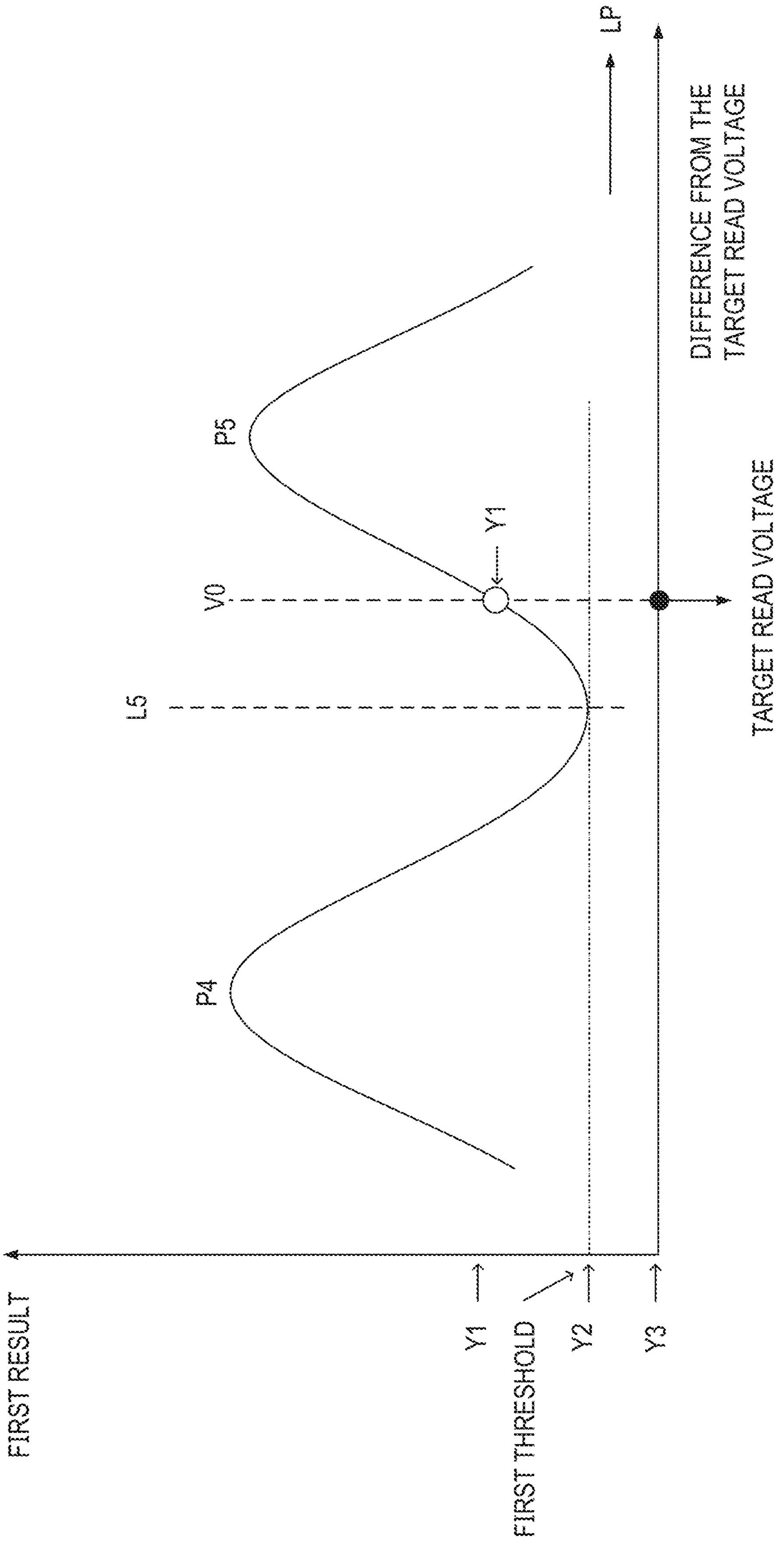
FIG. 10B is a schematic diagram 2 of a method for confirming a fifth-level read voltage corresponding to a lower page shown in FIG. 9A provided by an example of the present application.

In an example, in a data retaining scenario, as shown in FIG. 10B, when a corresponding first result Y1 (for example, 500) at a fifth-level target read voltage exceeds a threshold (for example, 400), it may be considered, according to a characteristic of the memory device, that a threshold voltage VT of a memory cell of the memory device is in a strong left deviation state. According to the corresponding first result Y1 at the fifth-level target read voltage, an adjustment may be made based on the second mapping function to obtain a fifth-level predicted valley voltage. A corresponding first result Y2 at the fifth-level predicted valley voltage is greater than a corresponding first result Y3 at the fifth-level default valley voltage.

In an example, in a read operation interference scenario, as shown in FIG. 10A, when a corresponding first result Y1 (for example, 400) at a fifth-level target read voltage exceeds a threshold (for example, 300), it may be considered, according to a characteristic of the memory device, that a threshold voltage VT of a memory cell of the memory device is in a strong left deviation state. According to the corresponding first result Y1 at the fifth-level target read voltage, an adjustment may be made based on the second mapping function to obtain a fifth-level predicted valley voltage. A corresponding first result Y2 at the fifth-level predicted valley voltage is greater than a corresponding first result Y3 at the fifth-level default valley voltage.

In some examples, the peripheral circuit is configured to: obtain the corresponding first result at the maximum value in the effective range of predicted valley voltages according to an initial value of the corresponding first result at the maximum value in the effective range of predicted valley voltages, a correction value for the corresponding first result at the target read voltage, and a correction coefficient, wherein the initial value of the corresponding first result at the maximum value in the effective range of predicted valley voltages and the correction coefficient are both fixed values related to a stage in which a read voltage is, and the larger the corresponding first result at the target read voltage is, the larger the correction value is.

In some examples, according to an initial value init_val and a correction value rFBC for the first threshold and a correction coefficient rFactor, the corresponding first result at the maximum value in the effective range of predicted valley voltages is obtained, that is, a first threshold vly_fbc_th obtained for the first time. In an example, the first threshold vly_fbc_th obtained for the first time is: vly_fbc_th[level]=init_val[level]+rFBC/rFactor, and a first threshold vly_fbc_th obtained for the Nth time is: a sum of a first threshold obtained for the (N−1)th time and (rFBC/rFactor). A formula of the first threshold vly_fbc_th may be represented as: vly_fbc_th[level]=vly_fbc_th[level]+rFBC/rFactor. For details, refer to Formula (1) in Table 1.

In some examples, according to a first result for the first time fFBC and a reference coefficient ref_fbc3, the correction value rFBC is obtained. In an example, a formula of the correction value rFBC is: rFBC=fFBC−fFBC/ref_fbc3[level]. For details, refer to Formula (2) in Table 1.

In an example, a segmentation parameter div_para is 8. In an example the first result for the first time fFBC is 500. In an example, the reference coefficient ref_fbc3 is {DMY, 1, 1, 1, 6, 5, 5, 4}. According to Formula (2), in an example, it may be obtained that the correction value rFBC is {DMY, 0, 0, 0, 416, 400, 400, 375}.

In an example, the initial value init_val of the first threshold is {DMY, 90, 90, 90, 90, 95, 90, 90}. In an example, the correction value rFBC is {DMY, 0, 0, 0, 416, 400, 400, 375}. In an example, the correction coefficient rFactor is {DMY, 80, 80, 80, 80, 40, 80, 40}. According to Formula (1), in an example, it may be obtained that the first threshold vly_fbc_th is vly_fbc_th[level]+rFBC/rFactor={DMY, 90, 90, 90, 95, 105, 95, 99}.

Table 1 below lists the first result for the first time fFBC, the first threshold vly_fbc_th, the correction value rFBC, the reference coefficient ref_fbc3, the correction coefficient rFactor, the segmentation parameter div_para, and corresponding descriptions and examples. A value of the segmentation parameter div_para may be understood as that a corresponding memory cell has multiple memory states (one erased state and multiple programmed states). For example, the value of the segmentation parameter div_para being 8 may be understood as that a corresponding memory cell of a TLC type has 8 memory states (one erased state and seven programmed states). The initial value init_val of the first threshold is {DMY, 90, 90, 90, 90, 95, 90, 90}. "DMY", "90", "90", "90", "90", "95", "90", and "90" correspond to the initial values init_val of the first threshold in an erased state, a first programmed state, a second programmed state, a third programmed state, a fourth programmed state, a fifth programmed state, a sixth programmed state, and a seventh programmed state respectively.

TABLE 1

| Parameter code | Parameter name, parameter description, and parameter example |
|---|---|
| fFBC | The corresponding first result at the target read voltage (referred to as the first result for the first time for short). In an example, the first result for the first time is:<br>500 |
| vly_fbc_th | The first threshold is obtained according to the corresponding first result at the target read voltage. In an example, the first threshold is:<br>vly_fbc_th[level] = vly_fbc_th[level] + rFBC/rFactor (1)<br>In an example, the initial value (init_val) of the first threshold is:<br>{DMY, 90, 90, 90, 90, 95, 90, 90}; |
| rFBC | The correction value is a value used for correcting the corresponding first result at the target read voltage. If the corresponding first result at the target read voltage<br>is greater than a threshold (for example, 400), the correction value needs to be adjusted. In an example, the correction value is:<br>rFBC = fFBC − fFBC/ref_fbc3[level] (2) |
| ref_fbc3 | Reference coefficient. Refer to the corresponding first result at the target read voltage level by level to calculate the correction value. In an example, the reference coefficient is:<br>{DMY, 1, 1, 1, 6, 5, 5, 4} |
| rFactor | Correction coefficient. In an example, the correction coefficient is:<br>{DMY, 80, 80, 80, 80, 40, 80, 40} |
| div_para | Segmentation parameter. In an example, the segmentation parameter is:<br>8 |

In some examples, the first preset condition is that a corresponding first result at the target read voltage after one adjustment is less than the first threshold; and the peripheral circuit is configured to: determine the target read voltage after one adjustment as the target valley voltage according to the relationship between the corresponding first result at the target read voltage after one adjustment and the first threshold meeting the first preset condition.

Figure 10C:
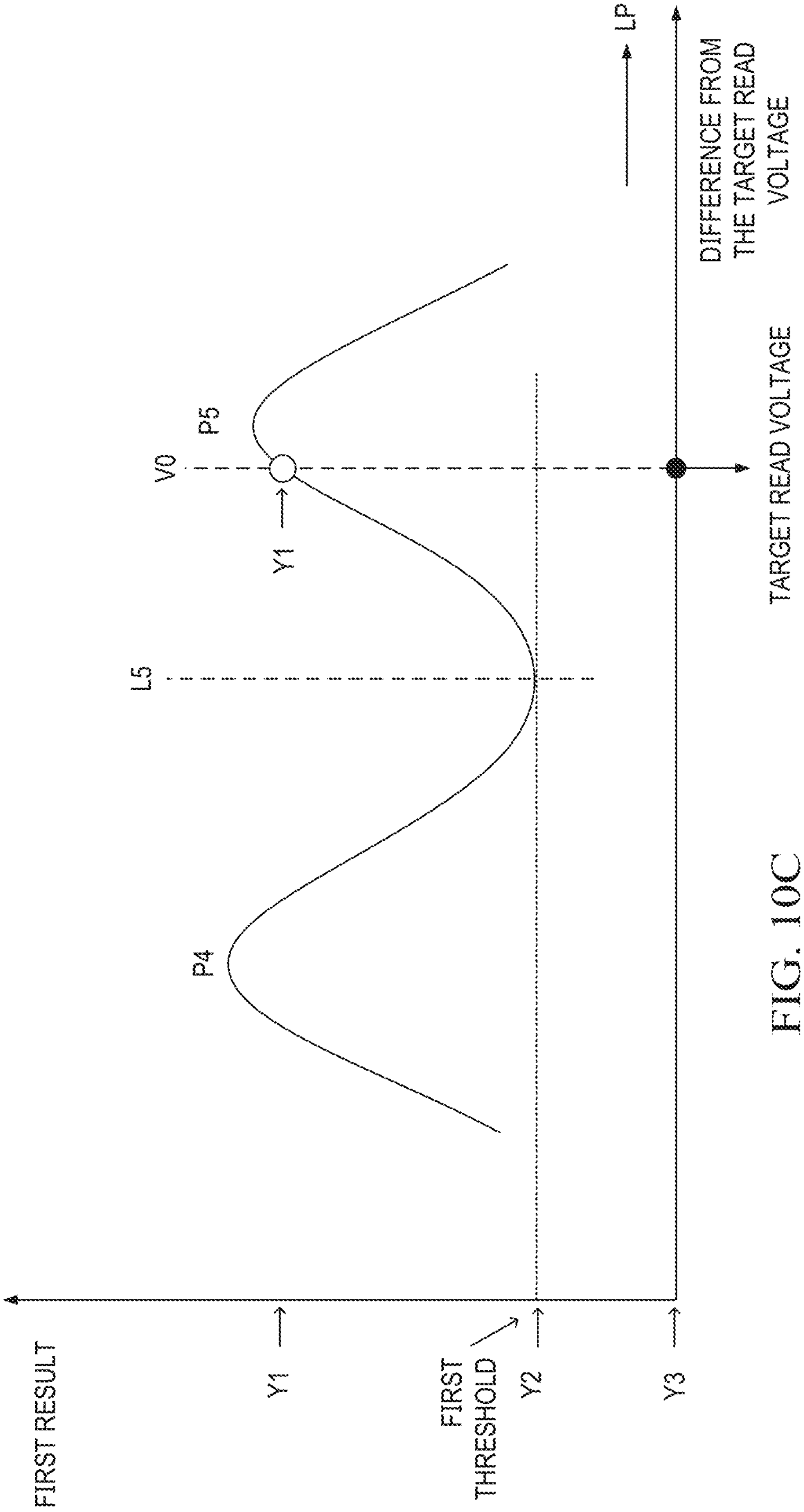
FIG. 10C is a schematic diagram 3 of a method for confirming a fifth-level read voltage corresponding to a lower page shown in FIG. 9A provided by an example of the present application.

In an example, as shown in FIG. 10C, the peripheral circuit is configured to: obtain a corresponding first result Y1 of a lower page of at least one codeword at a fifth-level target read voltage (V0 shown in FIG. 10C); obtain the first threshold according to the corresponding first result Y1 at the fifth-level target read voltage; make at least one adjustment to the target read voltage, and after each adjustment, obtain a corresponding first result at the adjusted target read voltage; and determine, according to a corresponding first result Y2 at the target read voltage after one adjustment being less than or equal to the first threshold, that the target read voltage after one adjustment is a fifth-level read voltage L5, wherein the fifth-level read voltage L5 is taken as a read voltage at which a read operation is performed on the at least one codeword.

The first-level read voltage L1 is determined in a manner similar to that of determining the fifth-level read voltage L5. The fifth-level read voltage L5 and the first-level read voltage L1 may be used for reading data of a lower page of the at least one codeword. In a manner similar to that of determining the fifth-level read voltage L5, the sixth-level read voltage L6, the fourth-level read voltage L4, and the second-level read voltage L2 are determined for reading data of a middle page of the at least one codeword, and the seventh-level read voltage L7 and the third-level read voltage L3 are determined for reading data of an upper page of the at least one codeword.

In some examples, the peripheral circuit is configured to: according to the corresponding first result at the target read voltage being greater than or equal to the first threshold, obtain, with the corresponding first result at the target read voltage, a target adjustment value for adjusting the target read voltage; obtain a corresponding first result at the adjusted target read voltage with the target adjustment value; according to the corresponding first result at the adjusted target read voltage with the target adjustment value being less than the first threshold, determine the adjusted target read voltage with the target adjustment value as the target valley voltage; and according to the corresponding first result at the adjusted target read voltage with the target adjustment value being greater than or equal to the first threshold, make multiple adjustments to the target read voltage, and after each adjustment, obtain the corresponding first result at the adjusted target read voltage, until the corresponding first result at the adjusted target read voltage is less than the first threshold or the corresponding first result at the target read voltage after multiple adjustments meet the second preset condition.

Here and below, the target adjustment value/the first step size value/the second step size value is positive (for example, 50 mV), representing adjusting the target read voltage in a first direction (rightward direction), for example, increasing the target read voltage by a voltage value of 50 mV. The target adjustment value/the first step size value/the second step size value here is negative (for example, −50 mV), representing adjusting the target read voltage in a second direction (leftward direction), for example, subtracting a voltage value of 50 mV from the target read voltage.

Figure 10D:
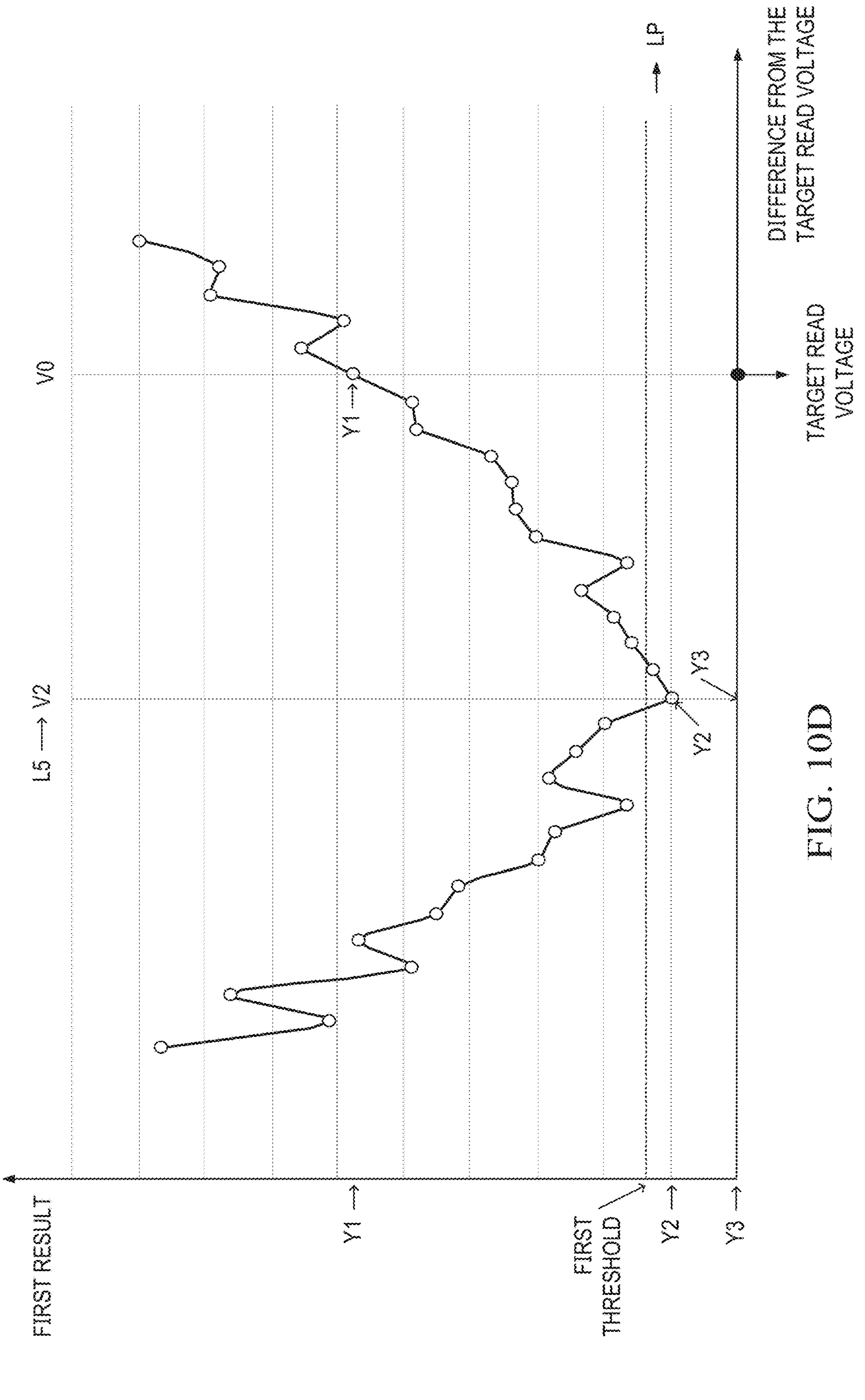
FIG. 10D is a schematic diagram 4 of a method for confirming a fifth-level read voltage corresponding to a lower page shown in FIG. 9A provided by an example of the present application.

In some examples, as shown in FIG. 10D, the peripheral circuit is configured to: according to the corresponding first result Y1 at the fifth-level target read voltage (V0 shown in FIG. 10D) being greater than or equal to the first threshold, make one adjustment to the fifth-level target read voltage with the target adjustment value, obtain the corresponding first result Y2 at the adjusted target read voltage (V2 shown in FIG. 10D), and according to the corresponding first result at the adjusted target read voltage Y2 with the target adjustment value being less than the first threshold, determine the adjusted target read voltage with the target adjustment value as a fifth-level target valley voltage (L5 shown in FIG. 10D).

In some examples, an absolute value of the target adjustment value is positively correlated to the corresponding first result at the target read voltage. the larger the corresponding first result at the target read voltage is, the larger the target adjustment value is. In an example, when the corresponding first result at the fifth-level target read voltage is 500, the target adjustment value may be 200 mV; when the corresponding first result at the fifth-level target read voltage is 300, the target adjustment value may be 120 mV; and when the corresponding first result at the fifth-level target read voltage is 100, the target adjustment value may be 50 mV.

In some examples, as shown in FIG. 10D, the peripheral circuit is configured to: according to the corresponding first result Y1 at the fifth-level target read voltage being greater than or equal to the first threshold, make multiple adjustments to the fifth-level target read voltage, and after each adjustment, obtain the corresponding first result at the adjusted target read voltage, until the corresponding first result at the adjusted target read voltage is less than the first threshold or the corresponding first result at the target read voltage after multiple adjustments meet the second preset condition.

In some examples, multiple adjustments comprise the first adjustment made with the first step size value and the second adjustment made with the second step size value. The first step size value is greater than the second step size value. The obtaining the adjusted target read voltage with the target adjustment value comprises: making at least one first adjustment with the first step size value to obtain the adjusted target read voltage, and subsequently, making at least one second adjustment with the second step size value to obtain the adjusted target read voltage. In an example, a range of the first step size value is set to 50 mV to 150 mV, and the first step size value may be 50 mV, 60 mV, 70 mV, 80 mV, 100 mV, 120 mV or 150 mV, or, a range of the first step size value is set to −50 mV to −150 mV, and the first step size value may be −50 mV, −60 mV, −70 mV, −80 mV, −100 mV, −120 mV or −150 mV. A range of the second step size value is set to 20 mV to 50 mV, and the second step size value may be 20 mV, 30 mV, 40 mV or 50 mV, or, a range of the second step size value range is set to −20 mV to −50 mV, and the second step size value may be −20 mV, −30 mV, −40 mV or −50 mV.

In some examples, the second preset condition is that taken the minimum first result among multiple corresponding first results at the target read voltages after multiple adjustments as a reference value, the number of first results from remaining first results which differ from the reference value with a difference being less than a second threshold is greater than a preset number; and the peripheral circuit is configured to: according to the corresponding first result at the target read voltage after multiple adjustments meeting the second preset condition, take a target read voltage corresponding to the minimum first result among the multiple first results as the target valley voltage.

Figure 10E:
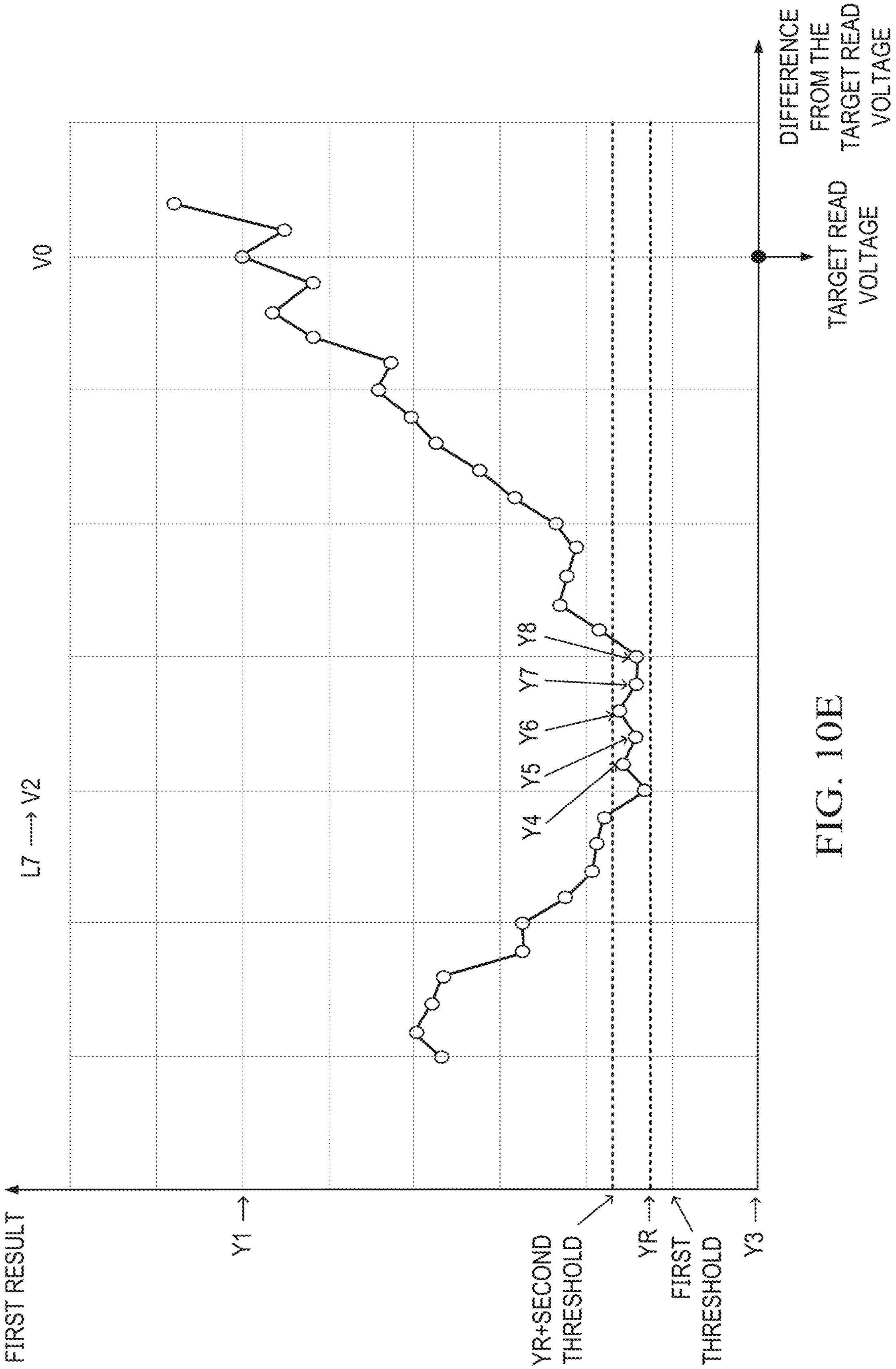
FIG. 10E is a schematic diagram 1 of a method for confirming a seventh-level read voltage corresponding to an upper page shown in FIG. 9C provided by an example of the present application.

In an example, as shown in FIG. 10E, the of 5 first results Y4, Y5, Y6, Y7, and Y8 which differ from the reference value Yr with a difference being less than the second threshold is greater than the preset number (for example, 3), the corresponding first result at the target read voltage after multiple adjustments meet the second preset condition, and a target read voltage (V2 shown in FIG. 10E) corresponding to the minimum first result (the reference value Yr) among the multiple first results (comprising the reference value Yr and the 5 first results Y4, Y5, Y6, Y7, and Y8) is taken as a seventh-level read voltage L7.

In some examples, the second threshold ranges from 2 to 25, and may be 5, 10, 15 or 20. In some examples, the preset number ranges from 1 to 5, and may be 1, 3 or 5.

In some examples, the peripheral circuit is configured to: in a process of making multiple adjustments to the target read voltage, make adjustments by employing different adjustment methods, and according to the adjusted target read voltages corresponding to more than a preset number of adjustment methods in the different adjustment methods being same and the corresponding first result at the same target read voltage being the minimum value among all first results, take the same target read voltage as the target valley voltage.

Figure 10F:
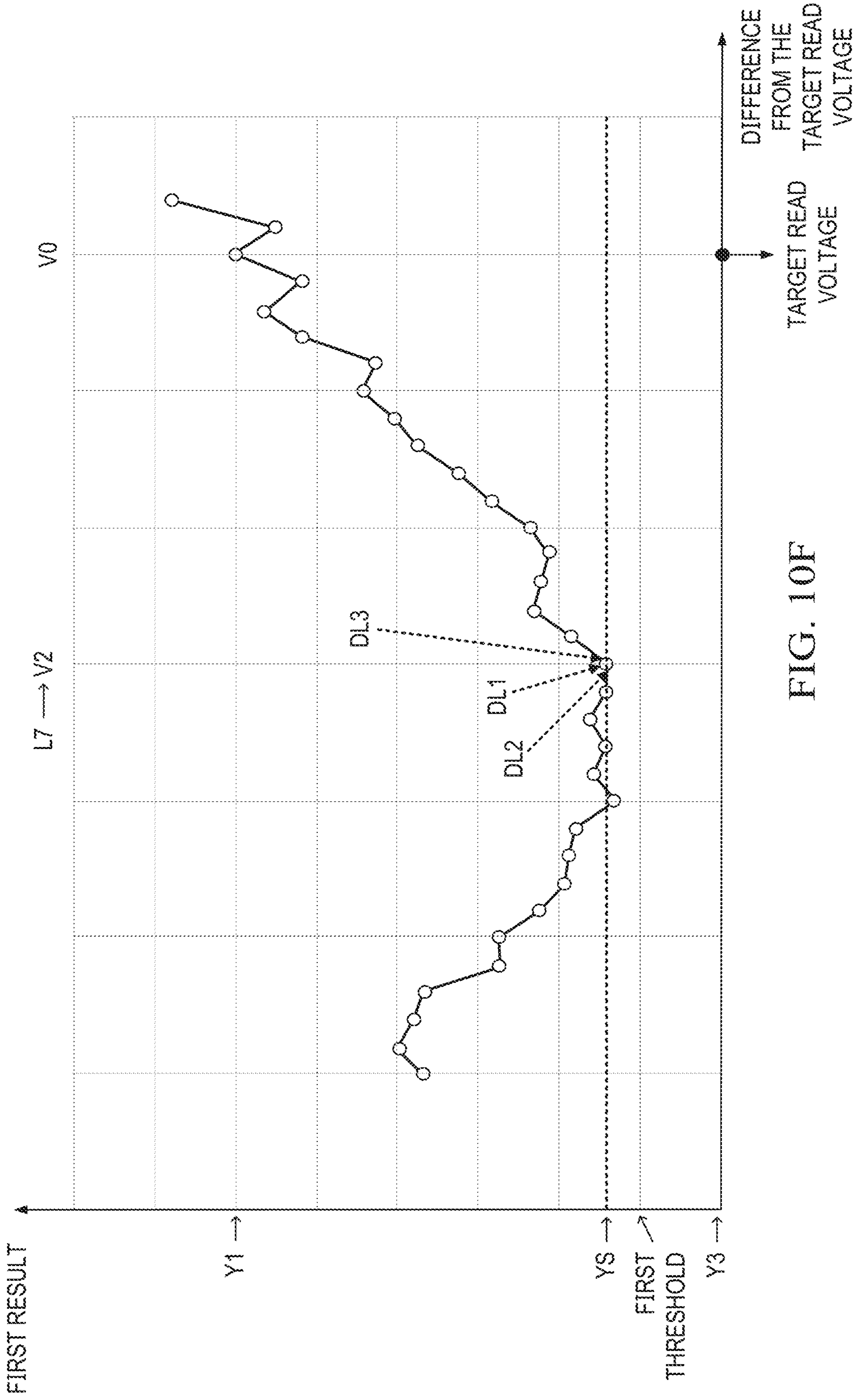
FIG. 10F is a schematic diagram 2 of a method for confirming a seventh-level read voltage corresponding to an upper page shown in FIG. 9C provided by an example of the present application.

In some examples, as shown in FIG. 10F, different adjustment methods comprise at least two following methods: making one adjustment to a seventh-level target read voltage with the target adjustment value (DL1 shown in FIG. 10F), making at least one first adjustment to a seventh-level target read voltage with the first step size value (DL2 shown in FIG. 10F), and making at least one second adjustment to a seventh-level target read voltage with the second step size value (DL3 shown in FIG. 10F).

In an example, as shown in FIG. 10F, one adjustment is made to the seventh-level target read voltage with the target adjustment value (DL1 shown in FIG. 10F), at least one first adjustment is made to the seventh-level target read voltage with the first step size value (DL2 shown in FIG. 10F), and at least one second adjustment is made to the seventh-level target read voltage with the second step size value (DL3 shown in FIG. 10F), and the corresponding first results at the target read voltages obtained after the adjustments are all directed to one same first result Ys. The corresponding adjusted target read voltage (V2 shown in FIG. 10F) is the seventh-level read voltage L7.

In some examples, the peripheral circuit is configured to: make multiple first adjustments to the target read voltage with a first step size, and obtain corresponding first results at target read voltages after the multiple first adjustments respectively; determine a value of knee point according to the obtained corresponding first results at the read voltages after the multiple first adjustments, wherein a target read voltage corresponding to the value of knee point is a knee-point voltage; make multiple second adjustments to the knee-point voltage with a second step size, and obtain the corresponding first results at the target read voltages after the multiple second adjustments respectively, wherein the second step size is less than the first step size; and determine the target valley voltage with the obtained corresponding first results at the target read voltages after the multiple second adjustments.

Figure 10G:
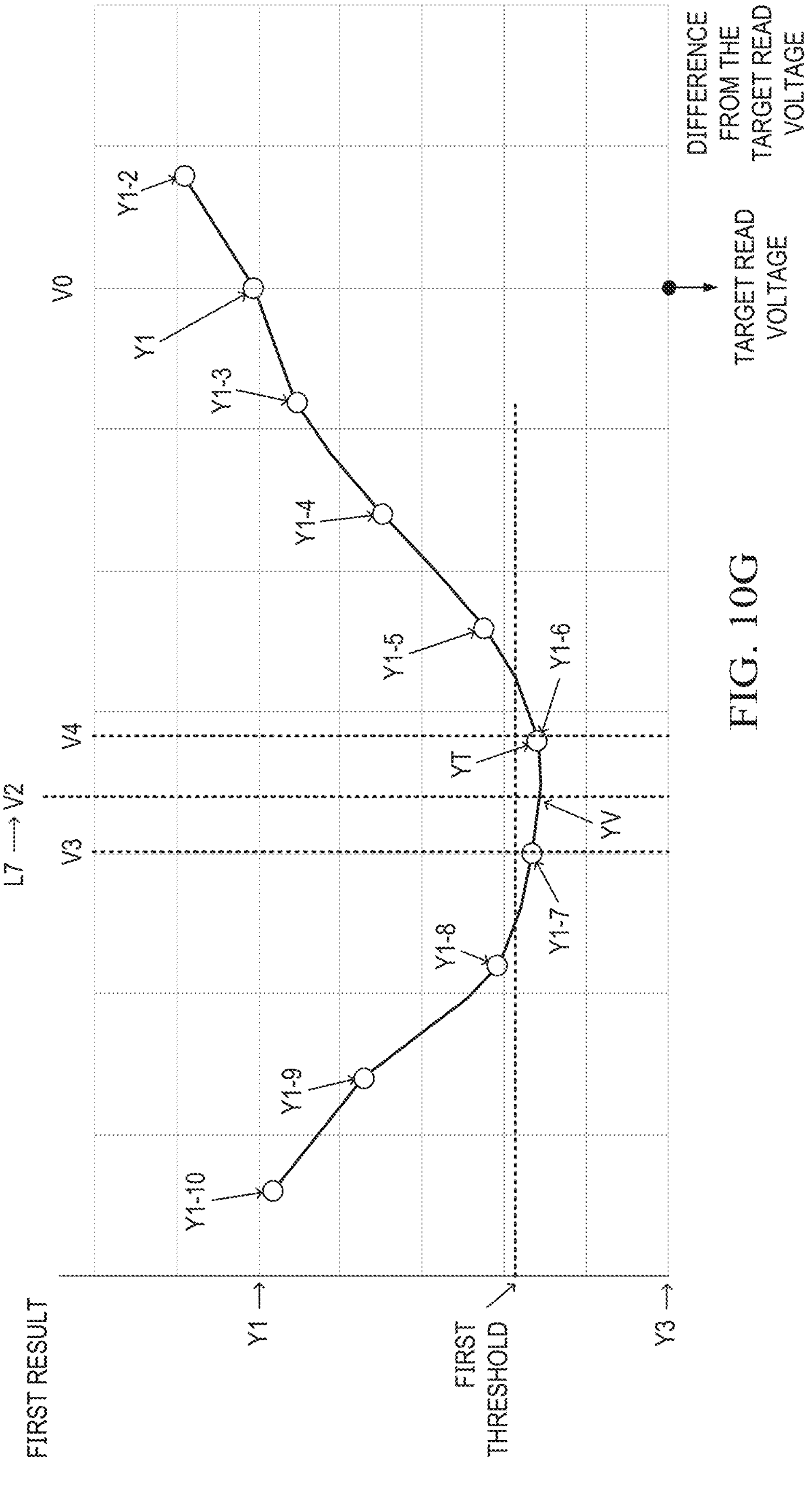
FIG. 10G is a schematic diagram 3 of a method for confirming a seventh-level read voltage corresponding to an upper page shown in FIG. 9C provided by an example of the present application.

In some examples, as shown in FIG. 10G, an example in which the seventh-level target read voltage is taken as the target read voltage is used, and the peripheral circuit is configured to obtain a knee-point voltage V4 through the following operations:

- after obtaining a corresponding first result Y1 at the target read voltage, taking the target read voltage as a reference, making a first adjustment to the target read voltage with the first step size value (positive value) to obtain a first result Y1-2, and making a second first adjustment to the target read voltage with the first step size value (negative value) to obtain a first result Y1-3;
- according to the first result Y1-2 being greater than the first result Y1 and the first result Y1-3 being less than the first result Y1, determining to make multiple adjustments to the target read voltage with the first step size value (negative value), to obtain first results (for example, first results Y1-4, Y1-5, Y1-6, and Y1-7, or first results Y1-4 to Y1-9, or first results Y1-4 to Y1-10) after multiple adjustments;
- according to at least one for upward trend, determining to stop making the first adjustment to the target read voltage, wherein one for upward trend may be understood as that a case that a first result Y1-(N+1) obtained by making an Nth first adjustment to the target read voltage with the first step size value (negative value) is less than a first result Y1-(N+2) obtained by making an (N+1)th first adjustment to the target read voltage with the first step size value (negative value) is determined as one for upward trend; for example, that the first result Y7 is greater than the first result Y1-6, that the first result Y1-8 is greater than the first result Y1-7, that the first result Y1-9 is greater than the first result Y1-8, or, that the first result Y1-10 is greater than the first result Y1-9 may be determined as one for upward trend; and
- determining the minimum value among the obtained corresponding first results at the read voltages after the multiple first adjustments as a value of knee point, wherein a target read voltage corresponding to the value of knee point is a knee-point voltage, wherein for example, the minimum value among the multiple first results is the first result Y1-6, the first result Y1-6 is taken as a value of knee point Yt, and a target read voltage corresponding to the value of knee point Yt is a knee-point voltage V1-4.

In some examples, the corresponding first results at the target read voltages after the multiple first adjustments comprise a first adjacent value and a second adjacent value that are adjacent to the value of knee point, and the peripheral circuit is configured to: according to a difference between the first adjacent value and the value of knee point being less than a difference between the second adjacent value and the value of knee point, narrow a range for the multiple second adjustments to be between a target read voltage corresponding to the first adjacent value and the knee-point voltage; and take an average of the read voltage corresponding to the first adjacent value and the knee-point voltage, and according to a corresponding first result at the average being less than the first threshold, take the average as the target valley voltage; and according to the corresponding first result at the average being greater than or equal to the first threshold, continue to make a second adjustment between the read voltage corresponding to the first adjacent value and the knee-point voltage, until a corresponding first result at the adjusted target read voltage is less than the first threshold.

In some examples, as shown in FIG. 10G, an example in which the seventh-level target read voltage is taken as the target read voltage is used, and the peripheral circuit is configured to: after obtaining the value of knee point Yt and the knee-point voltage V4, take the knee-point voltage V4 as a reference, make at least one second adjustment with the second step size value to obtain the adjusted target read voltage. For a detailed process of making at least one second adjustment with the second step size value, refer to a detailed process of making at least one first adjustment with the first step size value in the foregoing example for understanding, wherein the first step size value is greater than the second step size value, or, refer to the adjustment manner in any example shown in FIG. 10B to 10F. Details are not described herein again.

Here, the first step size value is greater than the second step size value. In an example, a range of the first step size value is set to 50 mV to 150 mV, and the first step size value may be 50 mV, 60 mV, 70 mV, 80 mV, 100 mV, 120 mV or 150 mV, or, a range of the first step size value is set to −50 mV to −150 mV, and the first step size value may be −50 mV, 60 mV, −70 mV, −80 mV, −100 mV, −120 mV or −150 mV. A range of the second step size value is set to 20 mV to 50 mV, and the second step size value may be 20 mV, 30 mV, 40 mV or 50 mV, or, a range of the second step size value range is set to −20 mV to −50 mV, and the second step size value may be −20 mV, −30 mV, −40 mV or −50 mV.

In some examples, as shown in FIG. 10G, an example in which the seventh-level target read voltage is taken as the target read voltage is used, and the peripheral circuit is configured to: according to the difference between the first adjacent value (the first result Y1-7) and the value of knee point Yt (the first result Y1-6) being less than a difference between the second adjacent value the second adjacent value (the first result Y1-5) and the value of knee point Yt, narrow a range for the multiple second adjustments to be between a target read voltage V3 corresponding to the first adjacent value (the first result Y1-7) and the knee-point voltage V4; and take an average of the read voltage V3 corresponding to the first adjacent value and the knee-point voltage V4, and according to a corresponding first result Yv at the average being less than the first threshold, take the average as a target valley voltage V2, and determine the target valley voltage V2 as the seventh-level read voltage L7.

In some examples, the peripheral circuit is configured to: obtain the predicted valley voltage according to the corresponding first result at the target read voltage and a second mapping function, wherein the second mapping is to represent a relationship between the corresponding first result at the target read voltage and the predicted valley voltage.

In some examples, the second mapping function is to represent and comprising a relationship between the predicted valley voltage and the first result for the first time. The predicted valley voltage is correlated to at least one of the level number at which the target read voltage is or a use scenario of the memory device.

In an example, in a data retaining scenario, as shown in FIG. 10B, when a corresponding first result Y1 (for example, 500) at a fifth-level target read voltage exceeds a threshold (for example, 400), it may be considered, according to a characteristic of the memory device, that a threshold voltage VT of a memory cell of the memory device is in a strong left deviation state. According to the corresponding first result Y1 at the fifth-level target read voltage, an adjustment may be made based on the second mapping function to obtain a fifth-level predicted valley voltage. Compared with the fifth-level target read voltage, the fifth-level predicted valley voltage is in a strong left deviation state.

In an example, in a read operation interference scenario, as shown in FIG. 10A, when a corresponding first result Y1 (for example, 400) at a fifth-level target read voltage exceeds a threshold (for example, 300), it may be considered, according to a characteristic of the memory device, that a threshold voltage VT of a memory cell of the memory device is in a strong left deviation state. According to the corresponding first result Y1 at the fifth-level target read voltage, an adjustment may be made based on the second mapping function to obtain a fifth-level predicted valley voltage. Compared with the fifth-level target read voltage, the fifth-level predicted valley voltage is in a strong left deviation state.

In some examples, as shown in FIG. 10D, the peripheral circuit is configured to: according to the corresponding first result Y1 at the fifth-level target read voltage (V0 shown in FIG. 10D), obtain the predicted valley voltage, and obtain the corresponding first result Y2 at the predicted valley voltage (V2 shown in FIG. 10D), and according to the corresponding first result Y2 at the predicted valley voltage being less than the first threshold, determine the predicted valley voltage as the fifth-level target valley voltage (L5 shown in FIG. 10D).

In some examples, the memory cell comprises multiple memory bits, and the multiple memory bits correspond to multiple pages respectively; and at least part of pages correspond to multiple stages, the multiple stages comprise a first stage and a second stage, and a read voltage in the second stage is less than a read voltage in the first stage; and the peripheral circuit is configured to: obtain at least one of a predicted valley voltage in the second stage from the multiple stages or a target valley voltage in other first stage corresponding to a lower read voltage with the determined target valley voltage according to the stage number corresponding to the determined target valley voltage belonging to the first stage.

In some examples, at least part of pages correspond to read voltages in multiple stages. The read voltages in multiple stages comprise the read voltage in a first stage and the read voltage in a second stage. The read voltage in a second stage is less than the read voltage in a first stage. In an example, the read voltage in a first stage may be understood as the highest read voltage in the read voltages in multiple stages of each page, and the read voltage in a second stage may be understood as another read voltage less than the highest read voltage in the read voltages in multiple stages of each page.

It is to be noted that, the first stage and the second stage are used for distinguishing between a high-level read voltage and a low-level read voltage in read voltages in multiple stages corresponding to at least part of pages. The low-level read voltage is less than the high-level read voltage. For a memory cell comprising multiple memory bits, one page corresponding to one memory bit may comprise one stage or multiple stages. One stage may comprise one level or multiple levels.

In an example, with reference to FIG. 8A, the memory device comprises a lower page and an upper page. The lower page corresponds to multiple stages. The multiple stages of the lower page comprise a first level and a third level. The first-level read voltage L1 is less than the third-level read voltage L3. Here, the third-level read voltage L3 corresponds to a read voltage in a first stage of the lower page (a high-level read voltage of the lower page), and the first-level read voltage L1 corresponds to a read voltage in a second stage of the lower page (a low-level read voltage of the lower page).

In an example, with reference to FIG. 8B, the memory device comprises a lower page, a middle page, and an upper page. Each page corresponds to multiple stages. Multiple stages of the lower page comprise a first level and a fifth level, and a first-level read voltage L1 is less than a fifth-level read voltage L5. Multiple stages of the middle page comprise a second level, a fourth level, and a sixth level, and a second-level read voltage L2 and a fourth-level read voltage L4 are both less than a sixth-level read voltage L6. Multiple stages of the upper page comprise a third level and a seventh level, and a third-level read voltage L3 is less than a seventh-level read voltage L7. Here, the fifth-level read voltage L5, the sixth-level read voltage L6, and the seventh-level read voltage L7 correspond to read voltages in a first stages of the lower page, the middle page, and the upper page respectively. The first-level read voltage L1, the second-level read voltage L2 and the fourth-level read voltage L4, and the third-level read voltage L3 correspond to read voltages in a second stage of the lower page, the middle page, and the upper page respectively.

In an example, with reference to FIG. 8C, the memory device comprise a lower page, a middle page, an upper page, and an extra page. Each page corresponds to multiple stages. Multiple stages of the lower page comprise a second level, an eighth level, and a fourteenth level, and a second-level read voltage L2 and an eighth-level read voltage L8 are both less than a fourteenth-level read voltage L14. Multiple stages of the middle page comprise a third level, a seventh level, a ninth level, and a thirteenth level, and a third-level read voltage L3, a seventh-level read voltage L7, and a ninth-level read voltage L9 are all less than a thirteenth-level read voltage L13. Multiple stages of the upper page comprise a fifth level, a tenth level, a twelfth level and a fifteenth level, and a fifth-level read voltage L5, a tenth-level read voltage L10, and a twelfth-level read voltage L12 are less than a fifteenth-level read voltage L15. Multiple stages of the extra page comprise a first level, a fourth level, a sixth level, and an eleventh level, and a first-level read voltage L1, a fourth-level read voltage L4 and a sixth-level read voltage L6 are less than the eleventh-level read voltage L11. Here, the fourteenth-level read voltage L14, the thirteenth-level read voltage L13, the fifteenth-level read voltage L15, and the eleventh-level read voltage L11 correspond to read voltage in a first stages of the lower page, the middle page, the upper page, and the extra page respectively. The second-level read voltage L2 and the eighth-level read voltage L8 correspond to a read voltage in a second stage of the lower page. The third-level read voltage L3, the seventh-level read voltage L7, and the ninth-level read voltage L9 correspond to a read voltage in a second stage of the middle page. The fifth-level read voltage L5, the tenth-level read voltage L10, and the twelfth-level read voltage L12 correspond to a read voltage in a second stage of the upper page. The first-level read voltage L1, the fourth-level read voltage L4, and the sixth-level read voltage L6 correspond to a read voltage in a second stage of the extra page.

In some implementations, when a first target stage is the seventh-level read voltage L7, predicted valley voltages in all remaining first stages and predicted valley voltage in a second stage may be obtained according to a predicted valley voltage of the seventh-level read voltage L7, that is, predicted valley voltages of the first-level read voltage L1, the second-level read voltage L2, the fourth-level read voltage L4, the fifth-level read voltage L5, and the sixth-level read voltage L6 may be directly obtained according to the predicted valley voltage of the seventh-level read voltage L7.

In some examples, with reference to FIG. 8B, the peripheral circuit is configured to: obtain the predicted valley voltage of the first target stage (the seventh-level read voltage L7); and obtain at least one of a predicted valley voltage (the fifth-level read voltage L5, the sixth-level read voltage L6 or the first-level read voltage L1, the second-level read voltage L2 and the fourth-level read voltage L4, and the third-level read voltage L3) of a second target stage according to the predicted valley voltage of the first target stage (the seventh-level read voltage L7).

In some examples, as shown in FIG. 8B, the peripheral circuit is configured to: obtain the predicted valley voltage of the second target stage (the sixth-level read voltage L6) according to the predicted valley voltage of the first target stage (the seventh-level read voltage L7) and the second mapping function, wherein the second mapping function is to represent a relationship between the target valley voltage of the first target stage and the predicted valley voltage of the second target stage.

In another example, a predicted valley voltage of the sixth-level read voltage L6 may be obtained according to the seventh-level read voltage L7, a target valley voltage of the sixth-level read voltage L6 may be obtained according to the predicted valley voltage of the sixth-level read voltage L6, then a predicted valley voltage of the fifth-level read voltage L5 may be obtained according to the target valley voltage of the sixth-level read voltage L6, and so on, to sequentially obtain target valley voltages of the fifth-level read voltage L5, the fourth-level read voltage L4, the third-level read voltage L3, the second-level read voltage L2, and the first-level read voltage L1 respectively.

In some examples, the peripheral circuit is configured to: read storage data of the at least one codeword at the first read voltage, to obtain a second result; read storage data of the at least one codeword at the second read voltage, to obtain a third result; perform a logical operation on the second result and the third result, to obtain a fourth result; and count the number of bits in the fourth result which represent flip of bits in the third result relative to the second result, to obtain the first result.

Figure 9A:
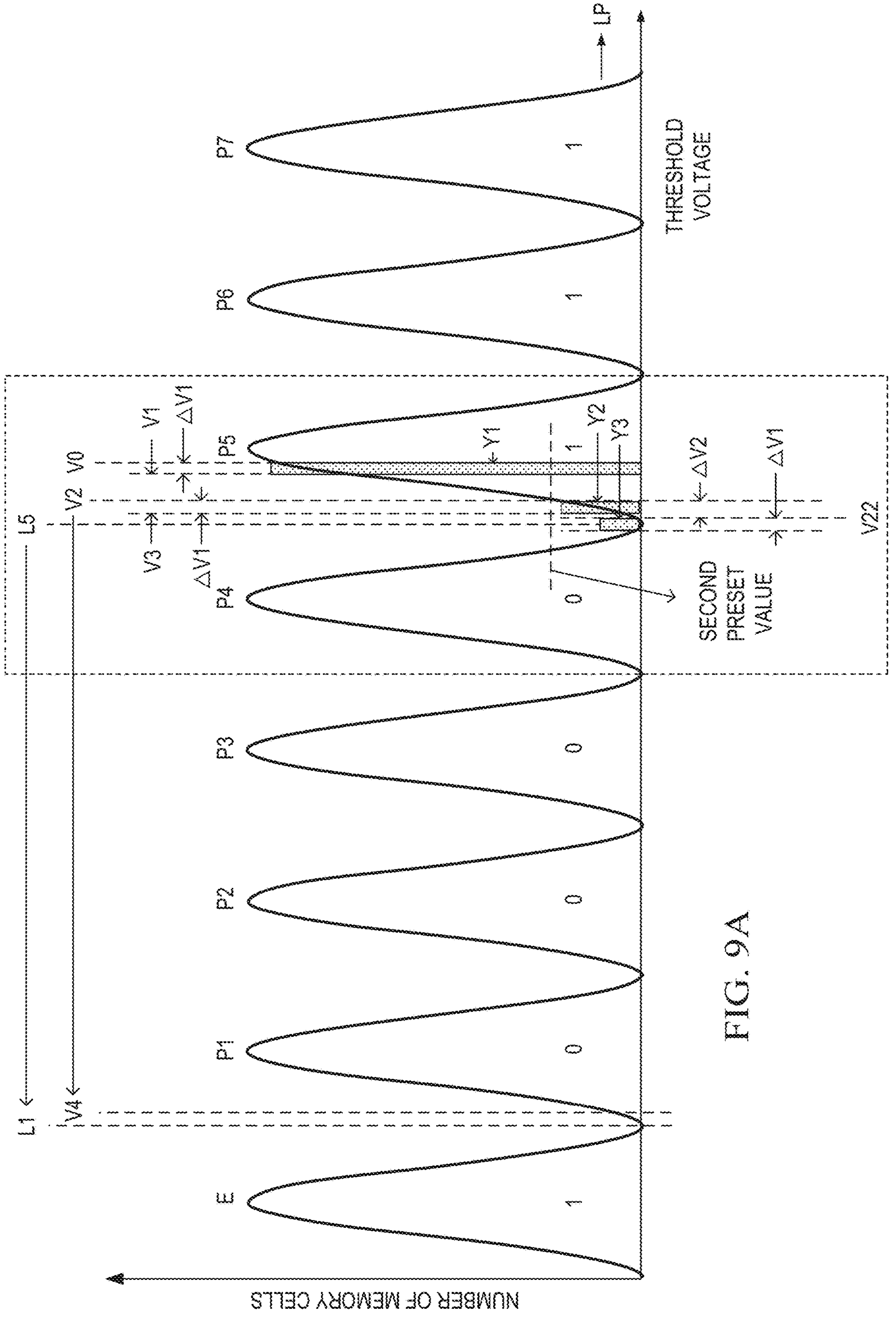
FIG. 9A is a schematic diagram of a method for confirming a predicted valley voltage/target valley voltage in a first stage and a second stage corresponding to a lower page shown in FIG. 8B provided by an example of the present application.
Figure 9B:
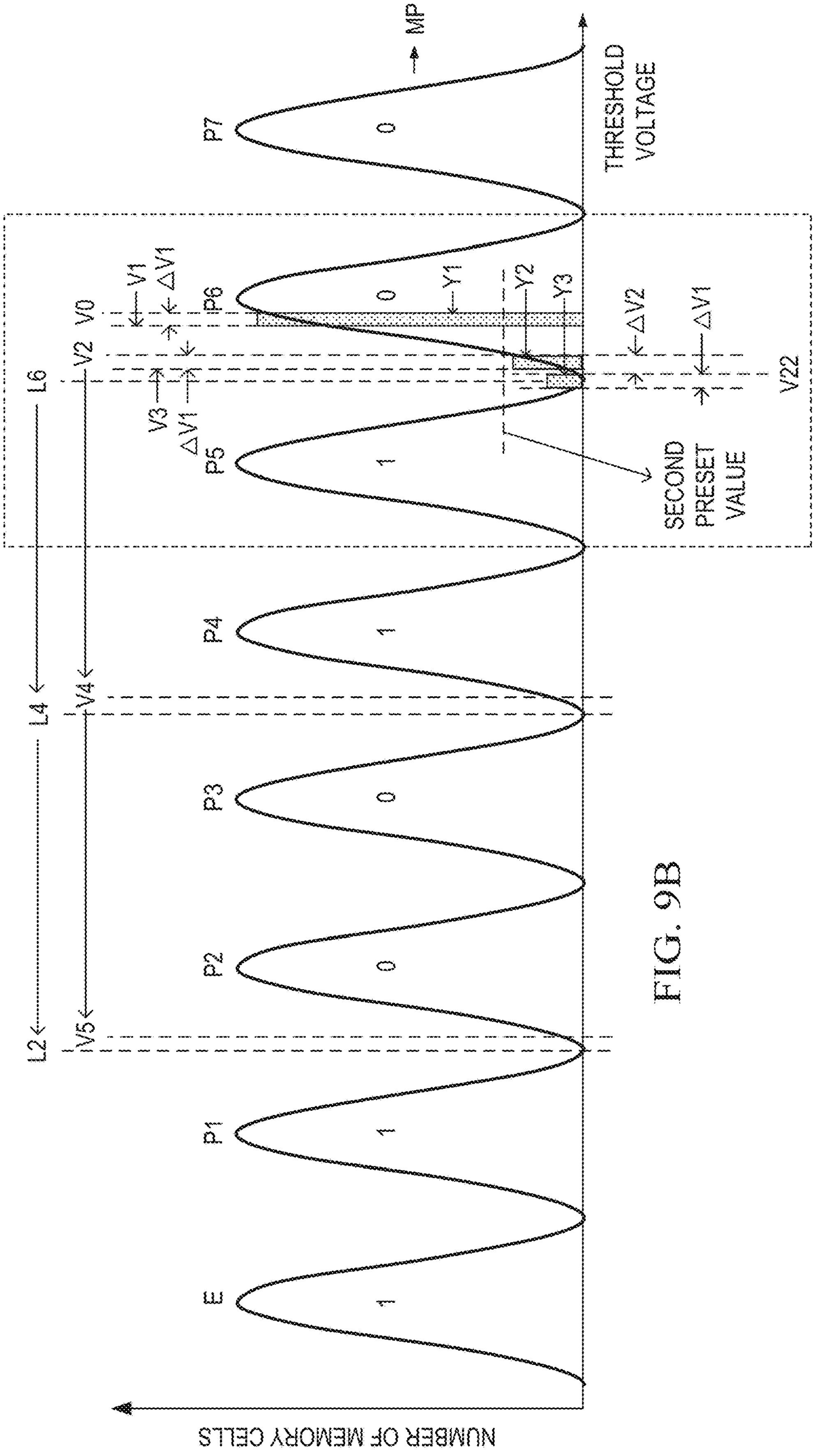
FIG. 9B is a schematic diagram of a method for confirming a predicted valley voltage/target valley voltage in a first stage and a second stage corresponding to a middle page shown in FIG. 8B provided by an example of the present application.
Figure 9C:
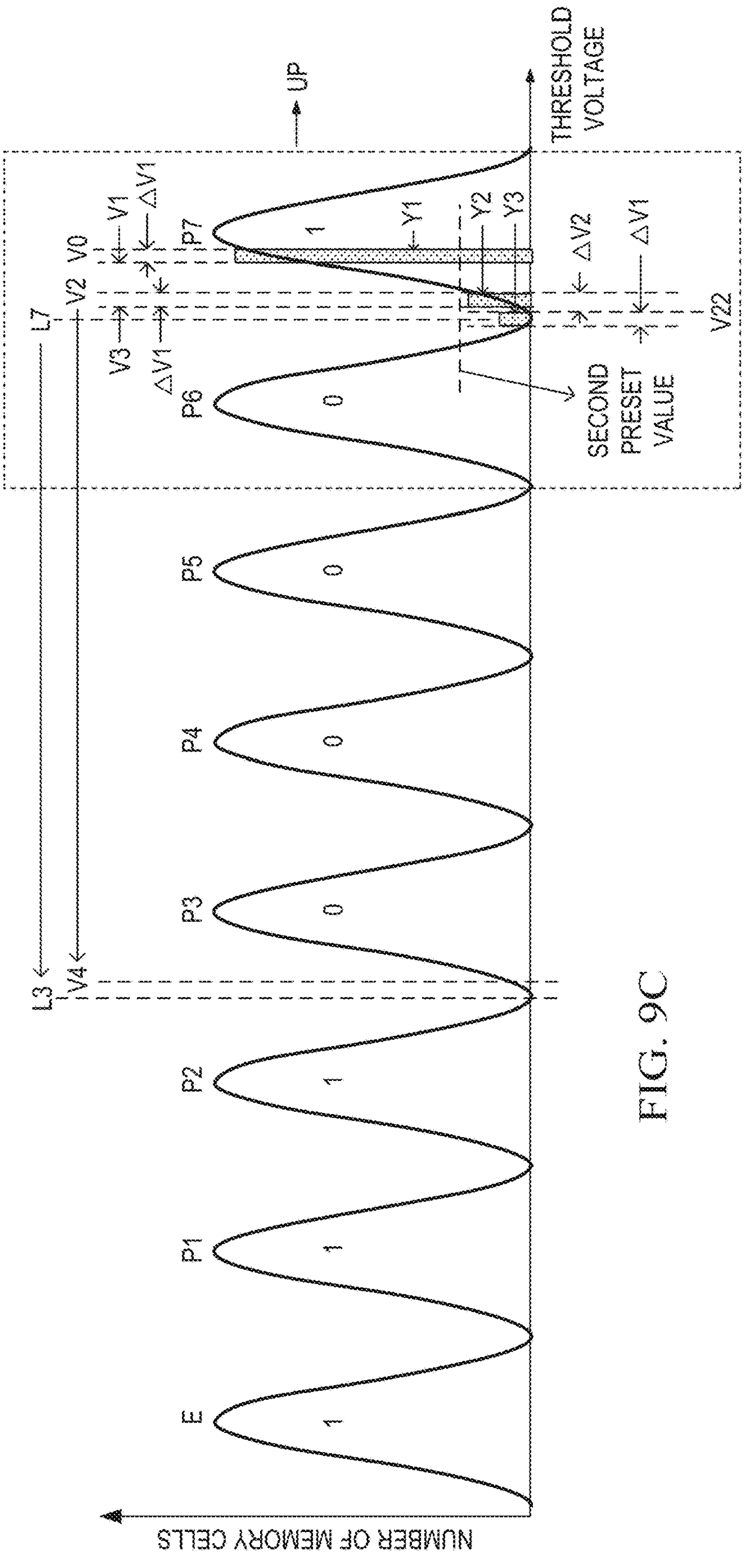
FIG. 9C is a schematic diagram of a method for confirming a predicted valley voltage/target valley voltage in a first stage and a second stage corresponding to a upper page shown in FIG. 8B provided by an example of the present application.
Figure 9D:
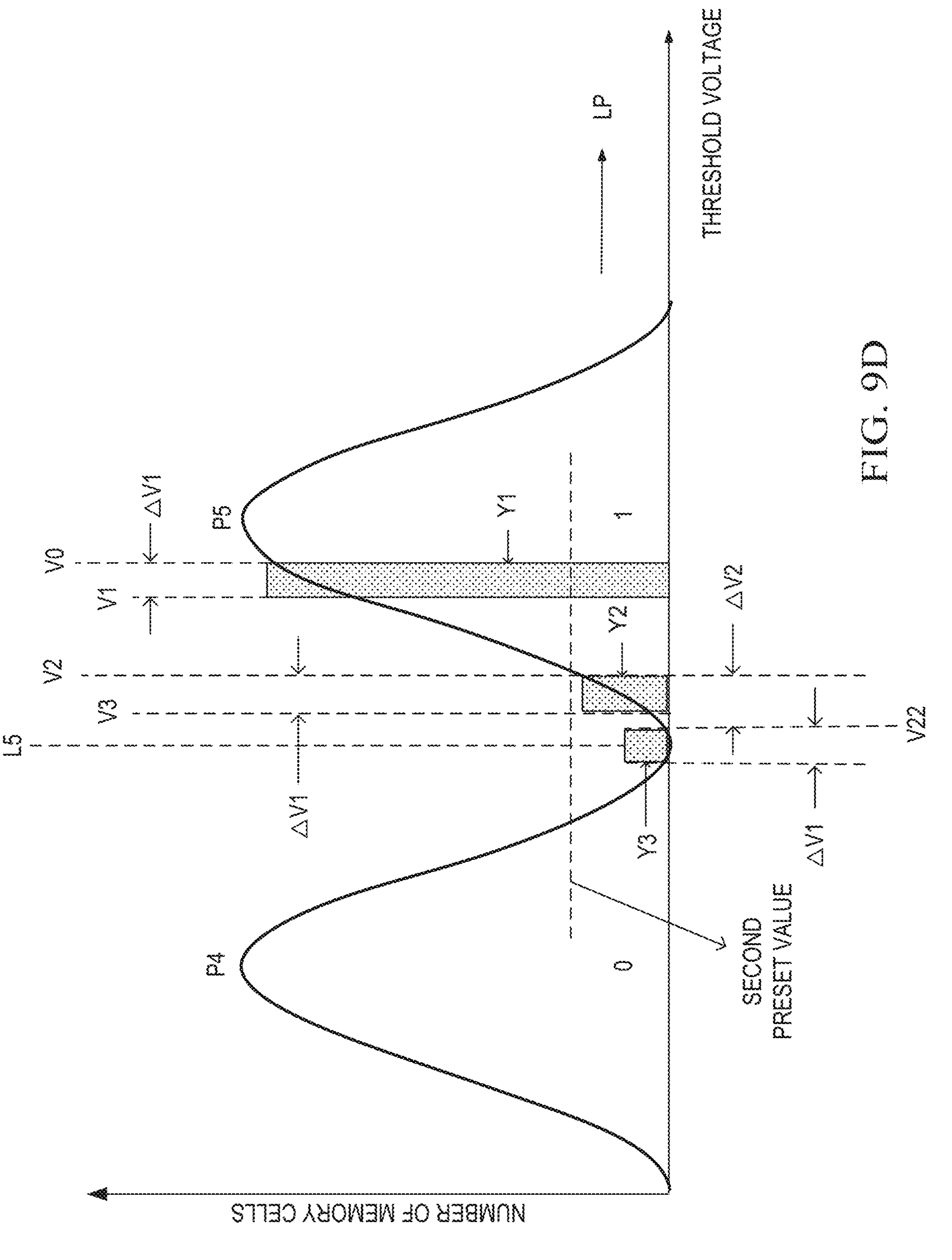
FIG. 9D is an enlarged schematic diagram of a rectangular dash box region in FIG. 9A.
Figure 9E:
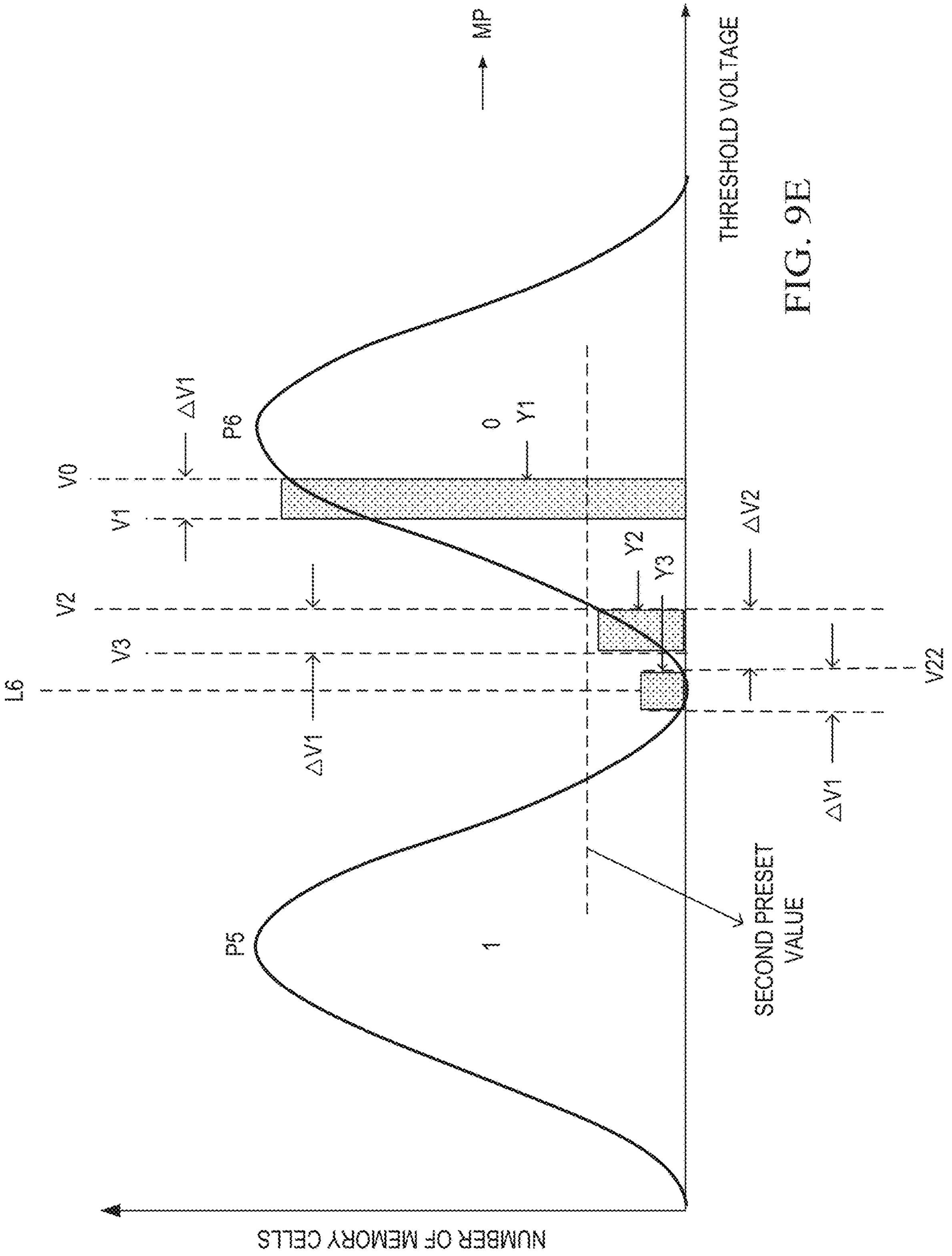
FIG. 9E is an enlarged schematic diagram of a rectangular dash box region in FIG. 9B.
Figure 9F:
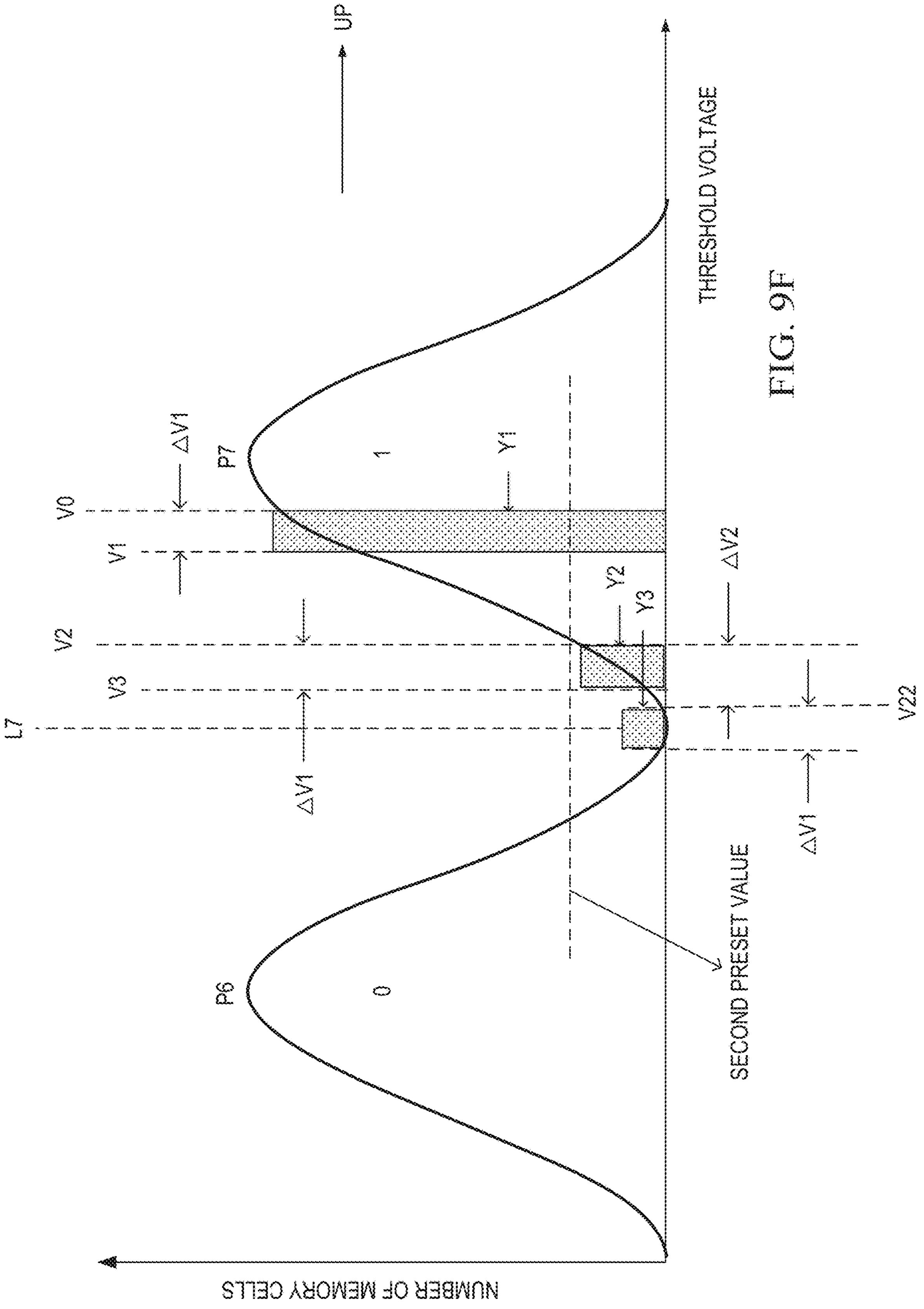
FIG. 9F is an enlarged schematic diagram of a rectangular dash box region in FIG. 9C.

In an example, as shown in FIG. 9D, data stored in a lower page of a memory cell in at least one codeword is read at the first read voltage (V0 shown in FIG. 9D). A memory cell with a threshold voltage less than the first read voltage is labeled as a bit 1, and a memory cell with a threshold voltage greater than the first read voltage is labeled as a bit 0, to obtain the second result.

In an example, as shown in FIG. 9D, data stored in a lower page of a memory cell in at least one codeword is read at the second read voltage (V1 shown in FIG. 9D). A memory cell with a threshold voltage less than the second read voltage is labeled as a bit 1, and a memory cell with a threshold voltage greater than the second read voltage is labeled as a bit 0, to obtain the third result.

For example, an XOR operation is performed on the second result and the third result, to obtain the fourth result. It is to be noted that, the XOR operation is one of the basic logical operations. In the binary system, when two binary numbers at a same position are same, a result is "0", and when two binary numbers at a same position are different, a result is "1" (that is, 0 when binary numbers are same, and 1 when binary numbers are different).

In an example, a bit being 1 in the fourth result represents that different data are read from a memory cell in the at least one codeword at the first read voltage and at the second read voltage, and a bit being 0 in the fourth result represents that same data are read from a memory cell in the at least one codeword at the first read voltage and at the second read voltage. For example, a number of bits being 1 in the fourth result represents a number of bits in the at least one codeword that are flipped in two read results at the first read voltage and the second read voltage, and a number of bits being 0 in the fourth result represents a number of bits in the at least one codeword that are same in two read results at the first read voltage and the second read voltage. Because the single-level read mode is used, that is, the foregoing two read operations both read one bit of data stored in a lower page of a memory cell in at least one codeword, a number of bits being 1 in the fourth result represents a number of memory cells that have flipped in two read results of the at least one codeword at the first read voltage and the second read voltage, and the number of bits is denoted as a first result corresponding to the first read voltage, for example, a corresponding first result Y1 of the at least one codeword at the target read voltage in a first stage (V0 shown in FIG. 9D), a corresponding first result Y2 of the at least one codeword at the adjusted target read voltage in a first stage (V2 shown in FIG. 9D), and a first result Y3 corresponding to the at least one codeword at an adjusted target read voltage in a first stage (V22 shown in FIG. 9D).

In some examples, the peripheral circuit comprises: a first latch, a second latch, and a third latch; the first latch is configured to store the second result; the second latch is configured to store the third result; and the third latch is configured to store the fourth result.

In an example, storage data (that is, the second result) of the at least one codeword read at the first read voltage is stored in the first latch, storage data (that is, the third result) of the at least one codeword read at the second read voltage is stored in the second latch, and data (that is, the fourth result) obtained by performing the XOR operation on the second result and the third result is stored in the third latch.

In the first aspect, in the memory devices provided in the examples of the present application, a first result (a size of the first result may be several bytes) rather than at least one codeword (for example, a size of the codeword may be 4 KB) is transmitted, so that an amount of transmitted data is reduced. A first threshold is obtained according to a corresponding first result at a target read voltage. With the dynamic first threshold, the iterative rapidity of convergence of determining a target valley voltage is higher. A process of obtaining the first result converges inside the memory device, does not occupy, for example, a space of the memory controller, and has low dependency on, for example, the memory controller. A process of obtaining a predicted valley voltage/the target valley voltage according to the first result is completed in the memory device, so that a transmission time of an output port is reduced. The memory devices are applicable to a memory device of an MLC, a TLC type or a QLC type.

Figure 11:
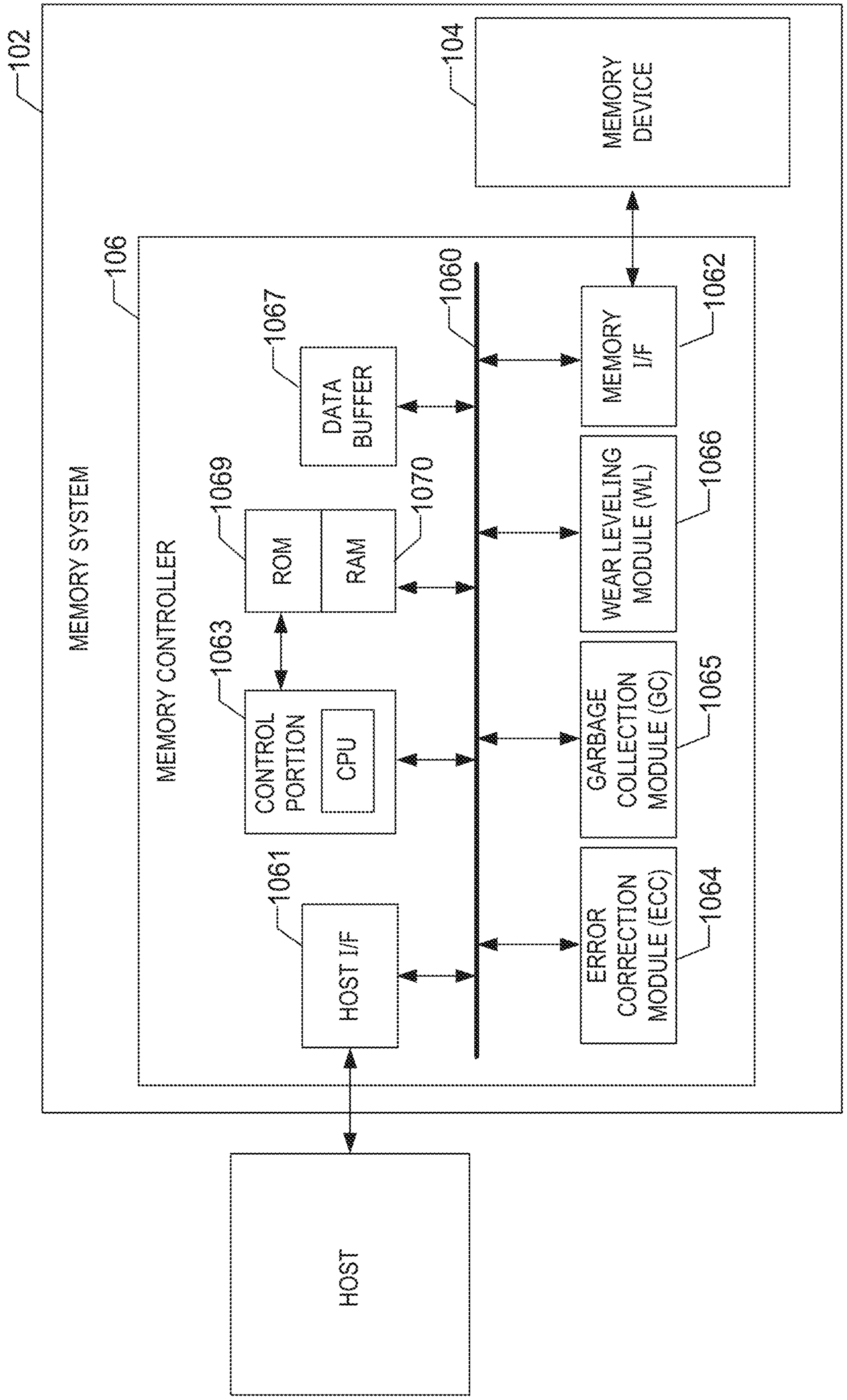
FIG. 11 is a schematic diagram of an example structure having a memory system provided by an example of the present application.
Figure 12:
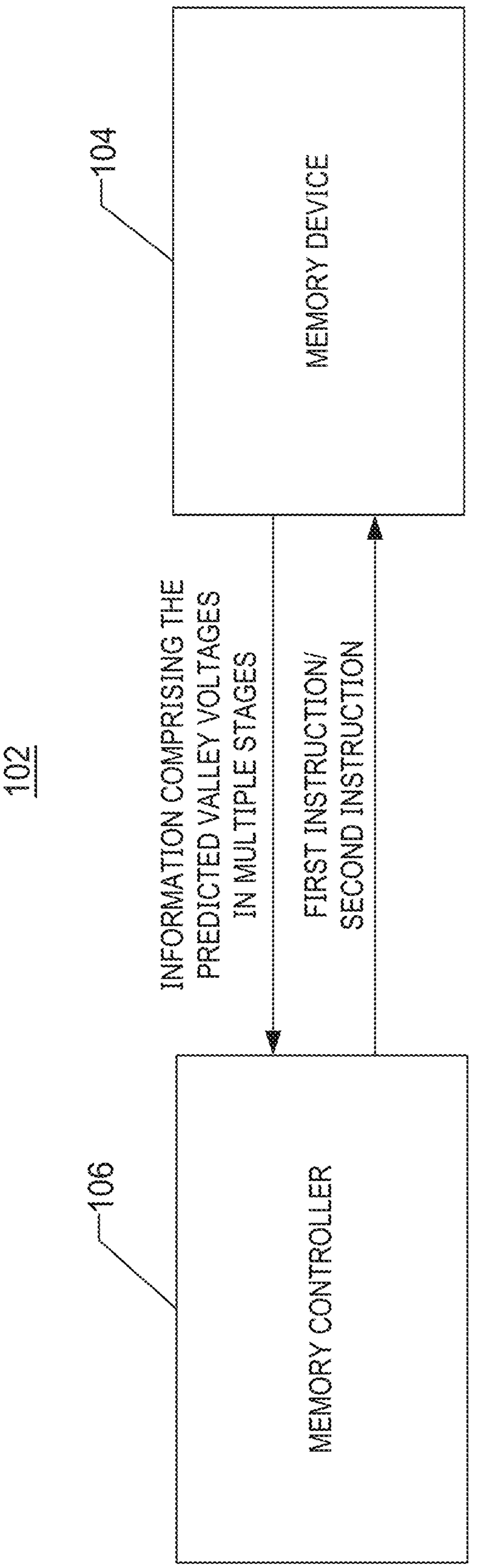
FIG. 12 is a block diagram of a memory system provided by an example of the present application.

In a second aspect, examples of the present application provide a memory system. As shown in FIG. 11 and FIG. 12, the memory system 102 comprises: one or more of the memory devices 104 provided in the first aspect; and a memory controller 106 coupled with the memory device 104 and controlling the memory device 104.

As shown in FIG. 11, in some examples, a memory system 102 is coupled to a host, and performs various feedbacks in response to instructions of the host. The memory system 102 may comprise a memory controller 106 and a memory device 104. The memory controller 106 is configured to control the memory device 104 to perform operations such as read, write, erase, etc. The memory controller 106 may also be coupled the memory device 104 in any appropriate manner.

The memory controller 106 may comprise a host interface (I/F) 1061, a memory interface (I/F) 1062, a control component 1063, a read-only memory (ROM) 1069, a random access memory (RAM) 1070, an error correction module 1064, a garbage collection module 1065, a wear leveling module 1066, a data buffer 1067, and a bus 1060. The host interface 1061 is a connection interface for a connection between a host 108 and the memory controller 106. The host interface 1061 allows the host and the memory controller to perform communication according to a specific protocol, send a read request and a write request, and perform other operations. The memory interface 1062 is a connection interface between the memory controller 106 and the memory device 104. The memory interface 1062 is configured to achieve data transmission between the memory controller 106 and the memory device 104. The control component 1063 is configured to generally control the memory system 102. The foregoing specific operations performed by the memory controller are mainly performed and completed by the control component 1063 here. In some examples, the control component 1063 is, for example, a central processing unit (CPU), a microcontroller unit (MCU), etc. The ROM 1069 usually comprises firmware or firmware program codes of the memory controller 106. These codes are used for initializing and operating various members of the memory controller, and the RAM 1070 is usually configured to buffer data. The error correction module 1064 may further comprise a encoding portion and a decoding portion. The encoding portion is configured to encode to-be-storage data to obtain check data, and the decoding portion is configured to decode the check data to detect and correct possible error data in a process of data transmission.

The garbage collection module 1065 is configured to: after a storage space of the memory device reaches a certain threshold, read out valid data in some memory blocks, perform rewrite, and then label these memory blocks, to obtain new spare memory blocks. A general implementation of garbage collection may comprise three operations: selecting a source memory block with a small amount of valid data; finding the valid data from the source memory block; and writing the valid data to a target memory block. In this case, all data in the source memory block becomes invalid data, and the source memory block is labeled, and may be taken as a new spare memory block. The wear leveling module 1066 is configured to level wear (a number of erase times) of each memory block in the memory system through data statistics and algorithms. A general implementation of wear leveling may comprise two operations: selecting a source memory block in which cold data is located; and reading valid data in the source memory block and writing the valid data in a memory block with a relatively large number of erase times. In this case, the valid data in the source memory block becomes invalid data, and the source memory block is labeled. The data buffer 1067 is configured to buffer data.

In some examples, the memory device 104 comprises an array of memory cells comprising multiple memory cells, wherein a preset number of memory cells form one codeword; and a peripheral circuit of the memory device 104 coupled with the array of memory cells and configured to perform the following operations: obtaining a first result corresponding to at least one codeword at a target read voltage, wherein the first result comprises the number of bits which represents the number of bits in the at least one codeword which are flipped in two read results at a first read voltage and a second read voltage, and a difference between the first read voltage and the second read voltage is less than a preset voltage; obtaining a first threshold according to the corresponding first result at the target read voltage, wherein the first threshold is to represent a corresponding first result at a maximum value in an effective range of predicted valley voltages; making at least one adjustment to the target read voltage, and after each adjustment, obtaining a corresponding first result at the adjusted target read voltage; and determining a target valley voltage according to a relationship between a corresponding first result at a target read voltage after one adjustment and the first threshold meeting a first preset condition or according to a corresponding first result at the target read voltage after multiple adjustments meeting a second preset condition, wherein the target valley voltage is taken as a read voltage at which a read operation is performed on the at least one codeword. In some examples, the memory controller 106 is configured to: control the memory device 104 to perform a first read operation on the at least one codeword.

In a second aspect, in the memory system provided in the examples of the present application, a first result (a size of the first result may be several bytes) rather than at least one codeword (for example, a size of the codeword may be 4 KB) is transmitted, so that an amount of data transmitted between the memory device and a memory controller is reduced. A first threshold is obtained according to a corresponding first result at a target read voltage. With the dynamic first threshold, the iterative rapidity of convergence of determining a target valley voltage is higher. A process of obtaining the first result converges inside the memory device, does not occupy a space of the memory controller, and has low dependency on the memory controller. A process of obtaining a predicted valley voltage/the target valley voltage according to the first result is completed in the memory device. At least one of a transmission time at an input/output port of the memory device or a time of an error correction decoding operation of the memory controller is reduced, so that an iterative time of an error correction decoding algorithm of the memory controller is saved, and a speed of error correction decoding is higher. The methods are applicable to a memory system of an MLC, a TLC type or a QLC type.

In a third aspect, examples of the present application provide a memory controller. The memory controller comprises a control component and is configured to: obtain a first result corresponding to at least one codeword at a target read voltage, wherein the at least one codeword is formed by a preset number of memory cells in an array of memory cells of at least one memory device coupled with the memory controller, wherein the first result comprises the number of bits which represents the number of bits in the at least one codeword which are flipped in two read results at a first read voltage and a second read voltage, and a difference between the first read voltage and the second read voltage is less than a preset voltage; obtain a first threshold according to the corresponding first result at the target read voltage, wherein the first threshold is to represent a corresponding first result at a maximum value in an effective range of predicted valley voltages; make at least one adjustment to the target read voltage, and after each adjustment, obtain a first result corresponding to the at least one codeword at the adjusted target read voltage; and determine a target valley voltage according to a relationship between a corresponding first result at a target read voltage after one adjustment and the first threshold meeting a first preset condition or according to a corresponding first result at the target read voltage after multiple adjustments meeting a second preset condition, wherein the target valley voltage is taken as a read voltage at which a read operation is performed on the at least one codeword.

In some examples, the control component is configured to: obtain the first threshold according to the corresponding first result at the target read voltage and a first mapping function, wherein the first mapping function is to represent a relationship between the corresponding first result at the maximum value in the effective range of predicted valley voltages and the corresponding first result at the target read voltage.

In some examples, the control component is configured to: obtain the corresponding first result at the maximum value in the effective range of predicted valley voltages according to an initial value of the corresponding first result at the maximum value in the effective range of predicted valley voltages, a correction value for the corresponding first result at the target read voltage, and a correction coefficient, wherein the initial value of the corresponding first result at the maximum value in the effective range of predicted valley voltages and the correction coefficient are both fixed values related to a stage in which a read voltage is, and the larger the corresponding first result at the target read voltage is, the larger the correction value is.

In some examples, the first preset condition is that a corresponding first result at the target read voltage after one adjustment is less than the first threshold; and the control component is configured to: determine the target read voltage after one adjustment as the target valley voltage according to the relationship between the corresponding first result at the target read voltage after one adjustment and the first threshold meeting the first preset condition.

In some examples, the control component is configured to: according to the corresponding first result at the target read voltage being greater than or equal to the first threshold, obtain, with the corresponding first result at the target read voltage, a target adjustment value for adjusting the target read voltage; obtain a corresponding first result at the adjusted target read voltage with the target adjustment value; according to the corresponding first result at the adjusted target read voltage with the target adjustment value being less than the first threshold, determine the adjusted target read voltage with the target adjustment value as the target valley voltage; and according to the corresponding first result at the adjusted target read voltage with the target adjustment value being greater than or equal to the first threshold, make multiple adjustments to the target read voltage, and after each adjustment, obtain the corresponding first result at the adjusted target read voltage, until the corresponding first result at the adjusted target read voltage is less than the first threshold or the corresponding first result at the target read voltage after multiple adjustments meet the second preset condition.

In some examples, the second preset condition is that taken the minimum first result among multiple corresponding first results at the target read voltages after multiple adjustments as a reference value, the number of first results from remaining first results which differ from the reference value with a difference being less than a second threshold is greater than a preset number; and the control component is configured to: according to the corresponding first result at the target read voltage after multiple adjustments meeting the second preset condition, take a target read voltage corresponding to the minimum first result among the multiple first results as the target valley voltage.

In some examples, the control component is configured to: in a process of making multiple adjustments to the target read voltage, make adjustments by employing different adjustment methods, and according to the adjusted target read voltages corresponding to more than a preset number of adjustment methods in the different adjustment methods being same and the corresponding first result at the same target read voltage being the minimum value among all first results, take the same target read voltage as the target valley voltage.

In some examples, the control component is configured to:

make multiple first adjustments to the target read voltage with a first step size, and obtain corresponding first results at target read voltages after the multiple first adjustments respectively; determine a value of knee point according to the obtained corresponding first results at the read voltages after the multiple first adjustments, wherein a target read voltage corresponding to the value of knee point is a knee-point voltage; make multiple second adjustments to the knee-point voltage with a second step size, and obtain the corresponding first results at the target read voltages after the multiple second adjustments respectively, wherein the second step size is less than the first step size; and determine the target valley voltage with the obtained corresponding first results at the target read voltages after the multiple second adjustments.

In some examples, the corresponding first results at the target read voltages after the multiple first adjustments comprise a first adjacent value and a second adjacent value that are adjacent to the value of knee point, and the control component is configured to: according to a difference between the first adjacent value and the value of knee point being less than a difference between the second adjacent value and the value of knee point, narrow a range for the multiple second adjustments to be between a target read voltage corresponding to the first adjacent value and the knee-point voltage; and take an average of the read voltage corresponding to the first adjacent value and the knee-point voltage, and according to a corresponding first result at the average being less than the first threshold, take the average as the target valley voltage; and according to the corresponding first result at the average being greater than or equal to the first threshold, continue to make a second adjustment between the read voltage corresponding to the first adjacent value and the knee-point voltage, until a corresponding first result at the adjusted target read voltage is less than the first threshold.

In some examples, the control component is configured to: obtain the predicted valley voltage according to the corresponding first result at the target read voltage and a second mapping function, wherein the second mapping is to represent a relationship between the corresponding first result at the target read voltage and the predicted valley voltage, wherein the predicted valley voltage comprises a relationship between adjusted read voltages with the target adjustment value.

In some examples, the memory cell comprises multiple memory bits, and the multiple memory bits correspond to multiple pages respectively; and at least part of pages comprise multiple stages, the multiple stages comprise a first stage and a second stage, and a read voltage in the second stage is less than a read voltage in the first stage; and the control component is configured to: according to the stage number corresponding to the determined valley voltage belonging to the first stage, obtain at least one of a predicted valley voltage in the second stage from the multiple stages or a target valley voltage in other first stage corresponding to a lower read voltage with the determined target valley voltage.

In some examples, the memory controller is further configured to: control the memory device to perform a read operation on the at least one codeword with the target read voltage; and in response to an error occurring in reading of data in the at least one codeword at the target read voltage, control the memory device to perform the read operation on the codeword with the target valley voltage.

In some examples, the memory controller is further configured to: in response to an error occurring in reading of data in the at least one codeword at the target valley voltage, perform an ECC decoding operation on the data of the at least one codeword read at the target valley voltage.

In a third aspect, in the memory controller provided in the examples of the present application, a first result (a size of the first result may be several bytes) rather than at least one codeword (for example, a size of the codeword may be 4 KB) is transmitted, so that an amount of data transmitted between the memory device and a memory controller is reduced. A first threshold is obtained according to a corresponding first result at a target read voltage. With the dynamic first threshold, the iterative rapidity of convergence of determining a target valley voltage is higher. A process of obtaining the first result converges inside the memory device, does not occupy a space of the memory controller, and has low dependency on the memory controller. Compared with a memory device, efficiency of completing a process of obtaining a predicted valley voltage/the target valley voltage according to the first result is in the memory controller is higher. At least one of a transmission time at an input/output port of the memory device or a time of an error correction decoding operation of the memory controller is reduced, so that an iterative time of an error correction decoding algorithm of the memory controller is saved, and a speed of error correction decoding is higher. The methods are applicable to a memory system of an MLC, a TLC type or a QLC type.

In a fourth aspect, examples of the present application provide a method of operating a memory device. The operation method comprises: obtaining a first result corresponding to at least one codeword at a target read voltage, the at least one codeword is formed by a preset number of memory cells in an array of memory cells of a memory device, wherein the first result comprises the number of bits which represents the number of bits in the at least one codeword which are flipped in two read results at a first read voltage and a second read voltage, and a difference between the first read voltage and the second read voltage is less than a preset voltage; obtaining a first threshold according to the corresponding first result at the target read voltage, wherein the first threshold is to represent a corresponding first result at a maximum value in an effective range of predicted valley voltages; making at least one adjustment to the target read voltage, and after each adjustment, obtaining a corresponding first result at the adjusted read voltage; and determine a target valley voltage according to a relationship between a corresponding first result at a target read voltage after one adjustment and the first threshold meeting a first preset condition or according to a corresponding first result at the target read voltage after multiple adjustments meeting a second preset condition, wherein the target valley voltage is taken as a read voltage at which a read operation is performed on the at least one codeword.

In some examples, the operation method comprises: obtaining the first threshold according to the corresponding first result at the target read voltage and a first mapping function, wherein the first mapping function is to represent a relationship between the corresponding first result at the maximum value in the effective range of predicted valley voltages and the corresponding first result at the target read voltage.

In some examples, the operation method comprises: obtaining the corresponding first result at the maximum value in the effective range of predicted valley voltages according to an initial value of the corresponding first result at the maximum value in the effective range of predicted valley voltages, a correction value for the corresponding first result at the target read voltage, and a correction coefficient, wherein the initial value of the corresponding first result at the maximum value in the effective range of predicted valley voltages and the correction coefficient are both fixed values related to a stage in which a read voltage is, and the larger the corresponding first result at the target read voltage is, the larger the correction value is.

In some examples, the operation method comprises: determining the target read voltage after one adjustment as the target valley voltage according to the relationship between the corresponding first result at the target read voltage after one adjustment and the first threshold meeting the first preset condition, wherein the first preset condition is that a corresponding first result at the target read voltage after one adjustment is less than the first threshold.

In some examples, the operation method comprises: according to the corresponding first result at the target read voltage being greater than or equal to the first threshold, obtaining, with the corresponding first result at the target read voltage, a target adjustment value for adjusting the target read voltage; obtaining a corresponding first result at the adjusted target read voltage with the target adjustment value; according to the corresponding first result at the adjusted target read voltage with the target adjustment value being less than the first threshold, determining the adjusted target read voltage with the target adjustment value as the target valley voltage; and according to the corresponding first result at the adjusted target read voltage with the target adjustment value being greater than or equal to the first threshold, making multiple adjustments to the target read voltage, and after each adjustment, obtaining the corresponding first result at the adjusted target read voltage, until the corresponding first result at the adjusted target read voltage is less than the first threshold or the corresponding first result at the target read voltage after multiple adjustments meet the second preset condition.

In some examples, the operation method comprises: according to the corresponding first result at the target read voltage after multiple adjustments meeting the second preset condition, taking a target read voltage corresponding to the minimum first result among the multiple first results as the target valley voltage, wherein the second preset condition is that taken the minimum first result among multiple corresponding first results at the target read voltages after multiple adjustments as a reference value, the number of first results from remaining first results which differ from the reference value with a difference being less than a second threshold is greater than a preset number.

In some examples, the operation method comprises: in a process of making multiple adjustments to the target read voltage, making adjustments by employing different adjustment methods, and according to the adjusted target read voltages corresponding to more than a preset number of adjustment methods in the different adjustment methods being same and the corresponding first result at the same target read voltage being the minimum value among all first results, using the same target read voltage as the target valley voltage.

In some examples, the operation method comprises: making multiple first adjustments to the target read voltage with a first step size, and obtaining corresponding first results at target read voltages after the multiple first adjustments respectively; determining a value of knee point according to the obtained corresponding first results at the read voltages after the multiple first adjustments, wherein a target read voltage corresponding to the value of knee point is a knee-point voltage; making multiple second adjustments to the knee-point voltage with a second step size, and obtaining corresponding first results at target read voltages after the multiple second adjustments respectively, wherein the second step size is less than the first step size; and determining the target valley voltage with the obtained corresponding first results at the target read voltages after the multiple second adjustments.

In some examples, the operation method comprises: according to a difference between the first adjacent value and the value of knee point being less than a difference between the second adjacent value and the value of knee point, narrowing down a range for the multiple second adjustments between a target read voltage corresponding to the first adjacent value and the knee-point voltage; and taking an average of the read voltage corresponding to the first adjacent value and the knee-point voltage, and according to a corresponding first result at the average being less than the first threshold, using the average as the target valley voltage; and according to the corresponding first result at the average being greater than or equal to the first threshold, continuing to make a second adjustment between the read voltage corresponding to the first adjacent value and the knee-point voltage, until a corresponding first result at the adjusted target read voltage is less than the first threshold, wherein the corresponding first results at the target read voltages after the multiple first adjustments comprise a first adjacent value and a second adjacent value that are adjacent to the value of knee point.

In some examples, the operation method comprises: obtaining the predicted valley voltage according to the corresponding first result at the target read voltage and a second mapping function, wherein the second mapping is to represent a relationship between the corresponding first result at the target read voltage and the predicted valley voltage.

In some examples, the operation method comprises: according to the stage number corresponding to the determined target valley voltage belonging to the first stage, obtaining at least one of a predicted valley voltage in the second stage from the multiple stages or a target valley voltage in other first stage corresponding to a lower read voltage with the determined target valley voltage, wherein the memory cell comprises multiple memory bits, and the multiple memory bits correspond to multiple pages respectively; and at least part of pages correspond to multiple stages, the multiple stages comprise a first stage and a second stage, and a read voltage in the second stage is less than a read voltage in the first stage.

In some examples, the operation method comprises: reading storage data of the at least one codeword at the first read voltage, to obtain a second result; reading storage data of the at least one codeword at the second read voltage, to obtain a third result; performing a logical operation on the second result and the third result, to obtain a fourth result; and calculating a number of bits that are in the fourth result and represent flips in the third result with respect to the second result, to obtain the first result.

In a fifth aspect, examples of the present application provide a method of operating a memory system, wherein the memory system comprises a memory device and a memory controller coupled with the memory device and controlling the memory device, and the operation method comprises: performing any operation method of the memory device provided in the fourth aspect.

In some examples, the operation method of the memory device comprises: obtaining a first result corresponding to at least one codeword at a target read voltage, the at least one codeword is formed by a preset number of memory cells in an array of memory cells of a memory device, wherein the first result comprises the number of bits which represents the number of bits in the at least one codeword which are flipped in two read results at a first read voltage and a second read voltage, and a difference between the first read voltage and the second read voltage is less than a preset voltage; obtaining a first threshold according to the corresponding first result at the target read voltage, wherein the first threshold is to represent a corresponding first result at a maximum value in an effective range of predicted valley voltages; making at least one adjustment to the target read voltage, and after each adjustment, obtaining a corresponding first result at the adjusted read voltage; and determining a target valley voltage according to a relationship between a corresponding first result at a target read voltage after one adjustment and the first threshold meeting a first preset condition or according to a corresponding first result at the target read voltage after multiple adjustments meeting a second preset condition, wherein the target valley voltage is taken as a read voltage at which a read operation is performed on the at least one codeword.

In a sixth aspect, examples of the present application provide a method of operating a memory controller. The operation method comprises: obtaining a first result corresponding to at least one codeword at a target read voltage, wherein the at least one codeword is formed by a preset number of memory cells in at least one memory device coupled with the memory controller, wherein the first result comprises the number of bits which represents the number of bits in the at least one codeword which are flipped in two read results at a first read voltage and a second read voltage, and a difference between the first read voltage and the second read voltage is less than a preset voltage; obtaining a first threshold according to the corresponding first result at the target read voltage, wherein the first threshold is to represent a corresponding first result at a maximum value in an effective range of predicted valley voltages; making at least one adjustment to the target read voltage, and after each adjustment, obtaining a corresponding first result at the adjusted target read voltage; and determining a target valley voltage according to a relationship between a corresponding first result at a target read voltage after one adjustment and the first threshold meeting a first preset condition or according to a corresponding first result at the target read voltage after multiple adjustments meeting a second preset condition, wherein the target valley voltage is taken as a read voltage at which a read operation is performed on the at least one codeword.

In some examples, the operation method comprises: obtaining the first threshold according to the corresponding first result at the target read voltage and a first mapping function, wherein the first mapping function is to represent a relationship between the corresponding first result at the maximum value in the effective range of predicted valley voltages and the corresponding first result at the target read voltage.

In some examples, the operation method comprises: obtaining the corresponding first result at the maximum value in the effective range of predicted valley voltages according to an initial value of the corresponding first result at the maximum value in the effective range of predicted valley voltages, a correction value for the corresponding first result at the target read voltage, and a correction coefficient, wherein the initial value of the corresponding first result at the maximum value in the effective range of predicted valley voltages and the correction coefficient are both fixed values related to a stage in which a read voltage is, and the larger the corresponding first result at the target read voltage is, the larger the correction value is.

In some examples, the operation method comprises: determining the target read voltage after one adjustment as the target valley voltage according to the relationship between the corresponding first result at the target read voltage after one adjustment and the first threshold meeting the first preset condition, wherein the first preset condition is that a corresponding first result at the target read voltage after one adjustment is less than the first threshold.

In some examples, the operation method comprises: according to the corresponding first result at the target read voltage being greater than or equal to the first threshold, obtaining, with the corresponding first result at the target read voltage, a target adjustment value for adjusting the target read voltage; obtaining a corresponding first result at the adjusted target read voltage with the target adjustment value; according to the corresponding first result at the adjusted target read voltage with the target adjustment value being less than the first threshold, determining the adjusted target read voltage with the target adjustment value as the target valley voltage; and according to the corresponding first result at the adjusted target read voltage with the target adjustment value being greater than or equal to the first threshold, making multiple adjustments to the target read voltage, and after each adjustment, obtaining the corresponding first result at the adjusted target read voltage, until the corresponding first result at the adjusted target read voltage is less than the first threshold or the corresponding first result at the target read voltage after multiple adjustments meet the second preset condition.

In some examples, the operation method comprises: according to the corresponding first result at the target read voltage after multiple adjustments meeting the second preset condition, taking a target read voltage corresponding to the minimum first result among the multiple first results as the target valley voltage, wherein the second preset condition is that taken the minimum first result among multiple corresponding first results at the target read voltages after multiple adjustments as a reference value, the number of first results from remaining first results which differ from the reference value with a difference being less than a second threshold is greater than a preset number.

In some examples, the operation method comprises: in a process of making multiple adjustments to the target read voltage, making adjustments by employing different adjustment methods, and according to the adjusted target read voltages corresponding to more than a preset number of adjustment methods in the different adjustment methods being same and the corresponding first result at the same target read voltage being the minimum value among all first results, using the same target read voltage as the target valley voltage.

In some examples, the operation method comprises: making multiple first adjustments to the target read voltage with a first step size, and obtaining corresponding first results at target read voltages after the multiple first adjustments respectively; determining a value of knee point according to the obtained corresponding first results at the read voltages after the multiple first adjustments, wherein a target read voltage corresponding to the value of knee point is a knee-point voltage; making multiple second adjustments to the knee-point voltage with a second step size, and obtaining corresponding first results at target read voltages after the multiple second adjustments respectively, wherein the second step size is less than the first step size; and determining the target valley voltage with the obtained corresponding first results at the target read voltages after the multiple second adjustments.

In some examples, the operation method comprises: according to a difference between the first adjacent value and the value of knee point being less than a difference between the second adjacent value and the value of knee point, narrowing down a range for the multiple second adjustments between a target read voltage corresponding to the first adjacent value and the knee-point voltage; and taking an average of the read voltage corresponding to the first adjacent value and the knee-point voltage, and according to a corresponding first result at the average being less than the first threshold, using the average as the target valley voltage; and according to the corresponding first result at the average being greater than or equal to the first threshold, continuing to make a second adjustment between the read voltage corresponding to the first adjacent value and the knee-point voltage, until a corresponding first result at the adjusted target read voltage is less than the first threshold, wherein the corresponding first results at the target read voltages after the multiple first adjustments comprise a first adjacent value and a second adjacent value that are adjacent to the value of knee point.

In some examples, the operation method comprises: obtaining the predicted valley voltage according to the corresponding first result at the target read voltage and a second mapping function, wherein the second mapping is to represent a relationship between the corresponding first result at the target read voltage and the predicted valley voltage, wherein the predicted valley voltage comprises a relationship between adjusted read voltages with the target adjustment value.

In some examples, the operation method comprises: according to the stage number corresponding to the determined target valley voltage belonging to the first stage, obtaining at least one of a predicted valley voltage in the second stage from the multiple stages or a target valley voltage in other first stage corresponding to a lower read voltage with the determined target valley voltage, wherein the memory cell comprises multiple memory bits, and the multiple memory bits correspond to multiple pages respectively; and at least part of pages comprise multiple stages, the multiple stages comprise a first stage and a second stage, and a read voltage in the second stage is less than a read voltage in the first stage.

In some examples, the operation method comprises: controlling the memory device to perform a read operation on the at least one codeword with the target read voltage; and in response to an error occurring in reading of data in the at least one codeword at the target read voltage, controlling the memory device to perform the read operation on the codeword with the target valley voltage.

In some examples, the operation method comprises: in response to an error occurring in reading of data in the at least one codeword at the target valley voltage, performing an ECC decoding operation on the data of the at least one codeword read at the target valley voltage.

FIG. 13 is a block flowchart 1 of a method of operating a memory device provided by an example of the present application. A detailed process of determining a target valley voltage is described below in detail with reference to FIG. 13. It is to be noted that, here and below, the target valley voltage is a voltage used for performing a read operation on data to be read.

In operation S101, the program of obtaining the target valley voltage is triggered, and the process of obtaining the target valley voltage is started. Next, operation S102 is performed.

As described above, according to the memory cell comprising multiple memory bits, the multiple memory bits correspond to multiple pages respectively, and at least one page corresponds to multiple stages. During determining of the target valley voltage, the target valley voltage among the read voltages in each of the at least one stage corresponding to each of the multiple pages is determined in sequence. In operation S103, one stage is selected from multiple stages corresponding to one page as a target stage, and a target valley voltage corresponding to a read voltage of the target stage is first determined. In an example, a TLC is taken as an example. Target valley voltages of a first-level read voltage L1 and a fifth-level read voltage L5 corresponding to a lower page are first determined, and one of L1 or L5 may be selected as the target stage. After the target stage is determined, operation S103 is performed.

In the operation S103, a type of the target stage is mainly determined. Here, the target stage may be classified into two classes: a first stage (or referred to as a high stage) and a second stage (or referred to as a low stage). A read voltage in a first stage is greater than a read voltage in a second stage. In an example, the lower page of the TLC is still used as an example, L5 is the first stage, and L1 is the second stage. If L1 is selected as the target stage in the operation S103, the target stage is the second stage, that is, the low stage. If L5 is selected as the target stage in operation S104, the target stage is the first stage, that is, the high stage. According to the target stage being the low stage, the operation S104 is performed. According to the target stage being the high stage, operation S106 is performed.

In the operation S104, a predicted valley voltage is obtained. Here, the predicted valley voltage is a predicted valley voltage corresponding to a low stage obtained according to a target valley voltage corresponding to the high stage and a related mapping function. Here and below, the related mapping function may be obtained by fitting a large number of experimental results before the memory device is delivered from a factory, and is saved in the memory device. Next, operation S105 is performed.

In the operation S105, it is determined whether prediction by two-step method succeeds. Here, the two-step prediction may comprise first-step prediction and second-step prediction. The first-step prediction is to obtain a predicted valley voltage in the high stage. In an example manner, the predicted valley voltage in the high stage is obtained according to a corresponding first result at a target read voltage (a default read voltage), the stage number in which the high stage is, and a fourth mapping function. The second-step prediction is to obtain the predicted valley voltage in the low stage. In an example manner, the predicted valley voltage in the low stage is obtained according to the foregoing predicted valley voltage in the high stage, the stage number in which the low stage is, and a third mapping function. In addition, confirmation of the predicted valley voltage is not performed after two-step prediction is performed, and hard decoding is directly performed with the predicted valley voltage in the high stage and the predicted valley voltage in the low stage. If the hard decoding succeeds, it represents that the prediction by two-step method succeeds. In this case, a search for a target valley voltage is directly stopped, and operation S121 is performed. If the hard decoding fails, it represents that the prediction by two-step method fails. In this case, a point corresponding to the predicted valley voltage is taken as a near-valley point of a subsequent iteration, and operation S107 continues to be performed.

It is to be noted that, if the hard decoding fails, it represents that the prediction by two-step method does not succeed. In this case, the target valley voltage needs to be determined in a manner of a search or a cycle (or an iteration). Therefore, when the prediction by two-step method does not succeed, a process of the cycle is entered. After the prediction by two-step method does not succeed, a search process may be directly performed from a start of the cycle. That is, the process jumps from the operation S105 to S107.

If the target stage is a high stage, a target valley voltage in the high stage is to be determined in a manner of a search or a cycle. In the operation S106, the default read voltage is taken as the target read voltage. Here, the target read voltage may be taken as an initial value of a subsequent search or cycle. In some examples, the default read voltage may be a read voltage before a threshold voltage of the memory cell deviates, for example, corresponding read voltage upon a write. In this case, a corresponding deviation value is 0 DAC. The operation S107 is performed after the operation S106.

It is to be noted that, here and below, a conversion relationship between a DAC and the foregoing mv is 1 DAC=10 mv.

In the operation S107, the target valley voltage starts to be determined in a manner of a search or a cycle. The operation S108 is performed after the operation S107.

For a process of performing a cycle for the first time, in the operation S108, the first result at the target read voltage is obtained. It may be understood that for a process of performing a cycle subsequently, in the operation S108, a first result at a target read voltage after an adjustment is obtained. Operation S109 is performed after the operation S108.

In the operation S109, a first threshold TH1 is determined or adjusted according to the first result at the target read voltage. It may be understood that, when a read operation is performed, when the threshold voltage of the memory cell deviates farther compared with a threshold voltage during a write, the first result read with the target read voltage is usually also relatively large. Based on this, the first threshold TH1 may be confirmed with a specific value of a first result at the default read voltage. The first threshold TH1 is to represent a change (rise) in the target valley voltage caused by the deviation of the threshold voltage of the memory cell. The operation S110 is performed after the operation S109.

It is to be noted that, the operation S109 is mainly for the process of performing the cycle for the first time. For the process of performing the cycle subsequently, the operation may be skipped.

In the operation S110, the predicted valley voltage is generated, and it is determined whether the predicted valley voltage is less than the aforementioned first threshold TH1. Based on the corresponding first result at the target read voltage after the previous adjustment and the associated mapping function (e.g., the aforementioned second mapping function), the predicted read voltage after next adjustment is generated, and the generated predicted valley voltage is compared with the magnitude of the first threshold TH1. When the determination result in operation S110 is no, it indicates that the predicted valley voltage generated at this point is greater than or equal to the first threshold TH1, and the operation S108 of the loop continues where an adjustment is made to the target read voltage and the predicted valley voltage is re-generated, after each re-generation of the predicted valley voltage, a comparison with the first threshold TH1 is performed until the generated predicted read voltage is less than the first threshold TH1. That is to say, the aforementioned prediction formula or related mapping function is used to perform prediction iteration until the generated predicted read voltage is less than the first threshold TH1. When the determination result in operation S110 is yes, it indicates that the predicted valley voltage generated at this point is less than the first threshold TH1, and the process proceeds to the next operation S111.

In operation S111, search for a knee point. Here, the target read voltage after each adjustment is taken as the abscissa, and the corresponding first result at the corresponding adjusted target read voltage is taken as the ordinate, the abscissa and ordinate will form a point. The knee point may be understood as a point closer to the valley bottom. In some examples, starting from the near-valley point, searching with a coarser step size (a first step size) may be performed to the left boundary and the right boundary respectively until reaching the left boundary and the right boundary, and the point corresponding to the minimum first result during the search process is taken as the knee point. Here, the knee point is a point that is closer to the valley bottom than the near-valley point, and the point less than the first threshold in the preceding operation may be taken as a near-valley point, e.g., the near-valley point may be a point less than the first threshold that first appears in the preceding operation. The first step size may be a larger step size, and in some examples, the first step size may be 5 DAC-15 DAC, in one example, the first step size may be 5 DAC, 10 DAC or 15 DAC. Operation S112 is performed after operation S111.

In operation S112, it is determined whether the knee point has been found. If the knee point is not found, the search continues and operation S111 is continued until the knee point is found. After the knee point is found, operation S113 is performed.

In operations S113 and S114, starting from the near-valley point, searching with a finer step size (a second step size) may be performed to the left boundary and the right boundary respectively until reaching the left boundary and the right boundary or the counted number for upward trend exceeds a preset number. Here when a corresponding first result at the target read voltage after a next adjustment is greater than the corresponding first result at the target read voltage after a previous adjustment, one for upward trend is counted. In some examples, the preset number is 3-7, in one example, the preset number of may be 3, 5, or 7. It should be noted that the locations of operations S113 and S114 may be interchanged. The second step size may be a smaller step size, and in some examples, the second step size may be 2 DAC-4 DAC, in one example, the second step size may be 2 DAC, 3 DAC or 4 DAC.

When the searches in the operation S113 and the operation S114 both meet the foregoing conditions (the boundaries are reached or the count of rising trends exceeds the preset number of times), operation S115 is performed.

In the operation S115, an adjusted target read voltage corresponding to the minimum first result is taken as the target valley voltage. The operation S116 is performed after the operation S115.

In operation S116, it is determined whether the target valley voltage is valid. Here, the way to determine whether the target valley voltage is valid may be: reading data with the target valley voltage, decoding the read data through the memory controller, and when the decoding is successful, it indicates whether the target valley voltage is valid. When the determination result in operation S116 is yes, operation S121 is performed; when the determination result in operation S116 is no, operation S117 is performed.

In the operation S117, it is determined whether the cycle ends. When the determination result of the operation S117 is yes, the operation S119 is performed. When the determination result of the operation S117 is no, operation S118 is performed.

In operation S118, enter the next cycle and searching continues. Operation S118 jumps to operation S107.

In the operation S119, it is determined whether the target stage is a high stage. When a determination result of the operation S119 is yes, the operation S120 is performed. When the determination result of the operation S119 is no, operation S121 is performed.

In the operation S120, the predicted valley voltage in the low stage is obtained according to the target valley voltage in the high stage. Here, the predicted valley voltage in the low stage may be obtained through the target valley voltage in the high stage, the stage number in which the low stage is, and the related mapping function (for example, the foregoing third mapping function). The operation S121 is performed after the operation S120.

In operation S121, it is determined whether corresponding target valley voltages have been determined for read voltages in all the stages contained on this page. When the determination result in operation S121 is yes, it indicates that target valley voltages corresponding to read voltages in all the stages contained on this page have been determined, and operation S123 may be performed at this point; and when the determination result in operation S121 is no, it indicates that target valley voltages corresponding to read voltages in some of the stages contained on this page have not been determined, and operation S122 may be performed at this point.

In operation S122, for the stages in which the target valley voltages are not determined, the target valley voltage in each of the stages is determined in sequence. Operation S122 jumps to operation S102.

In the operation S123, the process of obtaining the target valley voltage ends. It should be noted that after operation S123, the determination of the target valley voltage corresponding to the read voltages in all stages for the next page may be started.

Figure 14B:
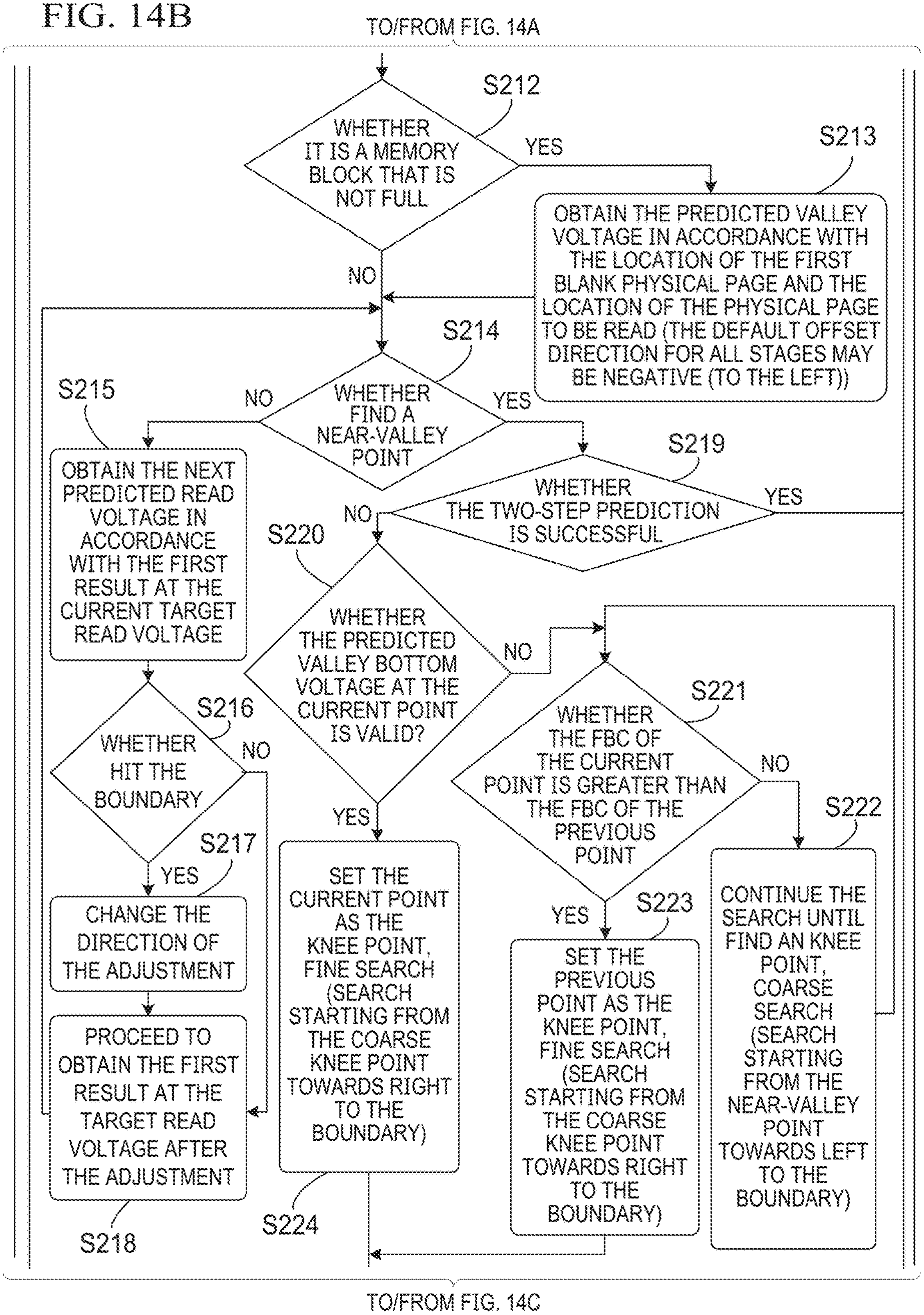
Figure 14D:
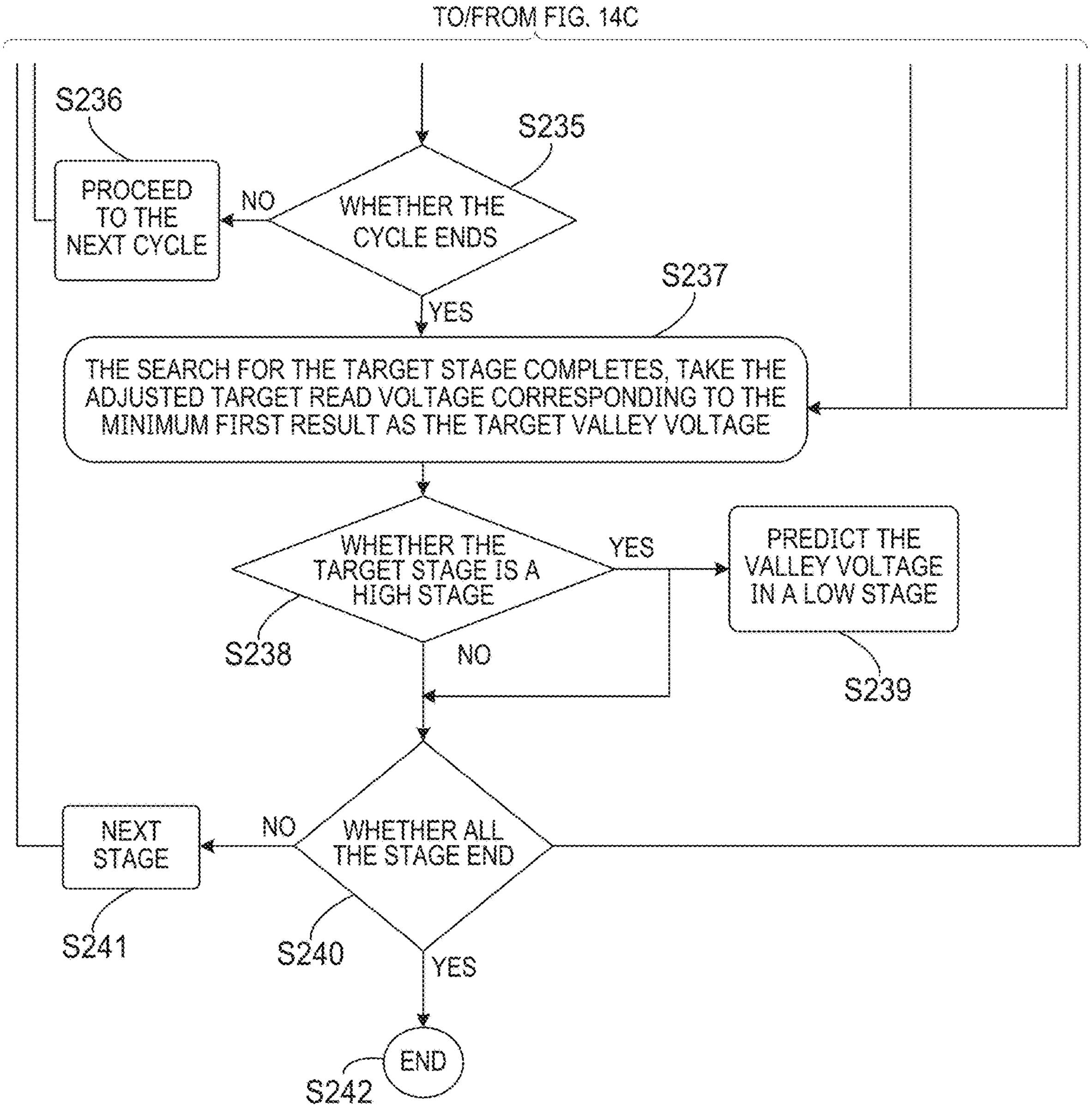

FIG. 14 is a block flowchart 2 of a method of operating a memory device provided by an example of the present application. A detailed process of determining a target valley voltage is described below in detail with reference to FIG. 14.

In operation S201, the program of obtaining the target valley voltage is triggered, and the process of obtaining the target valley voltage is started. Next, operation S202 is performed.

In the operation S202, in some examples, a read mode of the memory device is set to a single-level read mode. The single-level read mode comprises reading, through a read voltage in one stage, at least one bit of storage data stored in a memory cell. Next, operation S203 is performed.

As described above, according to the memory cell comprising multiple memory bits, the multiple memory bits correspond to multiple pages respectively, and at least one page corresponds to multiple stages. During determining of the target valley voltage, the target valley voltage among the read voltages in each of the at least one stage corresponding to each of the multiple pages is determined in sequence. In operation S203, one stage is selected from multiple stages corresponding to one page as a target stage, and a target valley voltage corresponding to a read voltage of the target stage is first determined. In an example, a TLC is taken as an example. Target valley voltages of a first-level read voltage L1 and a fifth-level read voltage L5 corresponding to a lower page are first determined, and one of L1 or L5 may be selected as the target stage. After the target stage is determined, operation S204 is performed.

In the operation S204, a type of the target stage is mainly determined. Here, the target stage may be classified into two classes: a first stage (or referred to as a high stage) and a second stage (or referred to as a low stage). A read voltage in a first stage is greater than a read voltage in a second stage. In an example, the lower page of the TLC is still used as an example, L5 is the first stage, and L1 is the second stage. If L1 is selected as the target stage in the operation S203, the target stage is the second stage, that is, the low stage. If L5 is selected as the target stage in operation S204, the target stage is the first stage, that is, the high stage. According to the target stage being the low stage, the operation S205 is performed. According to the target stage being the high stage, operation S207 is performed.

In the operation S205, a predicted valley voltage is obtained. Here, the predicted valley voltage is a predicted valley voltage corresponding to a low stage obtained according to a target valley voltage corresponding to the high stage and a related mapping function. Here and below, the related mapping function may be obtained by fitting a large number of experimental results before the memory device is delivered from a factory, and is saved in the memory device. Next, operation S206 is performed.

In the operation S206, it is determined whether prediction by two-step method succeeds. Here, the two-step prediction may comprise first-step prediction and second-step prediction. The first-step prediction is to obtain a predicted valley voltage in the high stage. In an example manner, the predicted valley voltage in the high stage is obtained according to a corresponding first result at a target read voltage (a default read voltage), the stage number in which the high stage is, and a fourth mapping function. The second-step prediction is to obtain the predicted valley voltage in the low stage. In an example manner, the predicted valley voltage in the low stage is obtained according to the foregoing predicted valley voltage in the high stage, the stage number in which the low stage is, and a third mapping function. In addition, confirmation of the predicted valley voltage is not performed after two-step prediction is performed, and hard decoding is directly performed with the predicted valley voltage in the high stage and the predicted valley voltage in the low stage. If the hard decoding succeeds, it represents that the prediction by two-step method succeeds. In this case, a search for a target valley voltage is directly stopped, and operation S245 is performed. If the hard decoding fails, it represents that the prediction by two-step method fails. In this case, a point corresponding to the predicted valley voltage is taken as a near-valley point of a subsequent iteration, and operation S220 continues to be performed. The operation S220 is described in detail in the subsequent description.

It is to be noted that, if the hard decoding fails, it represents that the prediction by two-step method does not succeed. In this case, the target valley voltage needs to be determined in a manner of a search or a cycle (or an iteration). Therefore, when the prediction by two-step method does not succeed, a process of the cycle is entered. After the prediction by two-step method does not succeed, a search process may be directly performed from a start of the cycle. That is, the process jumps from the operation S206 to S208. Alternatively, the point corresponding to the predicted valley voltage may be directly used as the near-valley point of the subsequent iteration. That is, the process jumps from the operation S206 (S219) to S220.

If the target stage is a high stage, a target valley voltage in the high stage is to be determined in a manner of a search or a cycle. In the operation S207, the default read voltage is taken as the target read voltage. Here, the target read voltage may be taken as an initial value of a subsequent search or cycle. In some examples, the default read voltage may be a read voltage before a threshold voltage of the memory cell deviates, for example, corresponding read voltage upon a write. In this case, a corresponding deviation value is 0 DAC. The operation S208 is performed after the operation S207.

In the operation S208, the target valley voltage starts to be determined in a manner of a search or a cycle. The operation S209 is performed after the operation S208.

For the first performing of the cycle, in operation S209, the first result at the target read voltage is obtained; it may be understood that for the subsequent performing of the cycle, in operation S209, the first result at the adjusted target read voltage is obtained. Operation S210 is performed after operation S209.

In operation S210, parameters are determined or adjusted in accordance with the first result at the target read voltage, the parameters here may at least include a first threshold, a first boundary voltage (the location corresponding to the first boundary voltage is also referred to as the left boundary) and a second boundary voltage (the location corresponding to the second boundary voltage is also referred to as the right boundary). It may be understood that when performing a read operation, the further the threshold voltage of the memory cell deviates from the threshold voltage during writing, the first result of reading with the target read voltage will generally be larger, based on this, the value of the first result at the default read voltage may be used to confirm the first threshold, and the first threshold is to present the change (lifting) in the target valley voltage caused by the offset of the threshold voltage of the memory cell. Here, the initial first boundary voltage and the initial second boundary voltage may be set in accordance with empirical values, etc., for example, a relatively large range of the initial first boundary voltage and an initial second boundary voltage are first set, and then the initial first boundary voltage and the initial second boundary voltage are adjusted in accordance with the first result at the target read voltage, e.g., narrowing the range of a boundary voltage and a second boundary voltage, to obtain the first boundary voltage and the second boundary voltage. Operation S211 is performed after operation S210.

It is to be noted that, the operation S210 is mainly for the process of performing the cycle for the first time. For the process of performing the cycle subsequently, the operation may be skipped.

For a process of performing a cycle for the first time, in the operation S211, it is determined whether the first result at the target read voltage is less than a first threshold. It may be understood that for a process of performing a cycle subsequently, in the operation S211, it is determined whether a first result at a target read voltage after an adjustment is less than the first threshold. When a determination result of the operation S211 is yes, it may be considered that in this case, the corresponding first result at the adjusted target read voltage may basically meet requirements of decoding read data. Next, the process jumps to S242, and the cycle ends, to output a corresponding target valley voltage. When the determination result of the operation S211 is no, operation S212 of the cycle is continued.

In the operation S212, it is determined whether a target memory block is a memory block that is not full. Here, the target memory block is a memory block in which at least one codeword on which the read operation is to be performed is located. The memory block that is not full comprises a memory block with two data states being a programmed state and an erased state. When the determination result of the operation S212 is yes, the operation S213 is performed. When the determination result of the operation S212 is no, operation S214 is performed.

It is to be noted that, the operation S212 is mainly for the process of performing the cycle for the first time. For the process of performing the cycle subsequently, the operation may be skipped. After the operation is skipped, the operation S214 continues to be performed.

In the operation S213, considering that the offset of the threshold voltage of memory cell in a memory block that is not full is more complicated compared to the offset of the threshold voltage of memory cell in a memory block that is full (a memory block that is full may be understood as a memory block whose writing time difference is less than the preset duration in the same application scenario as a memory block that is not full). Compared with the memory block that is full, the offset of the threshold voltage of memory cell in a memory block that is not full is related to the location of the first blank physical page in the memory block that is not full (the first blank physical page may be understood as the physical page in which the first data state appearing in the memory block that is not full is all erase state in accordance with the program sequence) and the location of the physical page to be read (the physical page where at least one codeword to be read is located). Based on this, the predicted valley voltage may be generated in accordance with the first offset corresponding to the memory block that is full, the second offset corresponding to the location of the first blank physical page in the memory block that is not full, and the third offset corresponding to the location of the physical page to be read, and then proceed to operation S214. It is to be understood that the generated predicted valley voltage is more targeted than the blind adjustment of the target read voltage, and can shorten the search time to a certain extent and determine the target valley voltage faster.

In the operation S214, it is determined whether the near-valley point is found. Here, a target read voltage after each adjustment is taken as a horizontal coordinate, and a corresponding first result at the adjusted target read voltage is taken as a vertical coordinate. The horizontal coordinate and the vertical coordinate form one point. In a process of making multiple adjustments to the target read voltage, a point corresponding to a first result less than a near-valley threshold for the first time in multiple corresponding first results at multiple adjusted target read voltages is taken as the near-valley point. The near-valley threshold is to represent the largest value close to a corresponding first result at the target valley voltage. It is to be noted that, the near-valley threshold has a difference from the foregoing first threshold, when the first result is less than the near-valley threshold, it represents that a finer search may be performed next. When the first result is less than the first threshold, it represents that it may be considered to stop the search next. When the determination result of the operation S214 is yes, the operation S219 is performed. When the determination result of the operation S214 is no, operation S215 is performed.

In the operation S215, when the near-valley point is not found, the operation S215 is performed. A predicted read voltage after a next adjustment is obtained according to a corresponding first result at a target read voltage after a previous adjustment and the related mapping function (for example, the foregoing second mapping function). That is, predictive iteration is performed with the foregoing prediction formula or the mapping function. The operation S216 is performed after the operation S215.

In the operation S216, it is determined whether the obtained predicted read voltage after the next adjustment hits a boundary. Here, the boundary may be one of the foregoing left the boundary or right the boundary, and the "hits a boundary" may be understood as that the voltage is right at the boundary or has crossed the boundary. When the determination result of the operation S216 is yes, the operation S217 is performed. When the determination result of the operation S216 is no, operation S218 is performed.

In the operation S217, an adjustment direction is changed. Here, in a process of adjusting the target read voltage, there are two adjustment directions, that is, a positive direction (to the right) and a negative direction (to the left). An adjustment to a deviation direction may be understood as that, an adjustment is made to the right before, and after the right the boundary is hit, an adjustment to the left starts to be made. Alternatively, an adjustment is made to the left before, and after the left the boundary is hit, an adjustment to the right starts to be made. The operation S218 is performed after the operation S217.

In the operation S218, the first result at the adjusted target read voltage is obtained. After the operation S218, the operation S214 is performed. That is, every time after the target read voltage is adjusted and a corresponding first result is obtained, it continues to be determined whether a latest adjustment point is the near-valley point. Here, one or multiple adjustments are made until the near-valley point is found.

It is to be noted that, if a next cycle is entered because subsequent conditions are not met in a process of operations after the near-valley point is found, the operations S215 to S218 may be skipped.

In the operation S219, refer to the description in the operation S206. When the prediction by two-step method does not succeed, the process of the cycle is entered. After the prediction by two-step method does not succeed, the point corresponding to the predicted valley voltage may be directly used as the near-valley point of the subsequent iteration. That is, the process jumps from the operation S219 to S220.

In the operation S220, it is determined whether a predicted valley voltage (a latest target read voltage after an adjustment) of a current point is effective. In some examples, it may be determined that the predicted valley voltage is effective through a corresponding first result at the latest adjusted target read voltage is less than the first threshold. It is to be noted that, in the operation S211, S212 and subsequent operations are performed when the first result at the target read voltage (after the adjustment) is not less than the first threshold. However, before the determination result of the operation S214 is yes, the target read voltage is adjusted again at least once. Therefore, in this case, a new adjusted target read voltage may be less than the first threshold. When the determination result of the operation S220 is yes, the operation S224 is performed. When the determination result of the operation S220 is no, operation S221 is performed.

In the operation S221, it is determined whether a first result fbc of the current point is greater than an fbc of a previous point. Here, after the near-valley point is found, in a process of starting to roughly search for a knee point to the left, a value change of the fbc is usually decreasing first and then increasing. When the first result fbc of the current point is greater than the fbc of the previous point, it indicates that in a subsequent process of making an adjustment to the left, the fbc further increases. The previous point is a relatively small point. In this case, the previous point is set as the knee point. In some examples, a step size used in the rough search may be a large step size, for example, may range from 5 DAC to 15 DAC, and in an example, may be 5 DAC, 10 DAC or 15 DAC. Based on this, when a determination result of the operation S221 is yes, the operation S223 is performed. When the determination result of the operation S221 is no, operation S222 is performed.

In the operation S222, a rough search is made to the left starting from the near-valley point, and after each search, comparison is made with an fbc in a previous search, until a point with an fbc that stops decreasing and starts to increase is found. After the point is found, that is, it indicates that the operation S222 is completed, and the process jumps to the operation S223.

In the operation S223, the previous point (that is, the foregoing point with the fbc that stops decreasing and starts to increase) is set as the knee point, and a fine search is made to the right starting from the knee point. In some examples, a step size used in the fine search may be a small step size, for example, may range from 1 DAC to 4 DAC, and in an example, may be 2 DAC or 3 DAC. The operation S225 is performed after the operation S223.

In the operation S224, the current point is set as the knee point, and a fine search is made to the right starting from the knee point. In some examples, for a step size used in the fine search, refer to the operation S223. The operation S225 is performed after the operation S224.

In the operation S225, it is determined whether to adjust the target read voltage to the left. When the determination result of the operation S225 is yes, the operation S229 is performed. When the determination result of the operation S225 is no, operation S226 is performed.

In the operation S226, the target read voltage is adjusted to the right, and in a process of adjusting the target read voltage to the right, it is determined whether the right boundary is hit or whether a rise count (or referred to as a count of rising trends, wherein when a corresponding first result at a target read voltage after a next adjustment is greater than a corresponding first result at a target read voltage after a previous adjustment, one for upward trend is counted) exceeds a preset number TH2 of times. In some examples, the preset number of times ranges from 3 to 7. In an example, the preset number of times may be 3, 5 or 7. When the determination result of the operation S226 is yes, the operation S228 is performed. When the determination result of the operation S226 is no, operation S227 is performed.

In the operation S227, when the right boundary is not hit or the rise count does not exceed the preset number TH2 of times, a search to the right boundary continues to be made, and determination is performed after each search, until the right boundary is hit or the rise count exceeds the preset number TH2 of times. That is, when the operation S227 is completed, the process jumps to the operation S228.

In the operation S228, the target read voltage starts to be adjusted to the left.

In the operation S229, in a process of adjusting the target read voltage to the left, it is determined whether the left the boundary or the rise count is hit. For the rise count here, refer to the foregoing operation S226 for understanding. Thresholds of rise counts on the left and right are usually set to a same value. When the determination result of the operation S229 is yes, the operation S231 is performed. When the determination result of the operation S229 is no, operation S230 is performed.

In the operation S230, when the left boundary is not hit or the rise count does not exceed the preset number TH2 of times, a search to the left boundary continues to be made, and determination is performed after each search, until the left boundary is hit or the rise count exceeds the preset number TH2 of times. That is, when the operation S230 is completed, the process jumps to the operation S231.

In the operation S231, it is determined whether a latest first result is the minimum. Here, whether the latest first result is the minimum, after the target read voltage is adjusted for the last time, a first result at the adjusted target read voltage is the minimum. In this case, all searched points in this cycle at least need to be traversed, to find a adjusted target read voltage corresponding to the minimum point among the first results. When the determination result of the operation S231 is yes, the operation S233 is performed. When the determination result of the operation S231 is no, operation S232 is performed.

In the operation S232, the latest first result is updated with the found minimum first result. The operation S233 is performed after the operation S232.

In the operation S233, it is determined whether a near-valley count exceeds a preset number TH3. Here, taken the minimum first result among multiple corresponding first results at the target read voltages after multiple adjustments as a reference value, and a number of first results with a difference from the reference value being less than a second threshold (equivalent to the foregoing preset difference) in multiple remaining first results is greater than a preset number. The search is stopped, and a target read voltage corresponding to the minimum first result among the multiple first results is taken as the target valley voltage. In some examples, the second threshold (equivalent to the foregoing preset difference) and the preset number may be set together according to an actual case. When the second threshold (equivalent to the foregoing preset difference) is set slightly large, the preset number is usually also relatively large. When the second threshold (equivalent to the foregoing preset difference) is set slightly small, the preset number is usually also relatively small. When the determination result of the operation S233 is yes, the search is stopped, and the operation S237 is performed. When the determination result of the operation S233 is no, a next determination is performed, and operation S234 is performed.

In the operation S234, it is determined whether a repetitive valley value count exceeds a preset count TH4. Here, in a process of making multiple adjustments to the target read voltage, adjustments may be made by employing different adjustment methods, and according to the adjusted target read voltages corresponding to more than a preset number of adjustment methods in the different adjustment methods being same and the corresponding first result at the same target read voltage being the minimum value among all first results, the same target read voltage is taken as the target valley voltage. In some examples, the preset number of times ranges from 2 to 4. In an example, the preset number of times may be 2, 3 or 4. When the determination result of the operation S234 is yes, the search is stopped, and the operation S237 is performed. When the determination result of the operation S234 is no, a next determination is performed, and operation S235 is performed.

It is to be noted that, the operation S233 and the operation S234 belong to different determination manners, and positions of the operations are interchangeable. That is, the repetitive valley value count may be first determined, and when the repetitive valley value count does not meet a condition, the near-valley count is determined. It may be understood that, another determination may be performed here to determine whether the cycle ends.

In the operation S235, it is determined whether the cycle ends. When the determination result of the operation S235 is yes, the operation S237 is performed. When the determination result of the operation S235 is no, operation S236 is performed.

In the operation S236, the process enters a next cycle, to continue to make searches. The process jumps from the operation S236 to the operation S209.

In the operation S237, a search for the target stage is completed, and an adjusted target read voltage corresponding to the minimum first result is taken as the target valley voltage. The operation S238 is performed after the operation S237.

In the operation S238, it is determined whether the target stage is a high stage. When the determination result of the operation S238 is yes, the operation S239 is performed. When the determination result of the operation S238 is no, operation S240 is performed.

In the operation S239, the predicted valley voltage in the low stage is obtained according to the target valley voltage in the high stage. Here, the predicted valley voltage in the low stage may be obtained through the target valley voltage in the high stage, the stage number in which the low stage is, and the related mapping function (for example, the foregoing fourth mapping function). The operation S240 is performed after the operation S239.

In operation S240, it is determined whether corresponding target valley voltages have been determined for read voltages in all the stages contained on this page. When the determination result in operation S240 is yes, it indicates that target valley voltages corresponding to read voltages in all the stages contained on this page have been determined, and operation S242 may be performed at this point; and when the determination result in operation S240 is no, it indicates that target valley voltages corresponding to read voltages in some of the stages contained on this page have not been determined, and operation S241 may be performed at this point.

In operation S241, for the stages in which the target valley voltages are not determined, the target valley voltage in each of the stages is determined in sequence. Operation S236 jumps to operation S202.

In operation S242, the process of obtaining the target valley voltage ends. It should be noted that after operation S242, the determination of the target valley voltage corresponding to the read voltages in all stages for the next page may be started.

It should be noted that the methods disclosed in the examples of the present application are able to solve many problems existing in the re-reading operation, but are not used to limit the application scenarios in the examples of the present application, and the methods disclosed in the examples of the present application are also applicable to conventional read operations.

Figure 15:
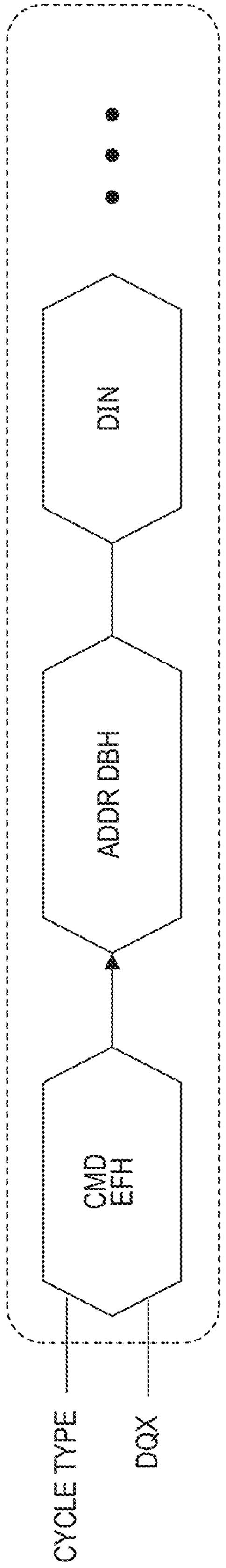
FIG. 15 is a timing diagram of starting a single-level read mode operation provided in an example of the present application.

FIG. 15 is a timing diagram of starting a single-level read mode operation provided in an example of the present application. DQx may represent a data bus signal, and Cycle Type may further represent a type of the data bus signal.

As shown in FIG. 15, it is set that a functional command may comprise, for example, one subcommand (for example, EFh). In an example, a memory device starts a single-level read mode when one subcommand EFh is received. In the single-level read mode, the memory device transmits, between received subcommands 00h and 30h, an address ADDR (for example, two column addresses C1 and C2 and three row addresses R1 to R3) of data that needs to be read. Within a read time, corresponding data (for example, Dn) in a page of a received address may be first buffered in a page buffer, and then the data DATA is read as required. It is to be noted that, in the foregoing example, data (for example, Dn) corresponding to one physical page needs to be frequently transmitted (Din/Dout) between the memory device and a memory controller when a read retry operation is performed, and it takes a long time to transmit the data.

Figure 16:
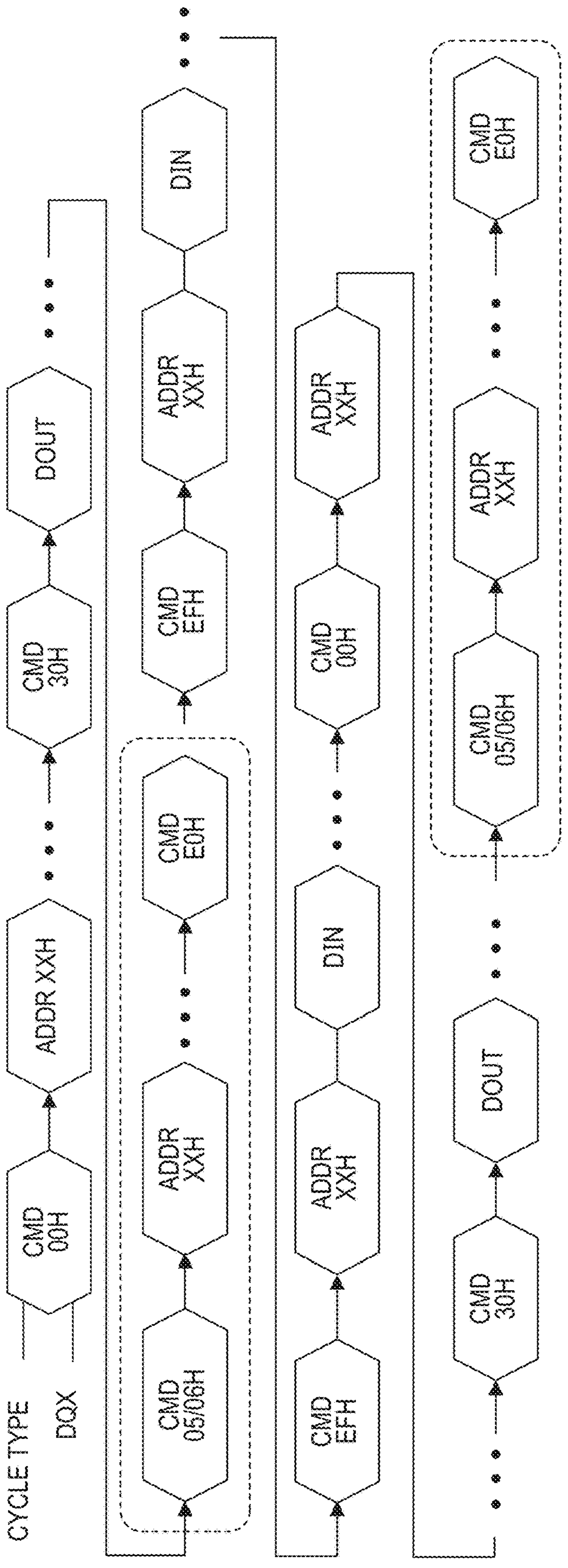
FIG. 16 is a timing diagram of a predicted valley voltage/target valley voltage and performing a read operation provided by an example of the present application.

FIG. 16 is a timing diagram of determining a target valley voltage and performing a read operation provided by an example of the present application. As shown in FIG. 16, a read command may comprise, for example, two subcommands (for example, 00h and 30h). In an example, a memory device transmits, between received subcommands 00h and 30h, an address ADDR (for example, two column addresses C1 and C2 and three row addresses R1 to R3) of data that needs to be read. After the memory device receives the subcommand 30h, within a read time, corresponding data DATA (for example, Dn) in a page of a received address may be first buffered in a page buffer, and then the data DATA is read as required. In an example implementation, a memory device 104 transmits, between the received subcommands 00h and 30h, an address ADDR (for example, two column addresses C1 and C2 and three row addresses R1 to R3) of data that needs to be read. After receiving the subcommand 30h, the memory device 104 receives subcommands EFh and xxh of a first instruction/a second instruction. The memory device 104 obtains, under instruction by the first instruction/the second instruction, a first result corresponding to a codeword at a corresponding read voltage, and sends the obtained first result to a memory controller. The memory controller determines target valley voltages according to multiple corresponding first results at multiple different read voltages received from the memory device, and performs read operations on data stored in the memory device according to the target valley voltages.

As shown in FIG. 16, in some other examples, the first instruction/the second instruction comprises subcommands 05/06h and E0h. In a process of determining a target valley voltage, there are at most only two times of the timing of two subcommands 05/06h and E0h. In an example implementation, one time of the subcommands 05/06h and E0h means that at least one codeword of the memory device is controlled to perform one read operation, and one error correction decoding operation is performed on a read result of the one read operation. In a process of determining a target valley voltage, there are at most only two read operations, so that at most only two error correction decoding operations, and the decoding of the at least one codeword may be implemented through the smallest number (2 at most) of iterations, thereby greatly improving decoding efficiency.

In some examples, the memory controller 106 is configured to: send the first instruction, wherein the first instruction comprises the subcommands 05/06h and E0h, to instruct the memory device to perform a first read operation. The memory device 104 is configured to: receive the first instruction, and perform the first read operation according to a predicted valley voltage in information representing multiple stages of predicted valley voltages; and send obtained information representing a first read result of the first read operation to the memory controller. The memory controller 106 is further configured to perform a second error correction decoding operation on the first read result of the first read operation.

In some examples, the memory controller 106 is configured to: output the first read result according to that first error correction decoding succeeds; or, send the second instruction according to that first error correction decoding fails, wherein the second instruction comprises the subcommands 05/06h and E0h, to instruct the memory device to perform a second read operation. The memory device 104 is configured to: receive the second instruction, and perform the second read operation with a predicted valley voltage in re-obtained information representing multiple stages of predicted valley voltages; and send obtained information representing a second read result of the second read operation to the memory controller. The memory controller 106 is further configured to perform a second error correction decoding operation on the second read result of the second read operation. It is to be noted that, the second instruction provided by examples of the present application is only an example, and should not excessively limit the protection scope of the present application. In some implementations, a data amount of the first result less than a preset data amount threshold. For example, a size of the data amount of the first result ranges from 1 byte to 4 bytes. Therefore, in a process of determining a target valley voltage, a small amount of data is transmitted between the memory device and the memory controller, and a transmission speed is fast, which helps to improve an overall speed of a read operation.

It is to be noted that, in the examples mentioned in the first part and the second part of the present application, two times of the timing of the subcommands 05/06h and E0h shown in FIG. 16 are not comprised.

Figure 17:
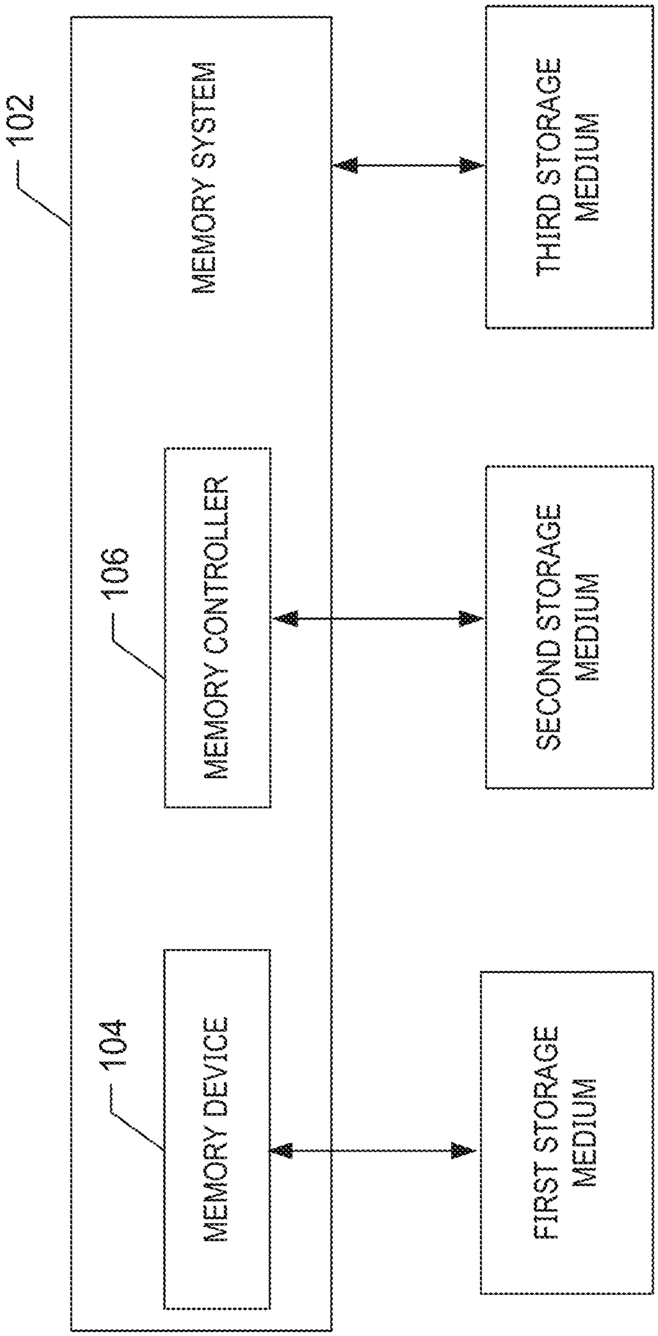
FIG. 17 is a schematic diagram of a structure of a storage medium provided by examples of the present application.

Referring to FIG. 17, FIG. 17 is a schematic diagram of a structure of a storage medium provided by examples of the present application. In a seventh aspect, examples of the present application provide a storage medium. As shown in FIG. 17, the storage medium stores executable instructions which, when being executed by a processor, implement any operation in any operation method provided in the fourth aspect, the fifth aspect, and the sixth aspect.

In some examples, the storage medium may be a Ferromagnetic Random Access Memory (FRAM), a Read Only Memory (ROM), a Programmable Read-Only Memory (PROM), an Erasable Programmable Read-Only Memory (EPROM), an Electrically Erasable Programmable Read-Only Memory (EEPROM), a Flash Memory, a magnetic surface memory, an optical disc, or a Compact Disc Read-Only Memory (CD-ROM) and other memories, or various apparatuses comprising any one or any combination of the above memory devices.

In some examples, an executable instruction may be compiled in any form of programming language (comprising a compiling or interpreting language, or a declarative or procedural language) by adopting a form of a program, a software, a software module, a script or a code; and it may be deployed in any form, comprising deployed as an independent program or as a module, a component, a subroutine, or other units suitable for use in a computing environment.

As an example, the executable instruction may, but do not necessarily, correspond to files in a file system, may be stored in part of a file storing other programs or data, for example, stored in one or more scripts in a Hyper Text Markup Language (HTML) document, stored in single file dedicated for the discussed program, or stored in multiple cooperative files (e.g., the file for storing one or more modules, subprograms or code portions).

As an example, the executable instruction may be deployed on an electronic apparatus for execution, or on multiple electronic apparatuses at one site for execution, or distributed on multiple electronic apparatuses interconnected through a communication network at multiple sites for execution.

In some examples, with reference to FIG. 17, FIG. 17 is a schematic diagram of a structure of a storage medium provided by examples of the present application. The storage medium comprises a first storage medium corresponding to a memory device 106, a second storage medium corresponding to a memory controller 104, and a third storage medium corresponding to a memory system 102. When the executable instructions are executed by the memory device, the first storage medium may be configured to implement the operations of the operation method of the memory device in the foregoing examples of the present application. When the executable instructions are executed by the memory controller, the second storage medium may be configured to implement the operations of the operation method of the memory controller in the foregoing examples of the present application. When the executable instructions are executed by the memory system, the third storage medium may be configured to implement the operations of the operation method of the memory system in the foregoing examples of the present application.

In the memory device and the operation method thereof and the memory system and the operation method thereof provided in the examples of the present application, a first result (a size of the first result may be several bytes) rather than at least one codeword (for example, a size of the codeword may be 4 KB) is transmitted, so that an amount of data transmitted by the memory device is reduced. A first threshold is obtained according to a corresponding first result at a target read voltage. With the dynamic first threshold, the iterative rapidity of convergence of determining a target valley voltage is higher. A process of obtaining the first result converges inside the memory device, does not occupy, for example, a space of the memory controller, and has low dependency on, for example, the memory controller. At least one of a transmission time at an input/output port of the memory device or a time of an error correction decoding operation of the memory controller is reduced, so that an iterative time of an error correction decoding algorithm of the memory controller is saved, and a speed of error correction decoding is higher. The methods are applicable to a memory device/memory system of an MLC, a TLC type or a QLC type.

The memory device and the operation method thereof and the memory system and the operation method thereof provided by the examples in the present application can effectively avoid problems of high time consumption and incomplete scenario coverage caused by use of a retry table, and can save a space occupied by the retry table, find a target valley voltage more quickly and accurately, and effectively reduce a delay in determining a target valley voltage. In addition, a read operation is performed with an obtained target valley voltage, so that a probability of correctly reading storage data is greatly increased, thereby improving the reliability and user experience of a product.

It is to be understood that, references to "one example" or "an example" throughout this specification mean that particular features, structures, or characteristics related to the example are comprised in at least one example of the present application. Therefore, "in one example" or "in an example" presented everywhere throughout this specification does not necessarily refer to the same example. Furthermore, these particular features, structures, or characteristics may be incorporated in one or more examples in any suitable manner. It is to be understood that, in various examples of the present application, sequence numbers of the above processes do not indicate an execution sequence, and an execution sequence of various processes shall be determined by functionalities and intrinsic logics thereof, and shall constitute no limitation on an implementation process of the examples of the present application. The above sequence numbers of the examples of the present application are only for description, and do not represent goodness and badness of the examples.

The above descriptions are merely preferred implementations of the present application, and not intended to limit the patent scope of the present application. Equivalent structure transformation made within using the contents of the specification and the drawings of the present application under the inventive concept of the present application, or direct/indirect application to other related technical fields are both encompassed within the patent protection scope of the present application.

What is claimed is:

1. A memory device, comprising:

an array of memory cells comprising multiple memory cells, wherein a preset number of memory cells form one codeword; and peripheral circuit coupled with the array of memory cells and configured to:

obtain a first result corresponding to at least one codeword at a target read voltage, wherein the first result comprises a value representing a number of bits in the at least one codeword which are flipped in two read results at a first read voltage and a second read voltage, and a difference between the first read voltage and the second read voltage is less than a preset voltage;

obtain a first threshold according to the first result at the target read voltage, wherein the first threshold represents a maximum value for the first result in an effective range of predicted valley voltages;

make at least one adjustment to the target read voltage, and after each adjustment, obtain the first result at the adjusted target read voltage; and determine a target valley voltage according to:

a relationship between the first result at the target read voltage after one adjustment and the first threshold meeting a first preset condition; or the first result at the target read voltage after multiple adjustments meeting a second preset condition, wherein the target valley voltage is taken as a read voltage at which a read operation is performed on the at least one codeword.

2. The memory device of claim 1, wherein the peripheral circuit is configured to:

obtain the first threshold according to the first result at the target read voltage and a first mapping function, wherein the first mapping function is to represent a relationship between the first result at the maximum value in the effective range of predicted valley voltages and the corresponding first result at the target read voltage.

3. The memory device of claim 2, wherein the peripheral circuit is configured to:

obtain the first result at the maximum value in the effective range of predicted valley voltages according to an initial value of the first result at the maximum value in the effective range of predicted valley voltages, a correction value for the first result at the target read voltage, and a correction coefficient, wherein the initial value of the first result at the maximum value in the effective range of predicted valley voltages and the correction coefficient are both fixed values related to a stage in which a read voltage is, and the larger the first result at the target read voltage is, the larger the correction value is.

4. The memory device of claim 1, wherein the first preset condition is that the first result at the target read voltage after one adjustment is less than the first threshold; and the peripheral circuit is configured to: determine the target read voltage after one adjustment as the target valley voltage according to the relationship between the first result at the target read voltage after one adjustment and the first threshold meeting the first preset condition.

5. The memory device of claim 4, wherein the peripheral circuit is configured to:

obtain, with the first result at the target read voltage, a target adjustment value for adjusting the target read voltage, according to the corresponding first result at the target read voltage being greater than or equal to the first threshold;

obtain the first result at the adjusted target read voltage with the target adjustment value;

determine the adjusted target read voltage with the target adjustment value as the target valley voltage, according to the first result at the adjusted target read voltage with the target adjustment value being less than the first threshold; and according to the first result at the adjusted target read voltage with the target adjustment value being greater than or equal to the first threshold, make multiple adjustments to the target read voltage, and after each adjustment, obtain the first result at the adjusted target read voltage, until the first result at the adjusted target read voltage is less than the first threshold or the first result at the target read voltage after multiple adjustments meet the second preset condition.

6. The memory device of claim 1, wherein the second preset condition is that, taken the minimum first result among multiple first results at the target read voltages after multiple adjustments as a reference value, the number of first results from remaining first results which differ from the reference value with a difference being less than a second threshold is greater than a preset number; and the peripheral circuit is configured to:

take a target read voltage corresponding to the minimum first result among the multiple first results as the target valley voltage, according to the first result at the target read voltage after multiple adjustments meeting the second preset condition.

7. The memory device of claim 1, wherein the peripheral circuit is configured to:

in a process of making multiple adjustments to the target read voltage, make adjustments by employing different adjustment methods; and according to the adjusted target read voltages corresponding to more than a preset number of adjustment methods in the different adjustment methods being same and the first result at the same target read voltage being the minimum value among all first results, take the same target read voltage as the target valley voltage.

8. The memory device of claim 1, wherein the peripheral circuit is configured to:

make multiple first adjustments to the target read voltage with a first step size, and obtain first results at target read voltages after the multiple first adjustments respectively;

determine a value of knee point according to the obtained first results at the read voltages after the multiple first adjustments, wherein a target read voltage corresponding to the value of knee point is a knee-point voltage;

make multiple second adjustments to the knee-point voltage with a second step size, and obtain the first results at the target read voltages after the multiple second adjustments respectively, wherein the second step size is less than the first step size; and determine the target valley voltage with the obtained first results at the target read voltages after the multiple second adjustments.

9. The memory device of claim 8, wherein the first results at the target read voltages after the multiple first adjustments comprise a first adjacent value and a second adjacent value that are adjacent to the value of knee point, and the peripheral circuit is configured to:

narrow a range for the multiple second adjustments to be between a target read voltage corresponding to the first adjacent value and the knee-point voltage, according to a difference between the first adjacent value and the value of knee point being less than a difference between the second adjacent value and the value of knee point; and take an average of the read voltage corresponding to the first adjacent value and the knee-point voltage, and according to the first result at the average being less than the first threshold, take the average as the target valley voltage; and according to the first result at the average being greater than or equal to the first threshold, continue to make a second adjustment between the read voltage corresponding to the first adjacent value and the knee-point voltage, until the first result at the adjusted target read voltage is less than the first threshold.

10. The memory device of claim 5, wherein the peripheral circuit is configured to:

obtain the predicted valley voltage according to the first result at the target read voltage and a second mapping function, wherein the second mapping is to represent a relationship between the first result at the target read voltage and the predicted valley voltage.

11. The memory device of claim 1, wherein the memory cell comprises multiple memory bits, and the multiple memory bits correspond to multiple pages respectively; and at least part of pages correspond to multiple stages, the multiple stages comprise a first stage and a second stage, and a read voltage in the second stage is less than a read voltage in the first stage; and the peripheral circuit is configured to:

obtain at least one of a predicted valley voltage in the second stage from the multiple stages or a target valley voltage in other first stage corresponding to a lower read voltage with the determined target valley voltage according to a stage number corresponding to the determined target valley voltage belonging to the first stage.

12. The memory device of claim 1, wherein the peripheral circuit is configured to:

read storage data of the at least one codeword at the first read voltage, to obtain a second result;

read storage data of the at least one codeword at the second read voltage, to obtain a third result;

perform a logical operation on the second result and the third result, to obtain a fourth result; and count the number of bits in the fourth result which represent flip of bits in the third result relative to the second result, to obtain the first result.

13. The memory device of claim 12, wherein the peripheral circuit comprises:

a first latch configured to store the second result;

a second latch configured to store the third result; and a third latch configured to store the fourth result.

14. A memory system, comprising:

one or more memory devices, the memory device comprising:

an array of memory cells comprising multiple memory cells, wherein a preset number of memory cells form one codeword; and peripheral circuit coupled with the array of memory cells and configured to:

obtain a first result corresponding to at least one codeword at a target read voltage, wherein the first result comprises a value representing a number of bits in the at least one codeword which are flipped in two read results at a first read voltage and a second read voltage, and a difference between the first read voltage and the second read voltage is less than a preset voltage;

obtain a first threshold according to the first result at the target read voltage, wherein the first threshold represents a maximum value for the first result in an effective range of predicted valley voltages;

make at least one adjustment to the target read voltage, and after each adjustment, obtain the first result at the adjusted target read voltage; and determine a target valley voltage according to:

a relationship between the first result at the target read voltage after one adjustment and the first threshold meeting a first preset condition; or the first result at a target read voltage after multiple adjustments meeting a second preset condition, wherein the target valley voltage is taken as a read voltage at which a read operation is performed on the at least one codeword; and a memory controller coupled with the memory device and controlling the memory device.

15. A memory controller, comprising a control component configured to:

obtain a first result corresponding to at least one codeword at a target read voltage, wherein the at least one codeword is formed by a preset number of memory cells in an array of memory cells of at least one memory device coupled with the memory controller, wherein the first result comprises a value representing a number of bits in the at least one codeword which are flipped in two read results at a first read voltage and a second read voltage, and a difference between the first read voltage and the second read voltage is less than a preset voltage;

obtain a first threshold according to the first result at the target read voltage, wherein the first threshold represents a maximum value for the first result in an effective range of predicted valley voltages;

make at least one adjustment to the target read voltage, and after each adjustment, obtain the first result corresponding to the at least one codeword at the adjusted target read voltage; and determine a target valley voltage according to:

a relationship between a the first result at the target read voltage after one adjustment and the first threshold meeting a first preset condition; or the first result at a target read voltage after multiple adjustments meeting a second preset condition, wherein the target valley voltage is taken as a read voltage at which a read operation is performed on the at least one codeword.

16. The memory controller of claim 15, wherein the control component is configured to:

obtain the first threshold according to the first result at the target read voltage and a first mapping function, wherein the first mapping function is to represent a relationship between the first result at the maximum value in the effective range of predicted valley voltages and the corresponding first result at the target read voltage.

17. The memory controller of claim 16, wherein the control component is configured to:

obtain the first result at the maximum value in the effective range of predicted valley voltages, according to an initial value of the first result at the maximum value in the effective range of predicted valley voltages, a correction value for the first result at the target read voltage, and a correction coefficient, wherein the initial value of the first result at the maximum value in the effective range of predicted valley voltages and the correction coefficient are both fixed values related to a stage in which a read voltage is, and the larger the first result at the target read voltage is, the larger the correction value is.

18. The memory controller of claim 15, wherein the first preset condition is that the first result at the target read voltage after one adjustment is less than the first threshold; and the control component is configured to: determine the target read voltage after one adjustment as the target valley voltage according to the relationship between the first result at the target read voltage after one adjustment and the first threshold meeting the first preset condition.

19. The memory controller of claim 18, wherein the control component is configured to:

obtain, with the first result at the target read voltage, a target adjustment value for adjusting the target read voltage, according to the corresponding first result at the target read voltage being greater than or equal to the first threshold;

obtain the first result at the adjusted target read voltage with the target adjustment value;

determine the adjusted target read voltage with the target adjustment value as the target valley voltage, according to the first result at the adjusted target read voltage with the target adjustment value being less than the first threshold; and according to the first result at the adjusted target read voltage with the target adjustment value being greater than or equal to the first threshold, make multiple adjustments to the target read voltage, and after each adjustment, obtain the first result at the adjusted target read voltage, until the first result at the adjusted target read voltage is less than the first threshold or the first result at the target read voltage after multiple adjustments meet the second preset condition.

20. The memory controller of claim 15, wherein the second preset condition is that, taken the minimum first result among multiple first results at the target read voltages after multiple adjustments as a reference value, the number of first results from remaining first results which differ from the reference value with a difference being less than a second threshold is greater than a preset number; and the control component is configured to:

take a target read voltage corresponding to the minimum first result among the multiple first results as the target valley voltage, according to the first result at the target read voltage after multiple adjustments meeting the second preset condition.

* * * * *